(12) United States Patent
Hikita et al.

(10) Patent No.: US 8,173,349 B2
(45) Date of Patent: May 8, 2012

(54) PHOTOSENSITIVE RESIN COMPOSITION, POLYMER COMPOUND, METHOD OF FORMING A PATTERN, AND ELECTRONIC DEVICE

(75) Inventors: Masanori Hikita, Shizuoka-ken (JP); Yasufumi Ooishi, Kanagawa (JP); Kenichiro Sato, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 520 days.

(21) Appl. No.: 12/410,468

(22) Filed: Mar. 25, 2009

(65) Prior Publication Data

US 2010/0080963 A1 Apr. 1, 2010

(30) Foreign Application Priority Data

Sep. 26, 2008 (JP) .................................. 2008-247883

(51) Int. Cl.
*G03F 7/00* (2006.01)
*G03F 7/004* (2006.01)
*B14J 2/16* (2006.01)
*C08J 3/28* (2006.01)

(52) U.S. Cl. .................. 430/270.1; 430/286.1; 430/913; 430/914; 430/927; 522/35; 522/149; 522/162

(58) Field of Classification Search ............... 430/270.1, 430/286.1, 913, 914, 927; 522/35, 149, 162
See application file for complete search history.

(56) References Cited

U.S. PATENT DOCUMENTS

| | | | | |
|---|---|---|---|---|
| 5,849,809 A | * | 12/1998 | Narang et al. | 522/35 |
| 5,958,995 A | * | 9/1999 | Narang et al. | 522/35 |
| 5,994,425 A | * | 11/1999 | Narang et al. | 522/35 |
| 6,007,877 A | * | 12/1999 | Narang et al. | 427/510 |
| 6,117,967 A | * | 9/2000 | Fuller et al. | 528/125 |
| 7,001,978 B2 | * | 2/2006 | DeVisser et al. | 528/125 |

(Continued)

FOREIGN PATENT DOCUMENTS

JP    2000-275842    10/2000

(Continued)

OTHER PUBLICATIONS

Machine translation of JP 2004-133088 (no date).*

*Primary Examiner* — Amanda C. Walke
(74) *Attorney, Agent, or Firm* — SOLARIS Intellectual Property Group, PLLC

(57) ABSTRACT

A polymer compound is provided which is excellent in heat resistance and insulating property, and a photosensitive resin composition is provided which includes the polymer compound, and may form a cured pattern or a cured film excellent in pattern forming property, resolution, heat resistance and insulating property. Also, a method for forming a cured pattern excellent in pattern forming property, resolution, heat resistance and insulating property using the photosensitive resin composition, and an electronic device having high reliance for a semiconductor device or for a display device are provided. The photosensitive resin composition includes a polymer compound obtained by reacting a monomer represented by Formula (1) and a monomer represented by Formula (2), and a photosensitizing agent.

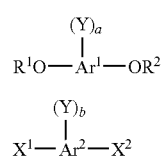

14 Claims, 3 Drawing Sheets

U.S. PATENT DOCUMENTS

| | | | |
|---|---|---|---|
| 7,648,811 B2 * | 1/2010 | Bender | 430/96 |
| 7,740,942 B2 * | 6/2010 | Ye et al. | 428/419 |
| 7,842,734 B2 * | 11/2010 | Geormezi et al. | 521/27 |
| 7,959,808 B2 | 6/2011 | Yeager et al. | 210/651 |
| 2009/0202888 A1 * | 8/2009 | Kuroda et al. | 429/33 |
| 2010/0311916 A1 * | 12/2010 | Tzou et al. | 525/407 |

FOREIGN PATENT DOCUMENTS

| | | |
|---|---|---|
| JP | 2004-133088 | 4/2004 |
| JP | 2009242756 A * | 10/2009 |
| WO | WO 0173509 A1 * | 10/2001 |

* cited by examiner ial
PHOTOSENSITIVE RESIN COMPOSITION, POLYMER COMPOUND, METHOD OF FORMING A PATTERN, AND ELECTRONIC DEVICE

CROSS-REFERENCE TO RELATED APPLICATION

This application claims priority under 35 USC 119 from Japanese Patent Application No. 2008-247883, the disclosure of which is incorporated by reference herein.

BACKGROUND OF THE INVENTION

1. Field of the Invention

The present invention relates to a polymer compound having excellent heat resistance and excellent insulating property, a positive highly heat-resistant photosensitive resin composition used for a surface protecting film and/or an interlayer insulating film of a semiconductor device, or for a planarization film and/or an interlayer insulating film of a display device, a method for forming a cured relief pattern having heat resistance using the positive highly heat-resistant photosensitive resin composition, and an electronic device for a semiconductor device, and for a display device, having a relief pattern.

2. Description of the Related Art

In a surface protecting film and/or the interlayer insulating film of a semiconductor device, a polyimide resin having each of excellent heat resistance, electric property and mechanical property is used. The polyimide resin is currently generally supplied in the form of a photosensitive polyimide precursor composition. The photosensitive polyimide precursor composition may be easily formed into a surface protecting film or an interlayer insulating film of a semiconductor device, or a planarization film or an interlayer insulating film of a display device, by applying the composition onto a substrate, and performing patterning with active light rays, development, and thermal imidation, whereby processing may be considerably shortened as compared with a case using a conventional non-photosensitive polyimide precursor composition.

However, when a photosensitive polyimide precursor composition is used, it is necessary to use a large amount of an organic solvent such as N-methyl-2-pyrrolidone as a developer in the developing step. For this reason, due to growing concerns about environmental problems in recent years, strategies to avoid use of an organic solvent agent have been sought.

As a result, recently, various proposals have been made for a heat-resistant photosensitive resin material including a photosensitive polyimide precursor and/or a photosensitive polybenzoxazole precursor, which can be developed with an aqueous alkali solution in a similar manner to a photoresist (see, for example, Japanese Patent Application Laid-Open (JP-A) No. 2004-133088). However, in a heat resistant resin material in which naphthoquinonediazide is added to a photosensitive polyimide precursor or photosensitive polybenzoxazole precursor, the effect of inhibiting dissolution of naphthoquinonediazide in an aqueous alkali solution is insufficient, and pattern forming property is insufficient.

In addition, another positive photosensitive resin including a polyphenylene oxide resin that is obtained by oxidative coupling polymerization using a copper catalyst has been proposed (see, for example, JP-A No. 2000-275842). However, it has been found that the polyphenylene oxide resin has insufficient heat resistance and insufficient insulating property. Although the cause has not been clarified, as one hypothesis it is presumed that since the resin is synthesized by oxidative coupling polymerization with a copper catalyst, there is a possibility that the catalyst remains in the resin, and that the deficiencies result from this.

SUMMARY OF THE INVENTION

Figure 1:
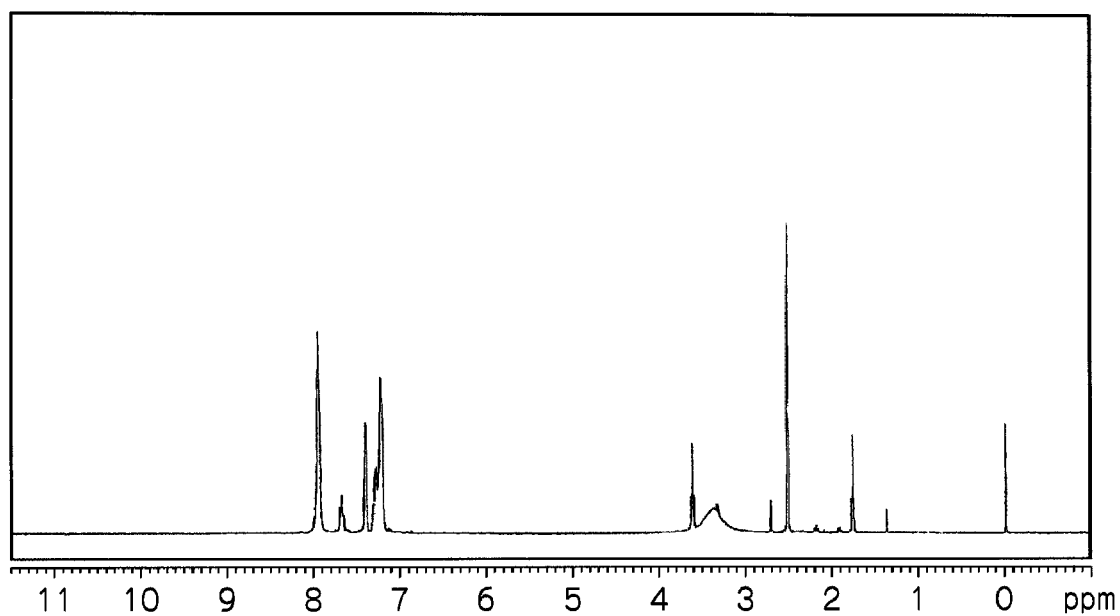
FIG. 1 is an NMR spectrum of a polymer obtained in Synthesis Example 7.

According to an aspect of the invention, a polymer compound having excellent heat resistance and excellent insulating property is provided. According to another aspect of the invention, a photosensitive resin composition is provided which includes the polymer compound and may form a cured pattern or a cured film having excellent pattern forming property, excellent resolution, excellent heat resistance, and excellent insulating property. In addition, according to still other aspects of the invention, a method for forming a cured pattern having excellent pattern forming property, excellent resolution, excellent heat resistance, and excellent insulating property is provided by use of the photosensitive resin composition, and an electronic device for a semiconductor device and for a display device having high reliability is provided by forming a pattern having excellent pattern forming property, excellent resolution, excellent heat resistance, and excellent insulating property.

The invention will be described below.

<1> A polymer compound obtained by reacting a monomer represented by the following Formula (1) and a monomer represented by the following Formula (2):

wherein, in Formulae (1) and (2), $Ar^1$ and $Ar^2$ each independently represent a divalent to hexavalent organic group having 6 to 30 carbon atoms, and the organic group may have a substituent; $R^1$ and $R^2$ each independently represent a hydrogen atom or a silyl group; $X^1$ and $X^2$ each independently represent a leaving group; each Y independently represents an acidic group or a group including an acidic group protected with an acid degradable group; each Y included in the polymer compound may be the same as or different from another Y included in the polymer compound; a and b each independently represent an integer of from 0 to 4, and a and b do not both represent 0.

<2> The polymer compound according to <1>, wherein the organic group represented by $Ar^1$ in Formula (1) is represented by the following Formula (1a) or Formula (1b), provided that since (Y)a is also shown in Formula (1), (Y)a in Formula (1a) or Formula (1b) is not included in $Ar^1$:

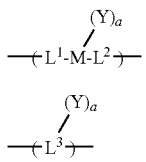

wherein, in Formulae (1a) and (1b), $L^1$, $L^2$ and $L^3$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

<3> The polymer compound according to <1>, wherein the leaving group represented by $X^1$ or $X^2$ in Formula (2) is a halogen atom, a group containing a nitrogen atom, a mesyl group, or a tosyl group.

<4> The polymer compound according to <1>, wherein the organic group represented by $Ar^2$ in Formula (2) is represented by the following Formula (2a) or Formula (2b), provided that since (Y)b is also shown in Formula (2), (Y)b in Formula (2a) or Formula (2b) is not included in $Ar^2$:

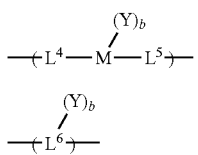

wherein, in Formulae (2a) and (2b), $L^4$, $L^5$ and $L^6$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

<5> The polymer compound according to <1>, wherein Y in Formula (1) or (2) is represented by the following Formula (y1):

wherein, in Formula (y1), A represents an (n+1)-valent linking group; PG represents a hydrogen atom or an acid degradable group; B represents a partial structure of an acidic group in which a moiety exhibiting acidity is protected with an acid degradable group PG; and n represents an integer of from 1 to 5.

<6> A photosensitive resin composition, including:
a polymer compound obtained by reacting a monomer represented by the following Formula (1) and a monomer represented by the following Formula (2); and
a photosensitizing agent:

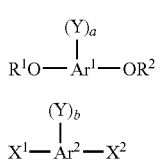

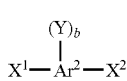

wherein, in Formulae (1) and (2), $Ar^1$ and $Ar^2$ each independently represent a divalent to hexavalent organic group having 6 to 30 carbon atoms, and the organic group may have a substituent; $R^1$ and $R^2$ each independently represent a hydrogen atom or a silyl group; $X^1$ and $X^2$ each independently represent a leaving group; each Y independently represents an acidic group or a group including an acidic group protected with an acid degradable group; each Y included in the polymer compound may be the same as or different from another Y included in the polymer compound; a and b each represent an integer of 0 to 4, and a and b do not both represent 0.

<7> The photosensitive resin composition according to <6>, wherein the organic group represented by $Ar^1$ in Formula (1) is represented by the following Formula (1a) or Formula (1b), provided that since (Y)a is also shown in Formula (1), (Y)a in Formula (1a) or Formula (1b) is not included in $Ar^1$:

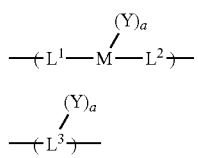

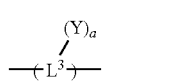

wherein, in Formulae (1a) and (1b), $L^1$, $L^2$ and $L^3$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

<8> The photosensitive resin composition according to <6>, wherein the leaving group represented by $X^1$ or $X^2$ in Formula (2) is a halogen atom, a group containing a nitrogen atom, a mesyl group, or a tosyl group.

<9> The photosensitive resin composition according to <6>, wherein the organic group represented by $Ar^2$ in Formula (2) is represented by the following Formula (2a) or Formula (2b), provided that since (Y)b is also shown in Formula (2), (Y)b in Formula (2a) or Formula (2b) is not included in $Ar^2$:

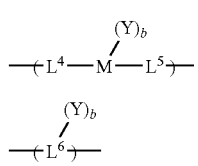

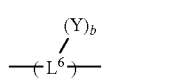

wherein, in Formulae (2a) and (2b), $L^4$, $L^5$ and $L^6$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

<10> The photosensitive resin composition according to <6>, wherein Y in Formula (1) or (2) is represented by the following Formula (y1):

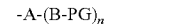

wherein, in Formula (y1), A represents an (n+1)-valent linking group; PG represents a hydrogen atom or an acid degradable group; B represents a partial structure of an acidic group in which a moiety exhibiting acidity is protected with an acid degradable group PG; and n represents an integer of from 1 to 5.

<11> The photosensitive resin composition according to <6>, wherein the photosensitizing agent is a compound which generates an acid in response to light.

<12> The photosensitive resin composition according to <11>, wherein the compound which generates an acid in response to light is a diazonium salt, a phosphonium salt, a sulfonium salt, an iodonium salt, an imidosulfonate, an oximesulfonate, a diazodisulfone, a disulfone, or an o-nitrobenzyl sulfonate.

<13> The photosensitive resin composition according to <11>, wherein the compound which generates an acid in response to light is a compound represented by the following Formula (ZI), (ZII) or (ZIII):

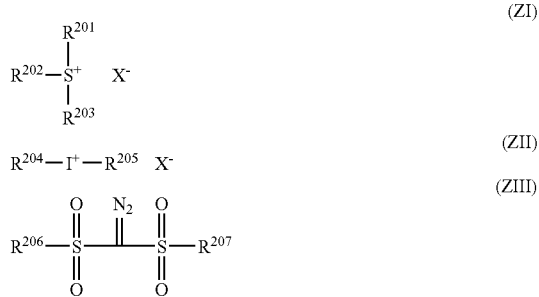

wherein, in Formulae (ZI) to (ZIII), $R^{201}$ to $R^{207}$ each independently represent an organic group having 1 to 30 carbon atoms; two of $R^{201}$ to $R^{203}$ may be bonded to form a ring structure; $R^{204}$ and $R^{205}$ may be bonded to form a ring structure; $R^{206}$ and $R^{207}$ may be bonded to form a ring structure; and $X^-$ represents a non-nucleophilic anion.

<14> The photosensitive resin composition according to <6>, further including a crosslinking agent.

<15> A method for forming a pattern, including:
applying the photosensitive resin composition according to <6> onto a substrate;
drying the photosensitive resin composition;
exposing the photosensitive resin composition to light; and
developing the photosensitive resin composition using an alkali aqueous solution and/or an organic solvent.

<16> An electronic device, including a pattern obtained by the method according to <15>.

DETAILED DESCRIPTION OF THE INVENTION

According to an aspect of the invention, a polymer compound having excellent heat resistance and excellent insulating property is provided. According to another aspect of the invention, a photosensitive resin composition is provided which includes the polymer compound and may form a cured pattern or a cured film having excellent pattern forming property, excellent resolution, excellent heat resistance, and excellent insulating property. In addition, according to still other aspects of the invention, a method for forming a cured pattern having excellent pattern forming property, excellent resolution, excellent heat resistance, and excellent insulating property is provided by use of the photosensitive resin composition, and an electronic device for a semiconductor device and for a display device having high reliability is provided by forming a pattern having excellent pattern forming property, excellent resolution, excellent heat resistance, and excellent insulating property.

The photosensitive resin composition according to an exemplary embodiment of the invention will be explained in detail hereinafter.

The photosensitive resin composition according to an exemplary embodiment of the invention includes (A) a polymer compound obtained by reacting a monomer represented by the following Formula (1) and a monomer represented by the following Formula (2), and (B) a photosensitizing agent. The constituent components of the photosensitive resin composition will be described hereinbelow.

(A) Polymer Compound Obtained by Reacting Monomer Represented by Formula (1) and Monomer Represented by Formula (2)

The polymer compound of according to an exemplary embodiment of the invention is obtained by reacting the monomer represented by the following Formula (1) and the monomer represented by the following Formula (2).

In Formulae (1) and (2), $Ar^1$ and $Ar^2$ each independently represent a divalent to hexavalent organic group having 6 to 30 carbon atoms, and the organic group may further have a substituent; $R^1$ and $R^2$ each independently represent a hydrogen atom or a silyl group; $X^1$ and $X^2$ each independently represent a leaving group; each Y independently represents an acidic group or a group including an acidic group protected with an acid degradable group; each Y included in the polymer compound may be the same as or different from another Y included in the polymer compound; and a and b each independently represent an integer of from 0 to 4, and a and b do not both represent 0.

The (A) polymer compound according to the exemplary embodiment of the invention has sufficient solubility in a coating solvent which is generally used in manufacture of electronic device, and a photosensitive resin composition including the polymer compound is uniform, resulting in no precipitation of insoluble matter. Also, a pattern obtained by using the photosensitive resin composition is excellent in pattern forming property, resolution, heat resistance, and insulating property. The resultant pattern may be utilized as a surface protecting film or an interlayer insulating film for a semiconductor device and a planarization film or an interlayer insulating film for a display device.

The photosensitive resin composition according to the exemplary embodiment of the invention is particularly effective for an electronic device. The electronic device referred in the invention means an electronic device for a semiconductor device or for a display device, and the photosensitive resin composition according to the exemplary embodiment of the invention exerts the effect thereof particularly when it is used in a surface protecting film or an interlayer insulating film of a semiconductor device, or a planarization film or an interlayer insulating film of a display device.

In Formula (1), $Ar^1$ represents a divalent to hexavalent organic group having 6 to 30 carbon atoms, the organic group preferably having an aromatic ring and/or an aliphatic group, more preferably a divalent to hexavalent organic group having 6 to 24 carbon atoms and having an aromatic ring and/or an aliphatic group, and particularly preferably a divalent to hexavalent organic group having 6 to 20 carbon atoms and having an aromatic ring and/or an aliphatic group.

$Ar^1$ preferably represents a structure as shown in the following Formula (1a) or the following Formula (1b), provided that since (Y)a is also shown in Formula (1), (Y)a in Formula (1a) or Formula (1b) is not included in $Ar^1$.

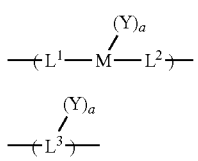

$$-\!\!+\!\!L^1\!-\!\!\overset{(Y)_a}{\overset{|}{M}}\!-\!L^2\!\!\!\rightarrow\!\!- \qquad (1a)$$

$$-\!\!+\!\!\overset{(Y)_a}{\overset{|}{L^3}}\!\!\!\rightarrow\!\!- \qquad (1b)$$

In the case of Formula (1a), $Ar^1$ corresponds to -($L^1$-M-$L^2$)-, and as described below, $Ar^1$ herein has a structure including two ring structures which are bonded directly or via a linking group shown below. In the case of Formula (1b), $Ar^1$ corresponds to -$L^3$-, and represents one ring structure.

Herein, $L^1$, $L^2$ and $L^3$ each independently represent a heterocycle having 5 to 30 carbon atoms, an aromatic carbocycle having 6 to 30 carbon atoms (e.g. a benzene ring, a naphthalene ring), or an aliphatic carbocycle having 3 to 30 carbon atoms (e.g. a cyclopropane ring, a cyclobutane ring, a cyclopentane ring), and $L^1$ and $L^2$ may be the same as or different from each other. M represents a divalent linking group such as a single bond, an alkylene group having 1 to 20 carbon atoms (e.g. a methylene group, an ethylene group, a hexafluoroisopropylidene group; these groups may each have a substituent), —O—, —S—, —SO$_2$—, —CO—, —N(R$^{11}$)—, or a group obtained by combining them, and R$^{11}$ represents a hydrogen atom, an alkyl group having 1 to 10 carbon atoms, or an acyl group having 1 to 10 carbon atoms. Y and a each have the same meanings as those of Y and a in Formula (1), respectively. When a is 1 to 4, at least one of the groups of M, $L^1$ and $L^2$, or a group as $L^3$ is substituted by a-number of Ys.

In Formula (1), $R^1$ and $R^2$ each independently represent a hydrogen atom or a silyl group, the silyl group having 1 to 10 carbon atoms, such as a triethoxysilyl group, a methyldiethoxysilyl group, or a trivinylsilyl group, and $R^1$ and $R^2$ may be the same as or different from each other. Preferably, $R^1$ and $R^2$ each represent a hydrogen atom or a silyl group having a hydrocarbon group having 1 to 6 carbon atoms, more preferably a hydrogen atom or a silyl group having a hydrocarbon group having 1 to 3 carbon atoms, and particularly preferably a hydrogen atom.

$Ar^1$ of Formula (1) may have a substituent in addition to $R^1$, $R^2$ and Y, and examples of the substituent include a halogen atom (e.g. a fluorine atom, a chlorine atom, a bromine atom, or an iodine atom), a straight-chain, branched or cyclic alkyl group (e.g. an alkyl group having 1 to 20 carbon atoms, preferably 1 to 10 carbon atoms, such as a methyl group, a t-butyl group, a cyclopentyl group, a cyclohexyl group, an adamantyl group, a biadamantyl group, or a biamantyl group), an alkynyl group (e.g. an alkynyl group having 2 to 10 carbon atoms such as an ethynyl group or a phenylethynyl group), an aryl group (e.g. an aryl group having 6 to 10 carbon atoms such as a phenyl group, a 1-naphthyl group, or a 2-naphthyl group), an acyl group (e.g. an acyl group having 1 to 10 carbon atoms such as an acetyl group or a benzoyl group), an aryloxy group (e.g. an aryloxy group having 6 to 10 carbon atoms such as a phenoxy group), an arylsulfonyl group (e.g. an arylsulfonyl group having 6 to 10 carbon atoms such as a phenylsulfonyl group), an alkoxy group (e.g. an alkoxy group having 1 to 10 carbon atoms such as a methoxy group, an ethoxy group, or a propoxy group), a nitro group, a cyano group, a silyl group (e.g. a silyl group having 1 to 10 carbon atoms such as a triethoxysilyl group, a methyldiethyoxysilyl group, or a trivinylsilyl group), an alkoxycarbonyl group (e.g. an alkoxycarbonyl group having 2 to 10 carbon atoms such as a methoxycarbonyl group), and a carbamoyl group (e.g. a carbamoyl group having 1 to 10 carbon atoms such as a carbamoyl group or a N,N-dimethylcarbamoyl group). These substituents each may be further substituted by another substituent.

Examples of the monomer represented by Formula (1) are shown below, but are not limited thereto. The following are examples of monomers in which $R^1$ and $R^2$ in Formula (1) are each a hydrogen atom; however, when $R^1$ and/or $R^2$ are a silyl group, a compound in which a hydrogen atom is substituted with a silyl group is a preferable example.

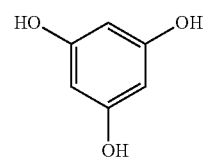
(a-1)

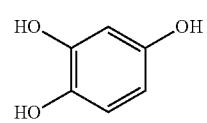
(a-2)

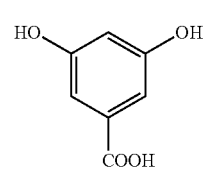
(a-3)

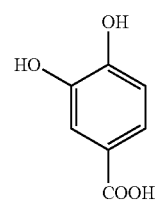
(a-4)

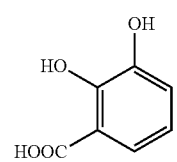
(a-5)

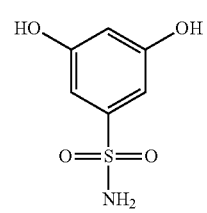
(a-6)

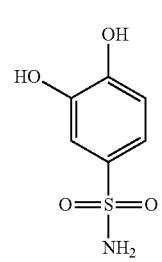
(a-7)

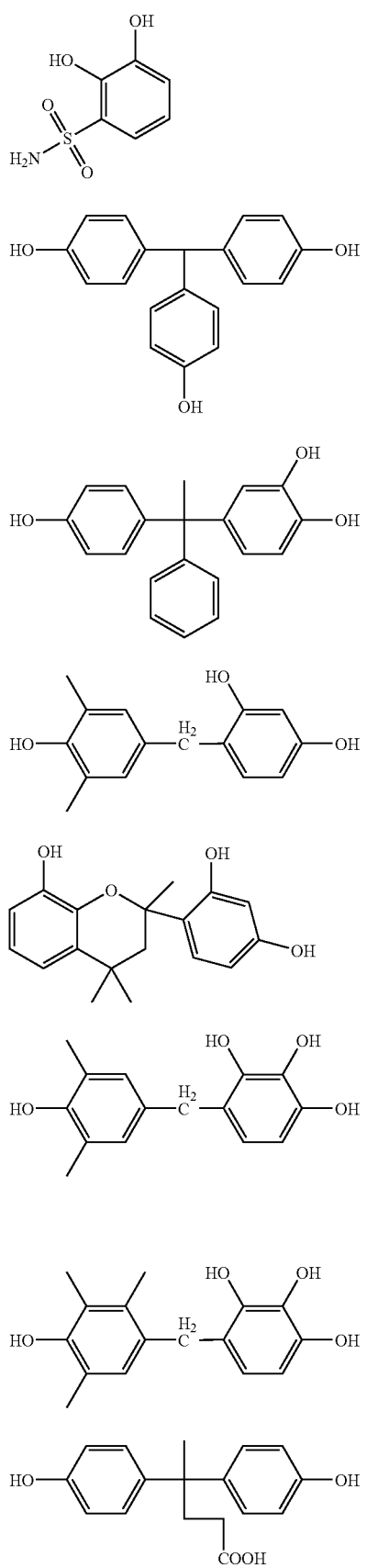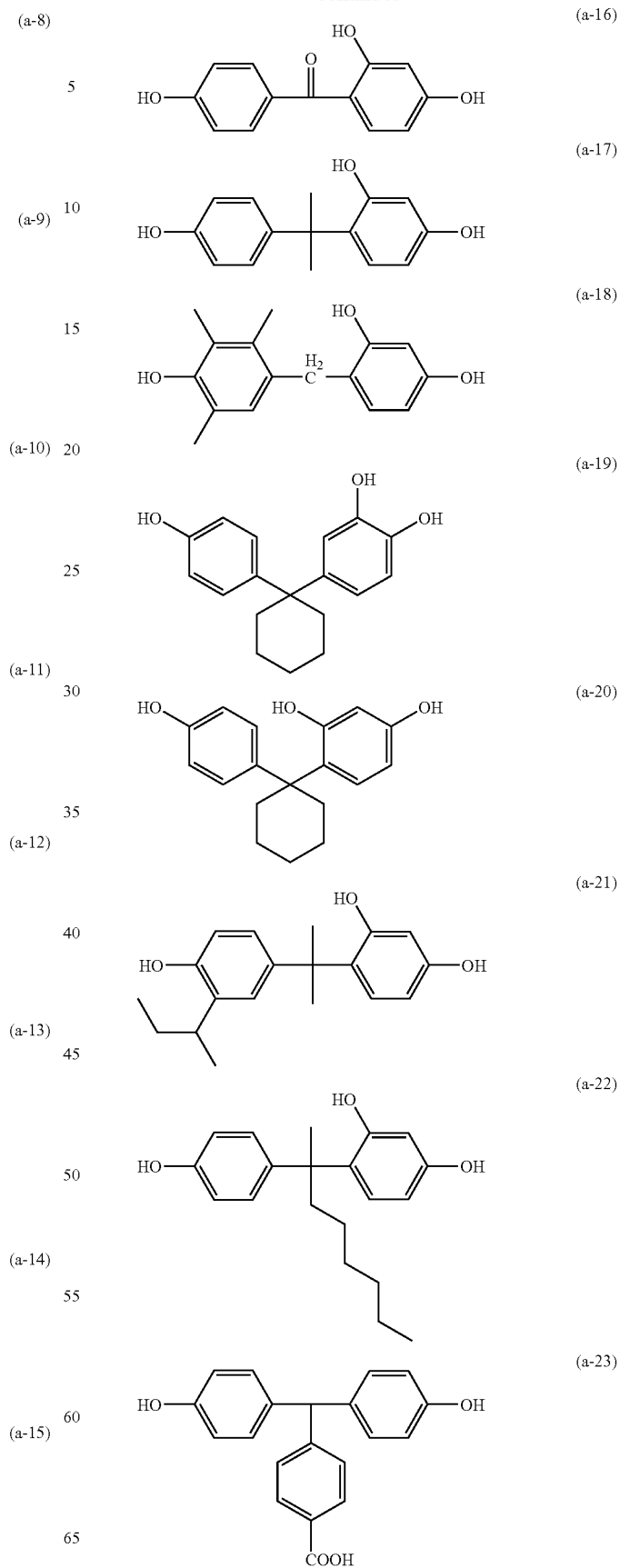

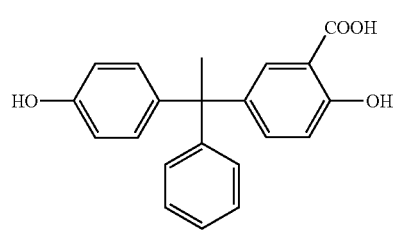 (a-24)
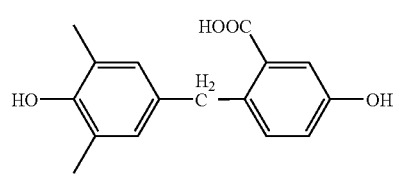 (a-25)
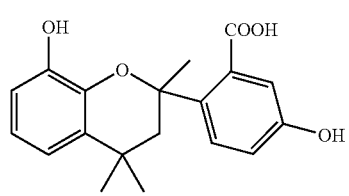 (a-26)
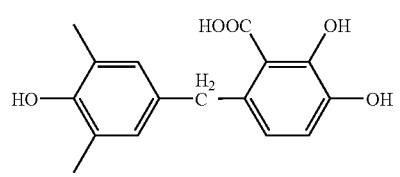 (a-27)
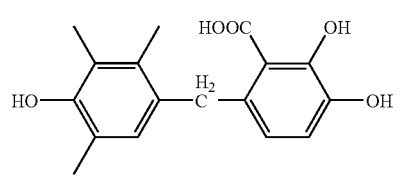 (a-28)
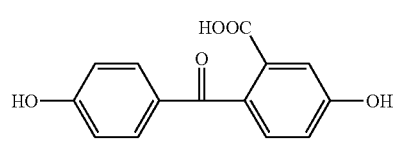 (a-29)
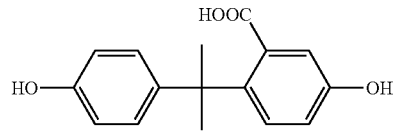 (a-30)
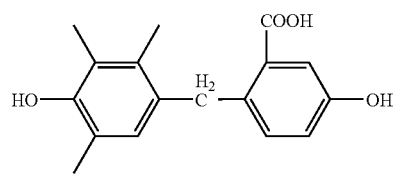 (a-31)
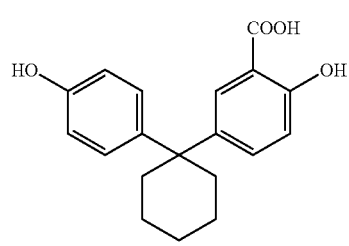 (a-32)
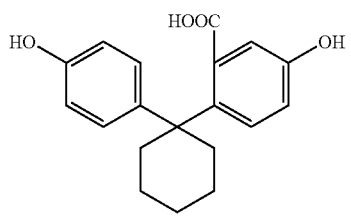 (a-33)
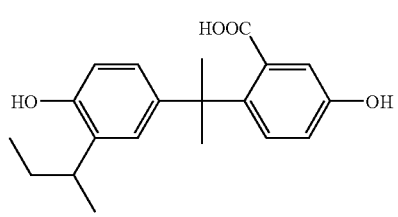 (a-34)
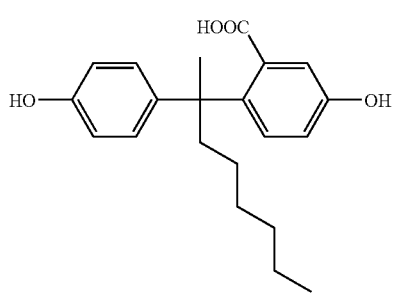 (a-35)
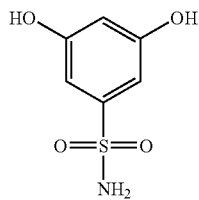 (a-36)
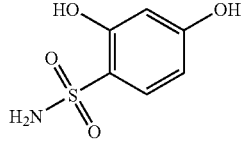 (a-37)
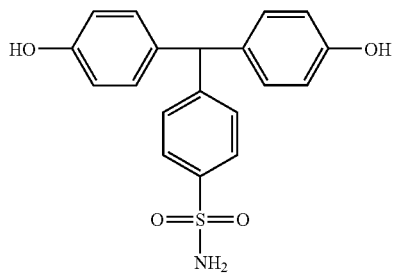 (a-38)
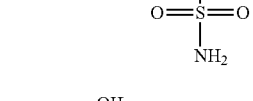 (a-39)
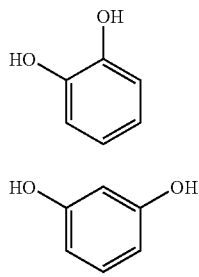 (a-40)

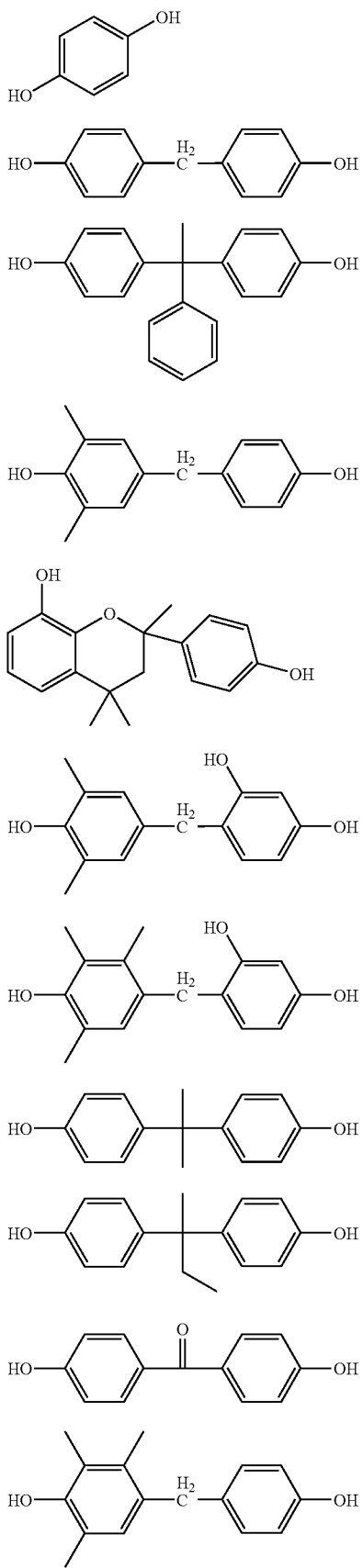

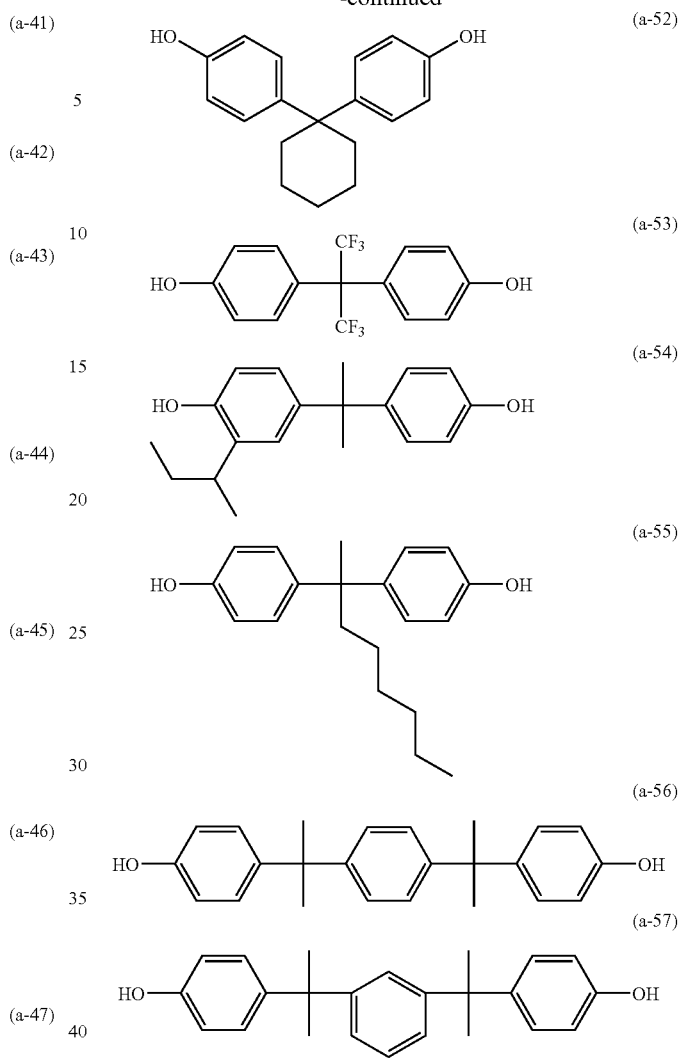

In Formula (2), Ar² represents a divalent to hexavalent organic group having 6 to 30 carbon atoms, the organic group preferably having an aromatic ring and/or an aliphatic group, more preferably a divalent to hexavalent organic group having 6 to 24 carbon atoms and having an aromatic ring and/or an aliphatic group, and particularly preferably a divalent to hexavalent organic group having 6 to 20 carbon atoms and having an aromatic ring and/or an aliphatic group.

Preferably, Ar² represents a structure as shown in the following Formula (2a) or Formula (2b), provided that since (Y)b is also shown in Formula (2), (Y)b in Formula (2a) or Formula (2b) is not included in Ar².

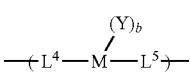

(2a)

(2b)

Herein, L⁴, L⁵, L⁶, and M each have the same meanings as those of L¹, L², L³ and M described above, respectively. Y and b each represent the same meanings as those of Y and b in Formula (2), respectively. When b is 1 to 4, at least one of groups of M, $L^4$ and $L^5$, and a group as $L^6$ is substituted by b-number of Ys.

In Formula (2), $X^1$ and $X^2$ each independently represent a leaving group, and may be the same as or different from each other. $X^1$ and/or $X^2$ are preferably a halogen atom such as a fluorine atom, a chlorine atom, a bromine atom, or an iodine atom, a nitrogen-containing group such as a nitro group, a mesyl group, or a tosyl group, more preferably a fluorine atom, a chlorine atom, a bromine atom, an iodine atom, a nitro group, or a tosyl group, further more preferably a fluorine atom, a chlorine atom, a bromine atom, an iodine atom, or a nitro group, and particularly preferably a fluorine atom, a chlorine atom, or a nitro group.

$Ar^2$ of Formula (2) may have a substituent in addition to $X^1$, $X^2$ and Y, and examples of the substituent are the same as those listed as the substituent which may be further possessed by the group represented by $Ar^1$.

Examples of the monomer represented by Formula (2) are shown below, but not limited thereto.

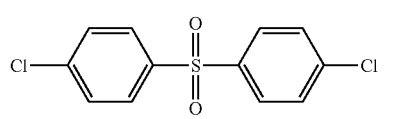
(b-1)

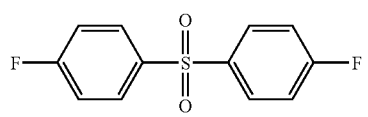
(b-2)

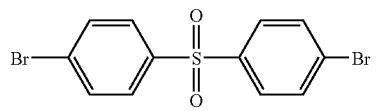
(b-3)

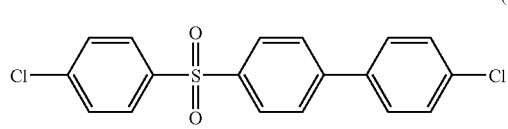
(b-4)

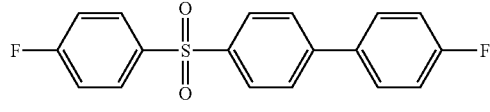
(b-5)

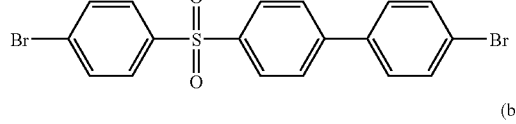
(b-6)

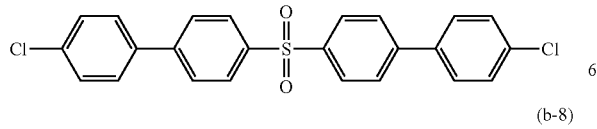
(b-7)

(b-8)

-continued

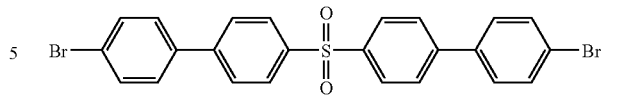
(b-9)

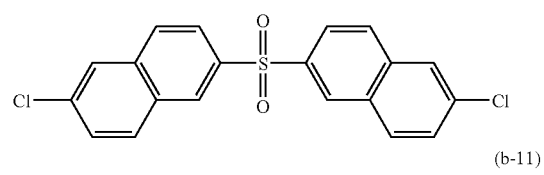
(b-10)

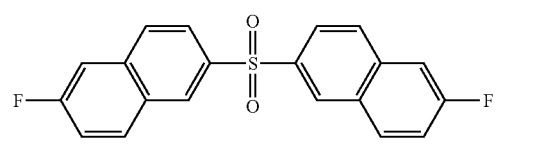
(b-11)

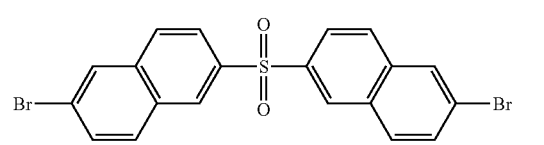
(b-12)

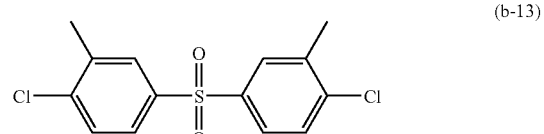
(b-13)

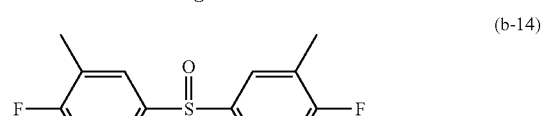
(b-14)

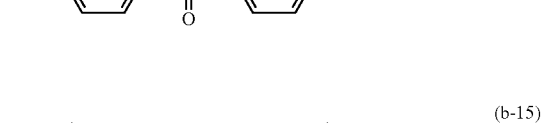
(b-15)

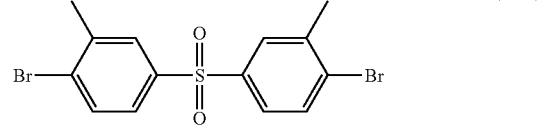
(b-16)

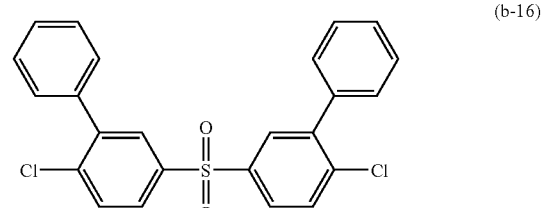
(b-17)

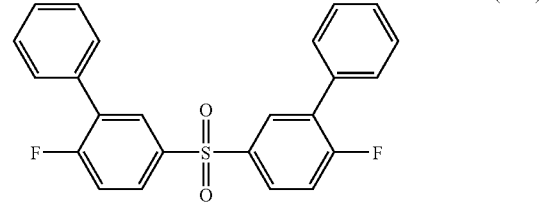

(b-18)
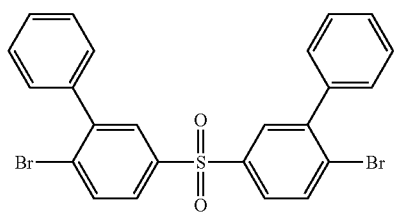

(b-19)
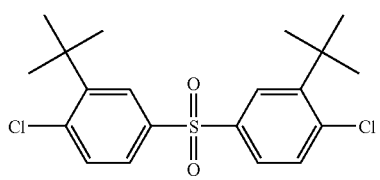

(b-20)
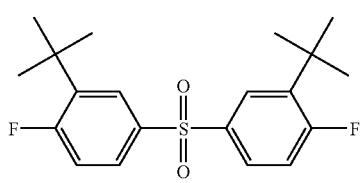

(b-21)
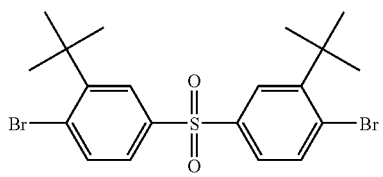

(b-22)
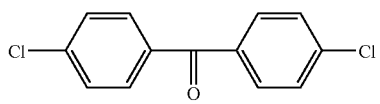

(b-23)
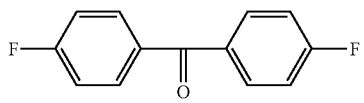

(b-24)
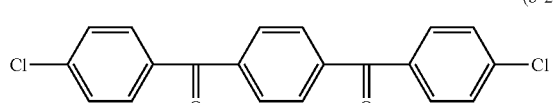

(b-25)
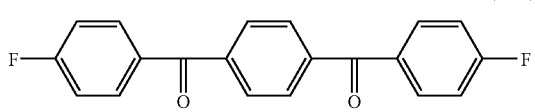

(b-26)
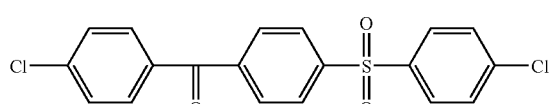

(b-27)
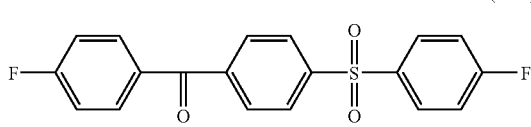

(b-28)
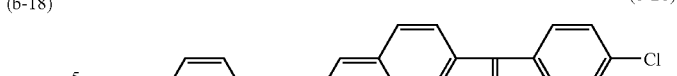

(b-29)
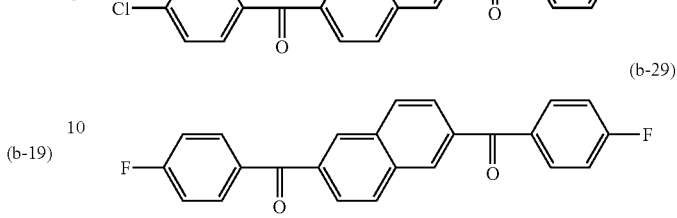

In Formulae (1) and (2), Y represents an acidic group or a group including an acidic group protected with an acid degradable group, and the group including an acidic group protected with an acid degradable group is specifically represented by the following Formula (y1).

$$-A-(B-PG)_n \quad (y1)$$

In the formula, A represents an (n+1)-valent linking group, PG represents a hydrogen atom or an acid degradable group, and B represents a partial structure of an acid group in which a moiety exhibiting acidity is protected with an acid degradable group PG. n represents an integer of 1 to 5, preferably 1 to 3, more preferably 1 or 2, and particularly preferably 1.

An acidic group produced by degradation (elimination) of PG has a pKa of preferably 15 or less, more preferably 2 to 12. Examples of the acidic group (BH) produced by degradation (elimination) of PG include —OH, —COOH, —SO₃H, —SO₂NH₂, and —C(CF₃)₂—OH, preferably —OH, —COOH, —SO₂NH₂, and —C(CF₃)₂—OH, and more preferably —OH and —COOH.

The (n+1)-valent linking group as A represents a single bond, an alkylene group having 1 to 20 carbon atoms, —O—, —S—, —SO₂—, —CO—, —N(R$^{10}$)—, or an (n+1)-valent group obtained by removing arbitrary n−1 number of hydrogen atoms from a divalent group obtained by combining them. R$^{10}$ represents a hydrogen atom, an alkyl group having 1 to 10 carbon atoms, or an acyl group having 1 to 10 carbon atoms.

The acid degradable group represented by PG is not particularly limited as far as it may generate an acidic group by the action of an acid, and a representative thereof is a group which is acid-degradable with a hetero atom contained in an acidic group, and may form ether, ester, acetal, ketal, silyl ether, or silyl ester.

Examples of the acid degradable group represented by PG include a tertiary alkyl group (e.g. a tertiary alkyl group having 4 to 15 carbon atoms, or preferably 4 to 13 carbon atoms such as a t-butyl group, a t-amyl group, a 1-methylcyclopentyl group, a 1-ethylcyclopentyl group, or a 1-ethylcyclohexyl group), and groups represented by the following Formulae (y2), (y3), and (y4), respectively.

(y2)

(y3)

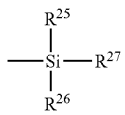

(y4)

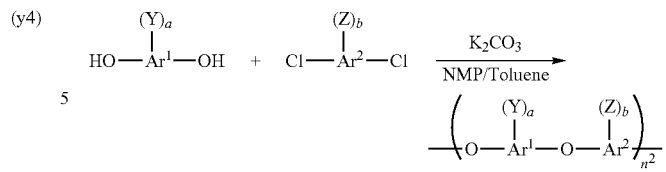

In Formula (y2), $R^{20}$ represents an alkyl group (e.g. an alkyl group having 1 to 10 carbon atoms, and preferably 1 to 4 carbon atoms, such as a methyl group, an ethyl group, or a propyl group), and $R^{21}$ and $R^{22}$ each independently represent a hydrogen atom or an alkyl group (e.g. an alkyl group having 1 to 10 carbon atoms, and preferably 1 to 4 carbon atoms, such as a methyl group, an ethyl group, or a propyl group). When $R^{20}$ and $R^{21}$ both represent alkyl groups, they may be bonded to each other to form a carbocycle.

In Formula (y3), $R^{23}$ represents an aryl group (e.g. an aryl group having 6 to 20 carbon atoms, such as a phenyl group or a naphthyl group), and $R^{24}$ represents an alkyl group (e.g. an alkyl group having 1 to 10 carbon atoms, and preferably 1 to 4 carbon atoms, such as a methyl group, an ethyl group, or a propyl group). The aryl group represented by $R^{23}$ may have a substituent, and a preferable substituent is the same as that exemplified as the substituent which may be further possessed by the group represented by $R^1$.

In Formula (y4), $R^{25}$ to $R^{27}$ each independently represent an alkyl group (e.g. an alkyl group having 1 to 10 carbon atoms, and preferably 1 to 4 carbon atoms, such as a methyl group, an ethyl group, or a propyl group) or an aryl group (e.g. an aryl group having 6 to 20 carbon atoms, such as a phenyl group or a naphthyl group).

Examples of preferable PG include a t-butyl group, a t-amyl group, a 1-methylcyclopentyl group, a 1-ethylcyclopentyl group, a 1-ethylcyclohexyl group, an alkoxyalkyl group such as a methoxymethyl group and an ethoxyethyl group, a tetrahydropyranyl group, a tetrahydrofuranyl group, an alkoxy-substituted tetrahydropyranyl group, an alkoxy-substituted tetrahydrofuranyl group, a benzyl group, a p-methoxybenzyl group, a trimethylsilyl group, a triethylsilyl group, and a t-butyldimethylsilyl group.

In Formulae (1) and (2), a and b each independently represent an integer of 0 to 4, preferably an integer of 0 to 3, more preferably an integer of 0 to 2, provided that (a+b) is 1 or more, and (a+b) represents preferably an integer of 1 to 4, more preferably an integer of 1 to 3, particularly preferably 1 or 2.

The molecular weight of the (A) polymer compound according to the exemplary embodiment of the invention is not particularly limited, but the weight average molecular weight thereof is preferably from 1,000 to 500,000, more preferably from 3,000 to 300,000, particularly preferably from 5,000 to 200,000, from viewpoints of an alkali dissolution rate and film physical property. In the invention, the molecular weight is measured by a gel permeation chromatography method, and may be obtained by using a standard polystyrene calibration line.

The polymer compound according to an exemplary embodiment of the invention may be obtained, for example, by polymerizing a compound having two phenolic hydroxy groups, which is a monomer represented by Formula (1), and a compound having two leaving chlorine atoms, which is a monomer represented by Formula (2), in a reaction solvent in the presence of an inorganic salt. One example of this reaction is shown below.

Polymerization of the monomer represented by Formula (1) and the monomer represented by Formula (2) is preferably performed in a solvent. As the solvent used in the reaction of polymerizing monomers represented by Formulae (1) and (2), any solvent may be used as far as it is a solvent in which the raw material monomers may be dissolved at the necessary concentrations, and which does not adversely affect the properties of a film formed from the resultant polymer. Examples of the solvent include solvents such as water, alcohol solvents such as methanol, ethanol, and propanol, ketone solvents such as acetone, alcohol acetone, methyl ethyl ketone, methyl isobutyl ketone, cyclohexanone, and acetophenone, ester solvents such as ethyl acetate, butyl acetate, propylene glycol monomethyl ether acetate, γ-butyrolactone, and methyl benzoate, ether solvents such as dibutyl ether, anisole, and tetrahydrofuran, aromatic hydrocarbon solvents such as toluene, xylene, mesitylene, 1,2,4,5-tetramethylbenzene, pentamethylbenzene, isopropylbenzene, 1,4-diisopropylbenzene, t-butylbenzene, 1,4-di-t-butylbenzene, 1,3,5-triethylbenzene, 1,3,5-tri-t-butylbenzene, 4-t-butyl-orthoxylene, 1-methylnaphthalene, and 1,3,5-triisopropylbenzene, amide solvents such as N-methylpyrrolidinone and dimethylacetamide, halogen-containing solvents such as carbon tetrachloride, dichloromethane, chloroform, 1,2-dichlroethane, chlorobenzene, 1,2-dichlorobenzene, and 1,2,4-trichlorobenzene, and aliphatic hydrocarbon solvents such as hexane, heptane, octane, and cyclohexane.

Among them, examples of more preferable solvent include tetrahydrofuran, γ-butyrolactone, anisole, toluene, xylene, mesitylene, isopropylbenzene, t-butylbenzene, 1,3,5-tri-t-butylbenzene, 1-methylnaphthalene, 1,3,5-triisopropylbenzene, amide solvents such as dimethylacetamide and N-methylpyrrolidinone, 1,2-dichloroethane, chlorobenzene, 1,2-dichlorobenzene, and 1,2,4-trichlorobenzene, and particularly preferable are amide solvents such as N-methylpyrrolidinone and dimethylacetamide. Each of them may be used alone, or two or more thereof may be used in combination.

The boiling point of the organic solvent used in the polymerization reaction is preferably 50° C. or higher, more preferably 100° C. or higher, and particularly preferably 150° C. or higher.

The concentration of a solute in the reaction solution is preferably 1 to 50% by mass, more preferably 5 to 30% by mass, and particularly preferably 10 to 20% by mass.

The inorganic salt used in production of the polymer in the invention is not particularly limited as far as it can convert the monomer of Formula (1) into a nucleophilic metal salt in the reaction system, but a salt which produces an alkali metal salt of the monomer represented by Formula (1) is preferable. Therefore, an alkali metal salt of the compound of Formula (1) may be separately synthesized and used, or the salt may be formed before the polymerization reaction or the reaction may proceed while the salt is formed simultaneously. Examples the alkali metal salt include salts formed with lithium, sodium, potassium or the like, and particularly preferable is a salt formed with potassium or sodium. Examples of a metal compound used for forming an alkali salt include a hydroxide, a carbonate, and a bicarbonate, and a hydroxide and a carbonate are particularly preferable. Therefore, in view of forming an alkali salt of the compound of Formula (1), the inorganic salt is preferably a potassium hydroxide, a sodium hydroxide, a potassium carbonate, or a sodium carbonate.

As the inorganic salt used in the invention, only one kind may be used, or two or more kinds may be used in combination.

The amount of the alkali metal salt to be used varies depending on the kind thereof, and varies depending on a substrate, but the amount is preferably within the range of from 1- to 8-fold mole based on the amount of the monomer represented by Formula (1). More preferable is the range of from 2- to 4-fold mole. When the amount of the alkali metal salt is 1-fold mole or less with respect to the amount of the monomer represented by Formula (1), an alkali metal salt of the monomer represented by Formula (1) may not be sufficiently produced, resulting in difficulty in obtaining a high-molecular weight polymer compound. Meanwhile, excessive amount of the 8-fold mole or more is not economically advantageous.

An actual polymerization reaction in production of the polymer compound of the invention may be implemented in the following various forms. Examples thereof include (I) a method of adding the monomer represented by Formula (1) and an alkali metal salt to an azeotropic dehydration solvent to produce an alkali metal salt of the monomer represented by Formula (1) through azeotropic dehydration, adding the monomer represented by Formula (2), and performing polymerization, in the presence of a polymerization solvent, (II) a method of adding the monomer represented by Formula (1), an alkali metal salt, an azeotropic dehydration solvent, and the monomer represented by Formula (2), performing azeotropic dehydration, and performing polymerization while an alkali metal salt of the monomer represented by Formula (2) is produced, in the presence of a polymerization solvent, (III) a method of separately producing an alkali metal salt of the monomer represented by Formula (1), and adding the monomer represented by Formula (2) thereto, followed by polymerization, in the presence of a polymerization solvent, and (IV) a method of adding an aqueous solution of an alkali metal salt of the monomer represented by Formula (1) to a polymerization solvent, and adding further the monomer represented by Formula (2) together with an azeotropic solvent, followed by polymerization.

As apparent from the examples of the polymerization method, in dehydration by azeotropy, an azeotropic solvent which is azeotropic with water is used, if necessary. Examples of the azeotropic solvent include aromatic hydrocarbons such as benzene, toluene, and xylene, and halogenated aromatic hydrocarbons such as chlorobenzene and o-dichlorobenzene, but the azeotropic solvent is not particularly limited as far as it is azeotropic with water. The amount of the azeotropic solvent to be used may be determined based on the amount of moisture present in the reaction system, an azeotropic composition, and the like. In dehydration using the azeotropic solvent, water and the azeotropic solvent are both distilled off, the distillate is cooled and condensed, and water and the azeotropic solvent are separated into two layers. When the separated azeotropic solvent layer is made to be refluxed into the reaction system, since the azeotropic solvent is effectively used, dehydration may be completed without using largely excessive azeotropic solvent. A time necessary for azeotropic dehydration varies depending on the amount of moisture present in the reaction system, the amount of the solvent of the azeotropic solvent to be used, and the like, and from a practical viewpoint, azeotropic dehydration is performed preferably within 10 hours, more preferably azeotropic dehydration is completed within 5 hours.

The optimal conditions for the polymerization reaction in the invention vary depending on a kind and a concentration of a solvent and the like. Regarding a reaction temperature, an internal temperature is preferably from 0° C. to 230° C., more preferably from 100° C. to 230° C., and particularly preferably from 140° C. to 200° C., and a reaction time is preferably in the range of from 1 to 50 hours, more preferably from 2 to 40 hours, and particularly preferably from 3 to 30 hours.

Also, in order to suppress oxidative degradation of the polymer compound, a reaction is preferably performed under the inert gas atmosphere (e.g. nitrogen or argon). In addition, it is also preferable that polymerization is performed under a light shielding condition in order to inhibit an undesired light reaction.

Regarding the monomers represented by Formulae (1) and (2), when synthesizing the polymer compound, one kind of each may be used, or one kind of one and two or more kinds of the other may be used, or two or more kinds of each may be used.

In addition, the content ratio of the monomer represented by Formula (1) and the monomer represented by Formula (2) when synthesizing the polymer compound using monomers represented by Formulae (1) and (2) may be any content ratio as long as it is within a range whereby the intended product can be synthesized.

A preferable content ratio of the monomer represented by Formula (1) and the monomer represented by Formula (2), as expressed by a molar ratio of the monomer represented by Formula (1) with respect to the monomer represented by Formula (2), is in the range of from 0.6 to 1.4. The molar ratio is more preferably in the range of from 0.8 to 1.2, and, for the purpose of obtaining a polymer compound having a high molecular weight, it is particularly preferable that the molar ratio is about 1. In contrast, when polymerization is performed with a molar ratio outside of the above range, it becomes difficult to obtain a polymer compound having a high molecular weight.

(B) Photosensitizing Agent

The (B) photosensitizing agent in the invention refers to a compound which imparts a function of forming an image by light exposure to the photosensitive resin composition and/or initiates image formation by light exposure. Specifically, examples thereof include (B1) a compound which generates an acid in response to light exposure (photo acid generator), (B2) a photosensitive quinonediazide compound and (B3) a dihydropyridine compound. Two or more kinds of these photosensitizing agents may be used together. Alternatively, in order to adjust the sensitivity, a sensitizer may be used in combination therewith.

(B1) Photo Acid Generator

As the photo acid generator, a photoinitiator of photo-cationic polymerization, a photoinitiator of photo-radical polymerization, a photo-decolorizing agent for coloring matters, a photo-discoloring agent, or a known compound which is used in a microresist and generates an acid by irradiation with active light ray or radiation, and a mixture thereof may be appropriately selected and used.

Examples thereof include a diazonium salt, a phosphonium salt, a sulfonium salt, an iodonium salt, an imidosulfonate, an oximesulfonate, a diazodisulfone, a disulfone, and an o-nitrobenzyl sulfonate. Examples of a preferable photosensitizing agent include an imidosulfonate, an oximesulfonate, and an o-nitrobenzyl sulfonate which are compounds that generate sulfonic acid.

In addition, a compound obtained by introducing a group or a compound which generates an acid by irradiation with active light ray or radiation into a main chain or a side chain of a resin, for example, compounds described in U.S. Pat. No. 3,849,137, German Patent No. 3914407, Japanese Patent Application Laid-Open (JP-A) Nos. 63-26653, 55-164824, 62-69263, 63-146038, 63-163452, 62-153853, and 63-146029 may be used.

Further, compounds which generate an acid by application of light described in U.S. Pat. No. 3,779,778 and European Patent No. 126,712 may also be used.

Among compounds which generate an acid by irradiation with active light ray or radiation, examples of a preferable compound include compounds represented by the following Formulae (ZI), (ZII) and (ZIII).

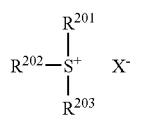

(ZI)

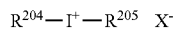

(ZII)

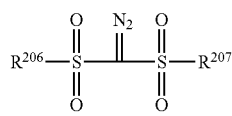

(ZIII)

In Formulae (ZI) to (ZIII), $R^{201}$ to $R^{207}$ each independently represent an organic group, the organic groups of $R^{201}$ to $R^{207}$ each having 1 to 30 carbon atoms, and preferably 1 to 20 carbon atoms.

Two of $R^{201}$ to $R^{203}$ may be bonded to each other to form a ring structure in a molecule, and the ring structure may contain an oxygen atom, a sulfur atom, an ester bond, an amide bond, or a carbonyl group. Examples of the group formed by binding of two of $R^{201}$ to $R^{203}$ include an alkylene group such as a butylene group or a pentylene group.

$R^{204}$ and $R^{205}$ may be bonded to each other to form a ring structure in a molecule, and the ring structure may contain an oxygen atom, a sulfur atom, an ester bond, an amide bond, or a carbonyl group. Examples of the group formed by binding of $R^{204}$ and $R^{205}$ include an alkylene group such as a butylene group or a pentylene group.

$R^{206}$ and $R^{207}$ may be bonded to each other to form a ring structure in a molecule, and the ring structure may contain an oxygen atom, a sulfur atom, an ester bond, an amide bond, or a carbonyl group. Examples of the group formed by binding of $R^{206}$ and $R^{207}$ include an alkylene group such as a butylenes group or a pentylene group.

$X^-$ represents a non-nucleophilic anion, and preferable examples thereof include a sulfonic acid anion, a carboxylic acid anion, a bis(alkylsulfonyl)amide anion, a tris(alkylsulfonyl)methide anion, $BF_4^-$, $PF_6^-$, and $SbF_6^-$, preferably an organic anion having a carbon atom.

Examples of a preferable organic anion include organic anions represented by the following formulae.

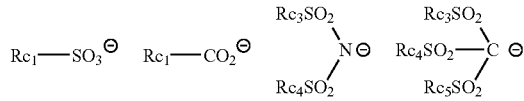

In the above formulae, $Rc_1$ represents an organic group.

Examples of the organic group of $Rc_1$ include an organic group having 1 to 30 carbon atoms, preferably include an alkyl group which may have a substituent, a cycloalkyl group which may have a substituent, an aryl group which may have a substituent, and a group in which at least two of them are connected via a linking group such as a single bond, —O—, —CO$_2$—, —S—, —SO$_3$—, —SO$_2$N(Rd$_1$)-.

$Rd_1$ represents a hydrogen atom or an alkyl group.

$Rc_3$, $Rc_4$ and $Rc_5$ each independently represent an organic group.

Examples of the organic groups of $Rc_3$, $Rc_4$ and $Rc_5$ include the same groups as those of the preferable organic group of $Rc_1$, preferably a perfluoroalkyl group having 1 to 4 carbon atoms.

$Rc_3$ and $Rc_4$ may be bonded to form a ring together with $SO_2$—N—$SO_2$ or $SO_2$—C—$SO_2$ in the above formulae.

Examples of the group formed by binding of $Rc_3$ and $Rc_4$ include an alkylene group, a cycloalkylene group, and an arylene group. Preferable is a perfluoroalkylene group having 2 to 4 carbon atoms.

The organic groups of $Rc_1$ and $Rc_3$ to $Rc_5$ are each preferably an alkyl group in which a 1-position thereof is substituted with a fluorine atom or a fluoroalkyl group, or a phenyl group in which a 1-position thereof is substituted with a fluorine atom or a fluoroalkyl group. When the organic group has a fluorine atom or a fluoroalkyl group, acidity of an acid to be generated by light irradiation is increased, and the sensitivity is improved. In addition, when $Rc_3$ and $Rc_4$ are bonded to form a ring together with $SO_2$—N—$SO_2$ or $SO_2$—C—$SO_2$, acidity of an acid to be generated by light irradiation is increased, and the sensitivity is improved.

Among them, it is preferable that at least one of aryl groups of a triarylsulfonium salt has an electron withdrawing group as a substituent, and it is more preferable that a sum of Hammett value of substituents binding to an aryl skeleton is larger than 0.18.

Herein, the electron withdrawing group means a substituent having a Hammett value (Hammett substituent constant σ) of larger than 0. In the invention, from a viewpoint of higher sensitivity, the sum of Hammett values of substituents which bind to an aryl skeleton in the photo acid generator is preferably 0.18 or more, more preferably more than 0.46, more preferably more than 0.60.

In addition, the Hammett value represents an extent of electron withdrawing property of a cation having a triarylsulfonium salt structure, and, from a viewpoint of higher sensitivity, there is not particularly an upper limit of the Hammett value. However, from viewpoints of reactivity and stability, the Hammett value is preferably in the range of more than 0.46 and less than 4.0, more preferably more than 0.50 and less than 3.5, particularly preferably more than 0.60 and less than 3.0.

As the Hammett values in the invention, numerical values described in Chemical Seminar 10 Hammett Rule—Structure and Reactivity—, edited by Naoki Inamoto (1983, published by Maruzen) are used.

Examples of the electron withdrawing group to be introduced into an aryl skeleton include a trifluoromethyl group, a halogen atom, an ester group, a sulfoxide group, a cyano group, an amido group, a carboxyl group, and a carbonyl group. Hammett values of these substituents are as follows: a trifluoromethyl group (—CF$_3$, m: 0.43, p: 0.54), a halogen atom (e.g. —F (m: 0.34, p: 0.06), —Cl (m: 0.37, p: 0.23), —Br (m: 0.39, p: 0.23), —I (m: 0.35, p: 0.18)), an ester group (e.g. —COCH$_3$, o: 0.37, p: 0.45), a sulfoxide group (e.g. —SOCH$_3$, m: 0.52, p: 0.45), a cyano group (—CN, m: 0.56, p: 0.66), an amido group (e.g. —NHCOCH$_3$, m: 0.21, p:

0.00), a carboxy group (—COOH, m: 0.37, p: 0.45), and a carbonyl group (—CHO, m: 0.36, p(0.43)). The inside of a parenthesis represents an introduction position in an aryl skeleton of the substituent, and the Hammett value thereof. For example, (m: 0.50) indicates that the Hammett value when the substituent is introduced into a meta position is 0.50.

Among these substituents, from a viewpoint of hydrophobicity, a nonionic substituent such as a halogen atom or a halogenated alkyl group is preferable, and in particular, from a viewpoint of reactivity, —Cl is preferable, and from a viewpoint of impartation of hydrophobicity, —F, —CF$_3$, —Cl, or —Br are preferable.

These substituents may each be introduced into any one of three aryl skeletons of a triarylsulfonium salt structure, or may be introduced into any 2 or more aryl skeletons. Moreover, one of the substituents may be introduced into each of the three aryl skeletons, or plural substituents may be introduced into each of the three aryl skeletons. In the invention, the sum of Hammett values of the substituents introduced into the aryl skeletons is preferably more than 0.18, and more preferably more than 0.46. The number of substituents to be introduced is arbitrary. For example, only one substituent having a particularly large Hammett value (e.g. Hammett value of the substituent alone is more than 0.46) may be introduced into one position of the aryl skeletons of a triarylsulfonium salt structure. Alternatively, for example, plural substituents may be introduced, the sum of Hammett values thereof being more than 0.46.

As described above, since the Hammett values of the substituents vary depending on the introduction position thereof, the sum of Hammett values in the photo acid generator to be used in the invention is determined by the kind of the substituent, the introduction position thereof, and the number of introduced substituents.

In addition, while the Hammett value is usually represented at the m-position and p-position, in the invention, as an index of electron withdrawing property, the substituent effect at the o-position is calculated at the same value as that of the p-position. As a preferable substituent position, from the viewpoint of synthesis, the m-position and the p-position are preferable, and the p-position is most preferable.

In the invention, a sulfonium salt in which at least three groups thereof are each substituted by a halogen atom is preferable, and a sulfonium salt in which at least three groups thereof are each substituted by a chloro group is most preferable. Specifically, a salt having a triarylsulfonium salt structure in which a halogen atom, most preferably —Cl, is introduced into each of three aryl skeletons thereof is preferable, and a salt in which the p-position thereof is substituted with —Cl is more preferable.

Examples of the sulfonic acid anion possessed by the triarylsulfonium salt contained in the photosensitive resin composition of the invention include an arylsulfonic acid anion and an alkanesulfonic acid anion, and an anion substituted by a fluorine atom or an organic group having a fluorine atom is preferable.

A compound having the triarylsulfonium salt structure may be easily synthesized, for example, by the method described in J. Am. Chem. Soc. Vol. 112 (16), 1990; pp. 6004-6015, J. Org. Chem. 1988; pp. 5571-5573, WO 02/081439 A1, or European Patent No. 1113005.

Specific examples thereof will be shown below, but not limited thereto.

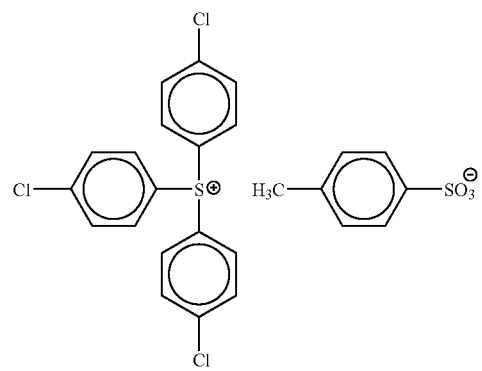

PAG-1

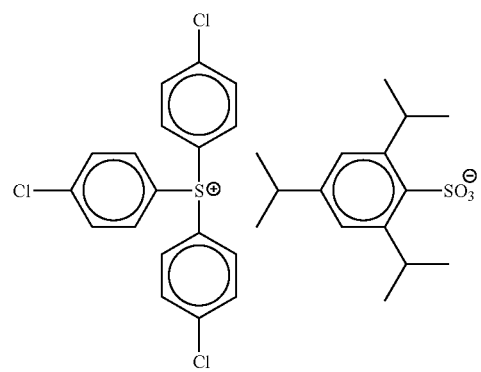

PAG-2

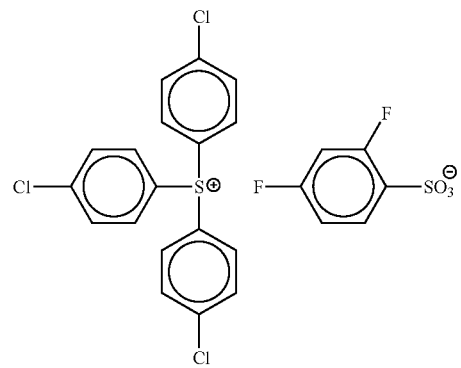

PAG-3

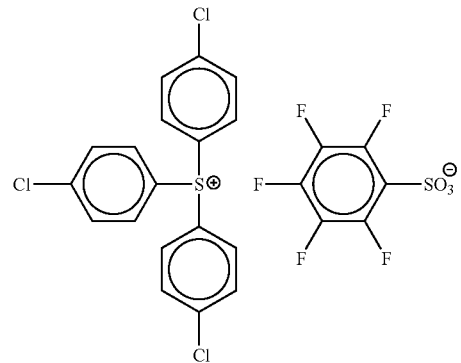

PAG-4

PAG-5
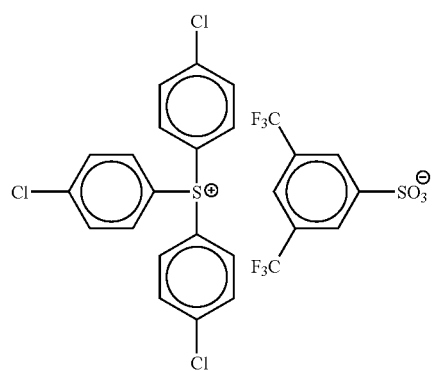
PAG-9
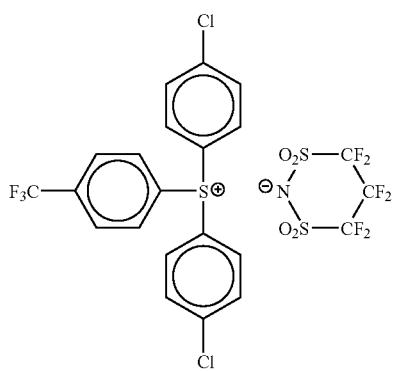
PAG-6
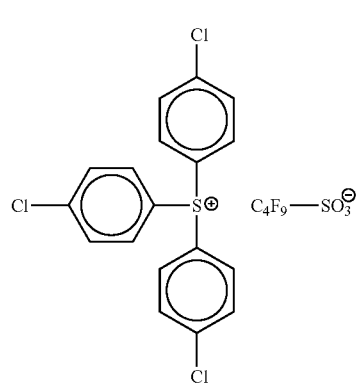
PAG-10
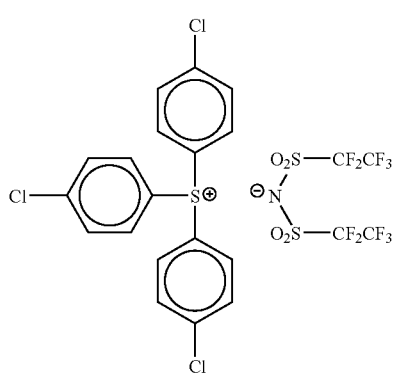
PAG-7
PAG-11
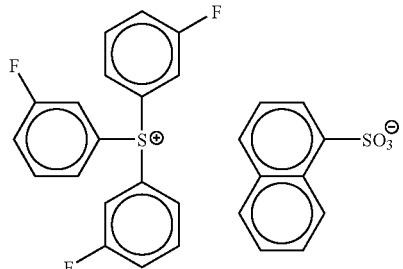
PAG-8
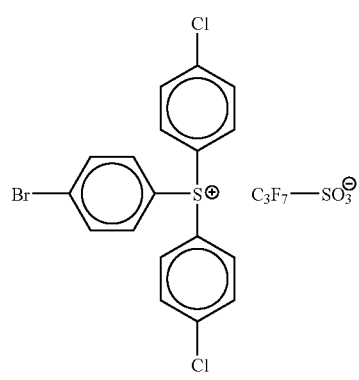
PAG-12
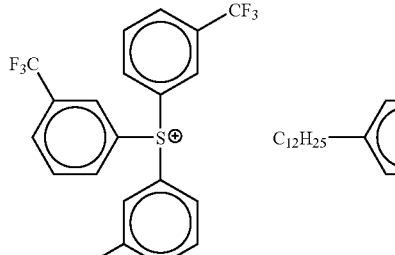

-continued

PAG-13

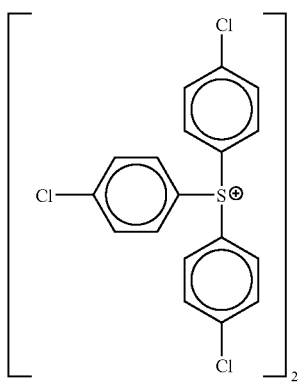 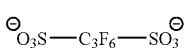

PAG-14

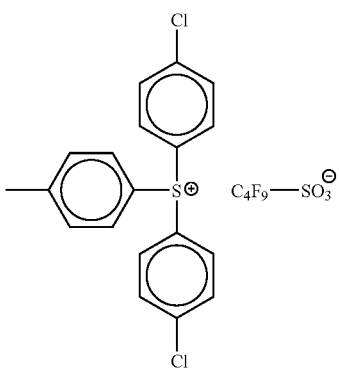 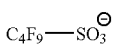

PAG-15

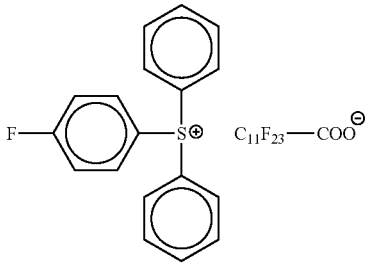 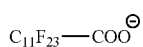

PAG-16

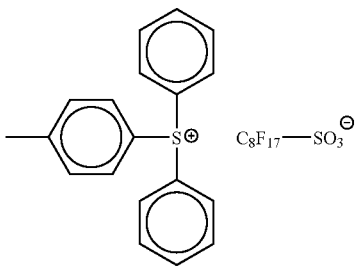 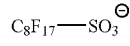

Among the compound which generates an acid by irradiation with active light ray or radiation, a compound (photo acid generator) is preferable which generates a strong acid having a pKa of 2 or less, such as a sulfonic acid, an alkylcarboxylic or arylcarboxylic acid substituted with an electron withdrawing group, or a disulfonylimide substituted with an electron withdrawing group. Examples of the electron withdrawing group include a halogen atom such as a fluorine (F) atom, a haloalkyl group such as a trifluoromethyl group, a nitro group, and a cyano group.

Examples of the photo acid generator include an N-hydroxyimido sulfonate compound and an oxime sulfonate.

Examples of the imidosulfonate compound preferable as the photo acid generator include a compound of the following formula.

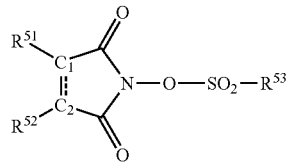

(PA-5)

In the formula, $C_1$ (carbon atom) and $C_2$ (carbon atom) are connected via a single bond or a double bond, and $R^{51}$ and $R^{52}$ may be the same as or different from each other and each represent any of the following items (1) to (4). That is, $R^{51}$ and $R^{52}$ (1) each independently represent a hydrogen atom, an alkyl group, a cycloalkyl group, or an aryl group, (2) form a monocycle or a polycycle together with $C_1$ or $C_2$, the monocycle or polycycle optionally containing one hetero atom or plural hetero atoms, (3) form a condensed aromatic ring including $C_1$ and $C_2$, or (4) represent a residue containing N-sulfonyloxyimide.

$R^{53}$ represents an alkyl group, a halogenated alkyl group, a cyclic alkyl group, an alkenyl group, an aryl group which may have a substituent, an aralkyl group which may have a substituent, or a camphor group.

When $R^{51}$ and $R^{52}$ in Formula (PA-5) satisfy the case of item (1), examples of the alkyl group include an alkyl group having 1 to 4 carbon atoms, such as a methyl group, an ethyl group, a propyl group, an isopropyl group, a n-butyl group, a sec-butyl group, or a tert-butyl group; examples of the cycloalkyl group include a cycloalkyl group having 3 to 8 carbon atoms, such as a cycloproply group, a cyclopentyl group, a cyclohexyl group, or a cyclooctyl group; and examples of the aryl group include an aryl group having 6 to 14 carbon atoms, such as a phenyl group, a tolyl group, a xylyl group, a mesityl group, or a naphthyl group.

When $R^{51}$ and $R^{52}$ satisfy the case of item (2), examples thereof include the following partial structures.

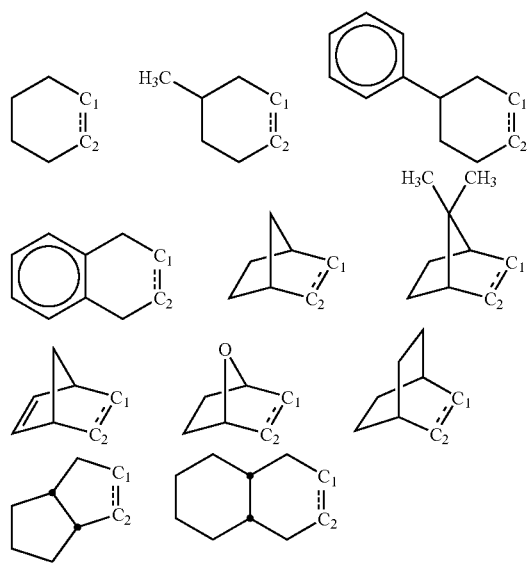

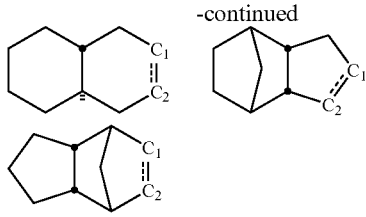

When $R^{51}$ and $R^{52}$ satisfy the case of item (3), examples thereof include the following partial structures.

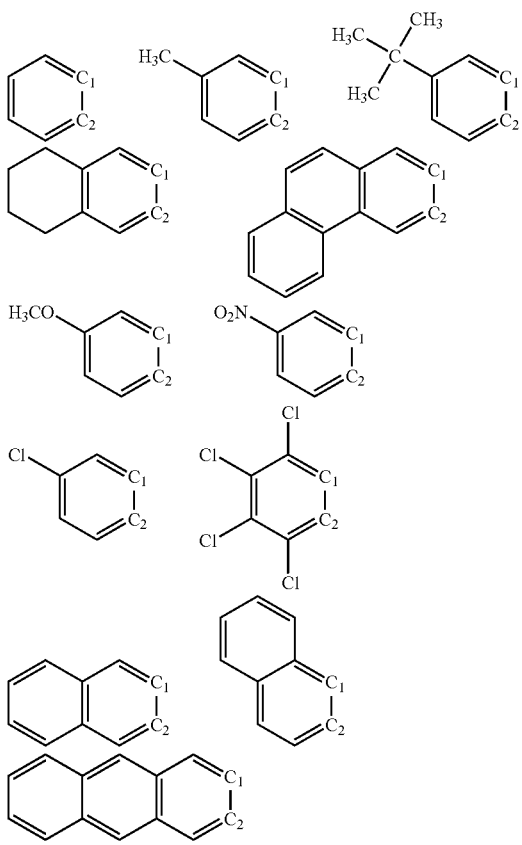

When $R^{51}$ and $R^{52}$ satisfy the case of item (4), examples thereof include a structure in which so-called at least two n-sulfonyloxyimide residues are bonded via a single bond or via the following divalent organic group at portions of $R^{51}$ and $R^{52}$ having a partial structure of any of the above items (1) to (3), provided that any one of the following linking groups may be used alone, or two or more of them may be used in combination.

Divalent organic groups: —O—, —S—, —SO—, —SO$_2$—, —NH—, —CO—, —CO$_2$—, —NHSO$_2$—, —NHCO—, —NHCO$_2$—

Examples of the alkyl group of $R^{53}$ include a straight-chain or branched alkyl group having 1 to 20 carbon atoms, preferably a straight-chain or branched alkyl group having 1 to 16 carbon atoms, the alkyl group more preferably having 1 to 12 carbon atoms. An alkyl group having 21 or more carbon atoms is not preferable since sensitivity and resolution are deteriorated. Examples of the halogenated alkyl group include alkyl groups in which one or two or more hydrogen atoms of the aforementioned alkyl group are halogenated. Examples of a halogen atom that substitutes the aforementioned alkyl group include a fluorine atom, a chlorine atom, a bromine atom, and an iodine atom, preferably a fluorine atom, a chlorine atom, and a bromine atom, and particularly preferably a fluorine atom, provided that different kinds of the halogen atoms may substitute the aforementioned alkyl group per one molecule. Examples of the cyclic alkyl group include a cycloalkyl group having 3 to 12 carbon atoms, such as a cyclopropyl group, a cyclopentyl group, a cyclohexyl group and a cyclooctyl group, and a polycyclic substituent such as a norbornyl group, an adamantyl group, and a tricyclodecanyl group. Examples of the alkenyl group include a straight-chain or branched alkenyl group having 1 to 20 carbon atoms, preferably a straight-chain or branched alkenyl group having 1 to 16-carbon atoms, the alkenyl group more preferably having 1 to 12-carbon atoms. An alkenyl group having 21 or less carbon atoms is not preferable since sensitivity and resolution are deteriorated.

Examples of the aryl group of $R^{53}$ include a phenyl group and a naphthyl group, and examples of the aralkyl group of $R^{53}$ include a benzyl group. Examples of a substituent for the aryl group or the aralkyl group include a lower alkyl group such as a methyl group, an ethyl group, a propyl group, an isopropyl group, or a tert-butyl group, a cycloalkyl group such as a cyclopentyl group or a cyclohexyl group, an aryl group such as a phenyl group, a toluoyl group, a xylyl group, or a mesityl group, a lower alkoxy group such as a methoxy group, an ethoxy group, a propoxy group, an isopropoxy group, a sec-butoxy group, or a tert-butoxy group, an alkenyl group such as a vinyl group, an allyl group, a propenyl group, or a butenyl group, an acyl group such as a formyl group or an acetyl group, a hydroxy group, a carboxy group, a cyano group, a nitro group, and a halogen atom such as a fluorine atom, a chlorine atom, a bromine atom, or an iodine atom. Preferable are a lower alkyl group such as a methyl group, an ethyl group, a propyl group, an isopropyl group, or a tert-butyl group, a cyclohexyl group, a phenyl group, a toluoyl group, a lower alkoxy group such as a methoxy group, an ethoxy group, a propoxy group, an isopropoxy group, a sec-butoxy group, or a tert-butoxy group, a cyano group, a nitro group, and a halogen atom such as a fluorine atom, a chlorine atom, a bromine atom, or an iodine atom. The aryl group or the aralkyl group may have two or more different substituents.

Specific examples of the compound represented by Formula (PA-5) are shown below, but not limited thereto.

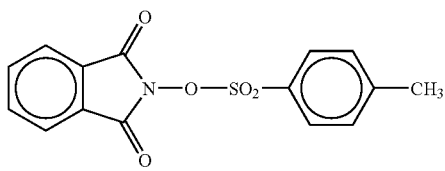
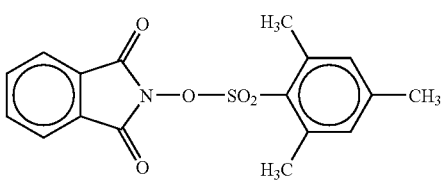

33
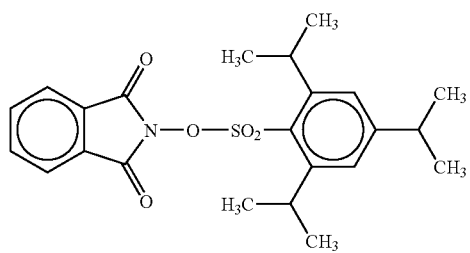
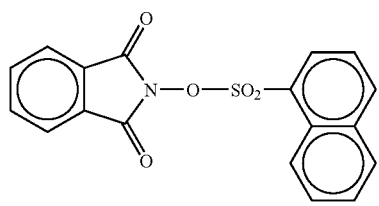
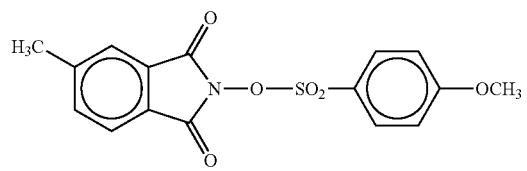
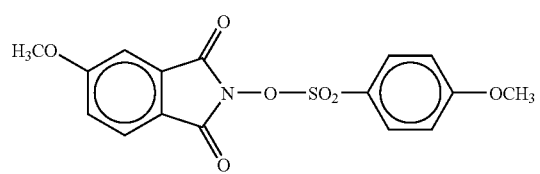
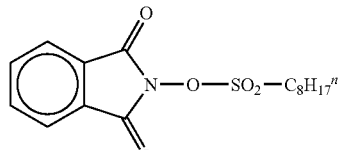
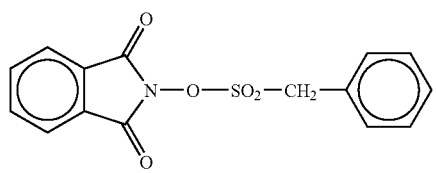
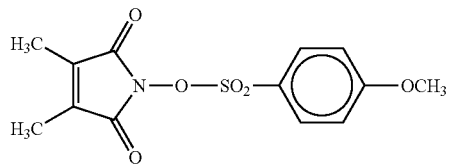
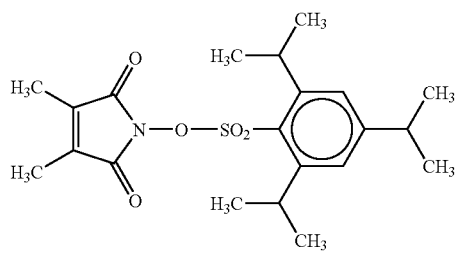
34
-continued
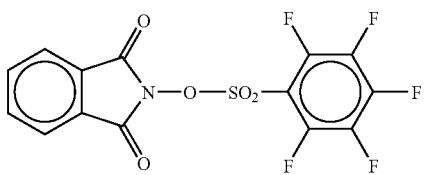
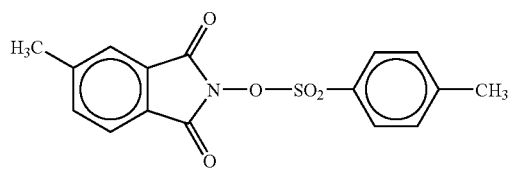
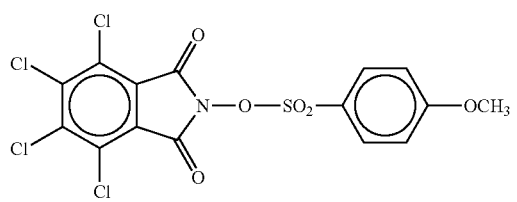
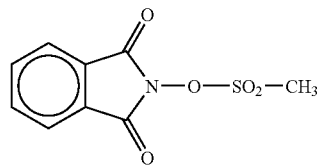
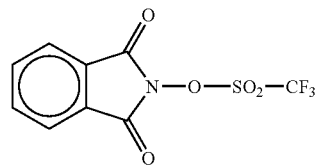
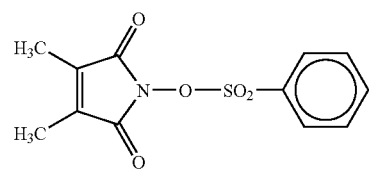
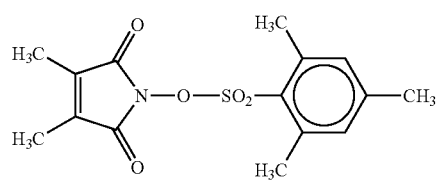
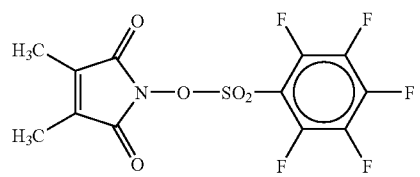

-continued
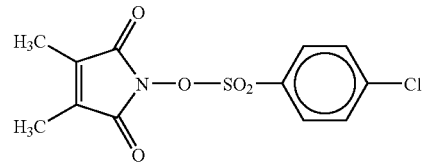
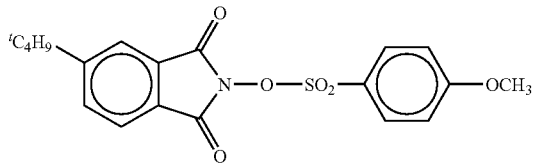
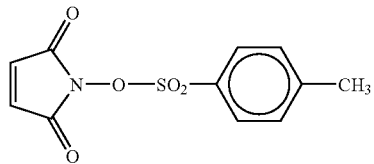
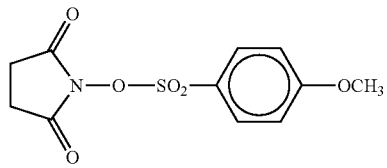
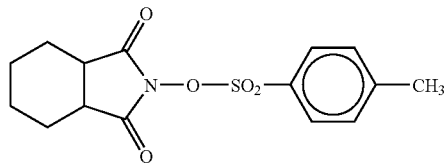
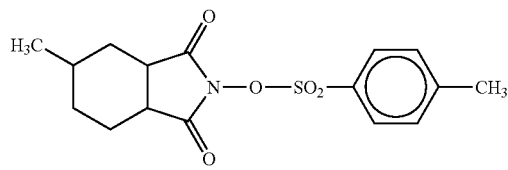
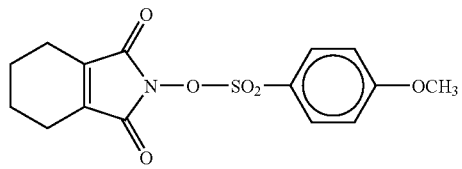
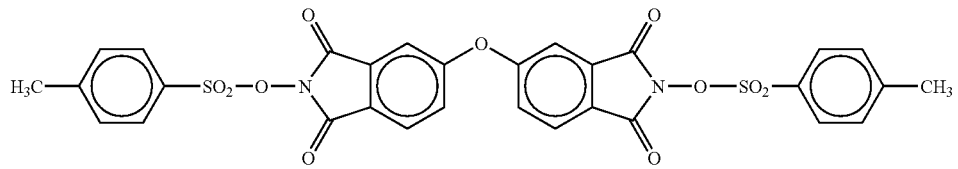
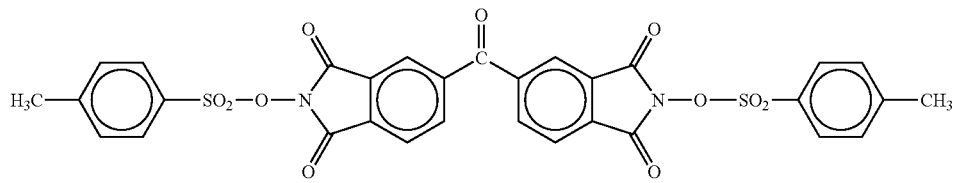
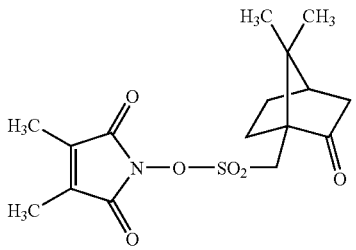
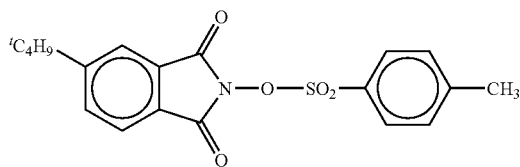
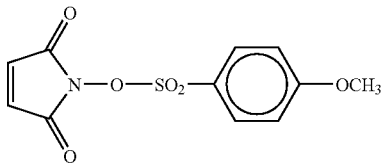
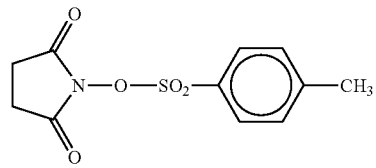
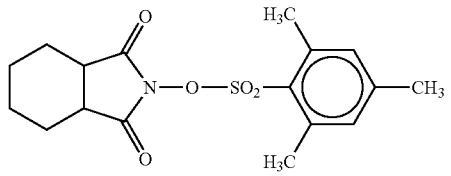
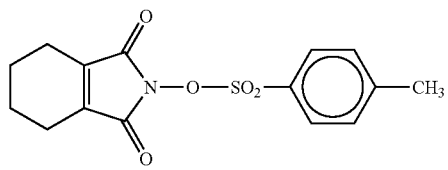
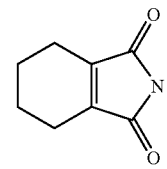
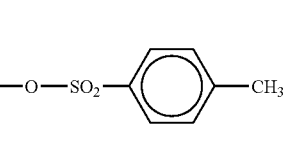
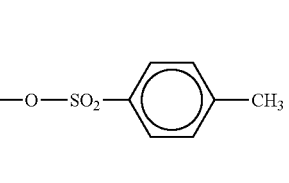

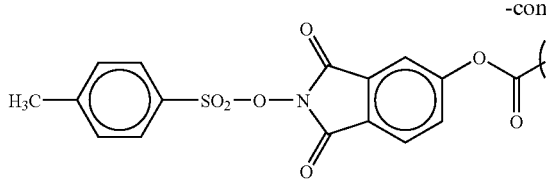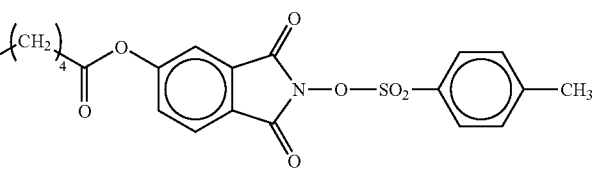

Examples of the oxime sulfonate compound preferable as the photo acid generator include a compound of the following Formula (PA-6).

In Formula (PA-6), $R^{61}$ and $R^{62}$ each independently represent an alkyl group which has 1 to 16 carbon atoms and may have a substituent, an alkenyl group, an alkynyl group, a cycloalkyl group, a cycloalkenyl group, an aryl group which may have a substituent, a heteroaryl group, or a cyano group. In addition, $R^{61}$ and $R^{62}$ may be bonded to $R^{61}$ and $R^{62}$ of another compound represented by Formula (PA-6), respectively, via an alkylene chain which has 2 to 8 carbon atoms and may have a substituent, an alkenylene chain, an alkynylene chain, or a linking chain containing phenylene which may have a substituent, furylene, thienylene, —O—, —S—, —N—, or —CO—.

$R^{63}$ represents an alkyl group which has 1 to 16 carbon atoms and may have a substituent, a cycloalkyl group, or an aryl group which may have a substituent.

Examples of the alkyl group having 1 to 16 carbon atoms of $R^{61}$ to $R^{63}$ include an alkyl group such as a methyl group, an ethyl group, a propyl group, an i-propyl group, a butyl group, an i-butyl group, a t-butyl group, a t-amyl group, a n-hexyl group, a n-octyl group, an i-octyl group, a n-decyl group, an undecyl group, a dodecyl group, or a hexadecyl group, a trifluoromethyl group, a perfluoropropyl group, a perfluorobutyl group, a perfluoro-t-butyl group, a perfluorooctyl group, a perfluoroundecyl group, and a 1,1-bistrifluoromethylethyl group.

Examples of the alkenyl group of $R^{61}$ and $R^{62}$ include an ally group, a methallyl group, a vinyl group, a methylallyl group, a 1-butenyl group, a 3-butenyl group, a 2-butenyl group, a 1,3-pentadienyl group, a 5-hexenyl group, a 2-oxo-3-pentenyl group, a decapentaenyl group, and a 7-octenyl group.

Examples of the alkynyl group of $R^{61}$ and $R^{62}$ include an ethynyl group, a propargyl group, a 2-butynyl group, a 4-hexynyl group, a 2-octynyl group, a phenylethynyl group, and a cyclohexylethynyl group.

Examples of the cycloalkyl group of $R^{61}$ to $R^{63}$ include a cycloalkyl having 3 to 8 carbon atoms, such as a cyclopropyl group, a cyclopentyl group, and a cyclohexyl group, each of which may have a substituent.

Examples of the cycloalkenyl group of $R^{61}$ and $R^{62}$ include a cyclobutenyl group, a cyclohexenyl group, a cyclopentadienyl group, and a bicyclo[4.2.4]dodeca-3,7-dien-5-yl group.

Examples of the aryl group of $R^{61}$ to $R^{63}$ include an aryl group having 6 to 14 carbon atoms, such as a phenyl group, a tolyl group, a methoxyphenyl group, and a naphthyl group, each of which may have a substituent.

Examples of the substituent include an alkyl group, a cycloalkyl group, an alkoxy group, a halogen atom (e.g. fluorine atom, chlorine atom, iodine atom), a cyano group, a hydroxyl group, a carboxy group, a nitro group, an aryloxy group, an alkylthio group, an aralkyl group, and a group represented by the following Formula (IA).

Herein, the alkyl group and the cycloalkyl group have the same meanings as those described above. Examples of the alkoxy group include an alkoxy group having 1 to 4 carbon atoms, such as a methoxy group, an ethoxy group, a hydroxyethoxy group, a propoxy group, a n-butoxy group, an isobutoxy group, a sec-butoxy group, or a t-butoxy group. Examples of the aralkyl group include a benzyl group, a naphthylmethyl group, a furyl group, and a thienyl group.

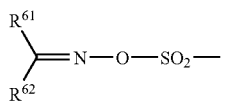

In Formula (IA), $R^{61}$ and $R^{62}$ have the same meanings as those of $R^{61}$ and $R^{62}$ in Formula (PA-6).

Specific examples of the compound represented by Formula (PA-6) are shown below, but the invention is not limited to them.

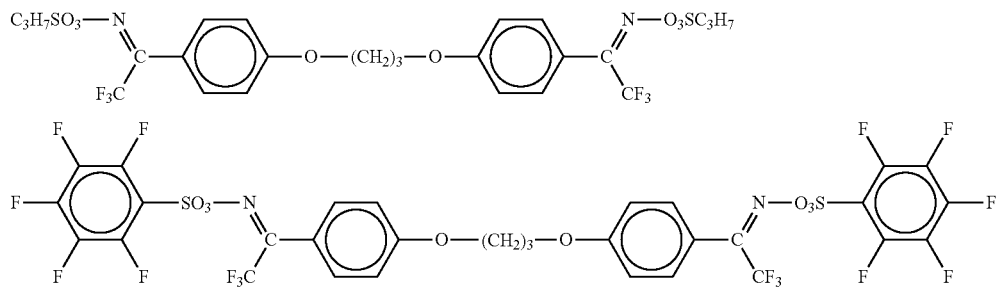

-continued
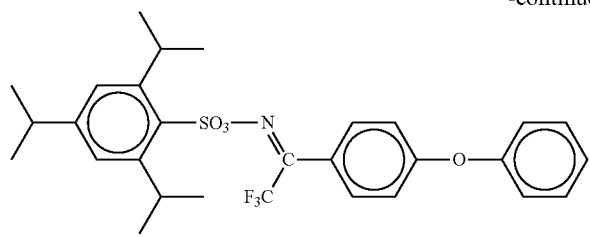
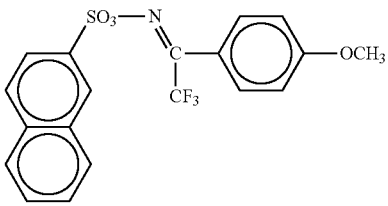
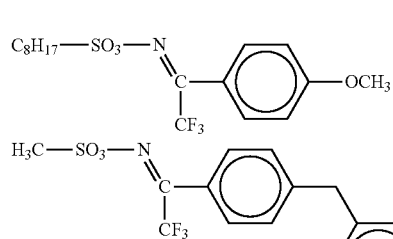
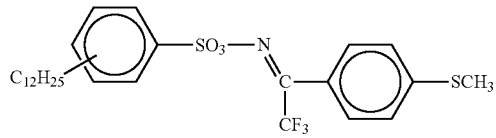
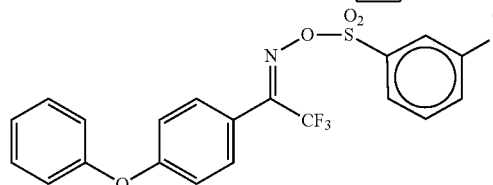
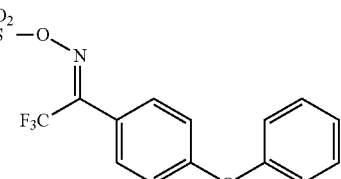
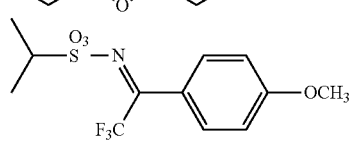
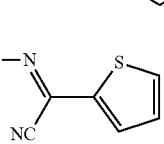
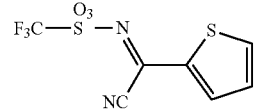
Specific examples of a more preferable oxime sulfonate compound include the following compounds (z66) to (z70).
(z66)
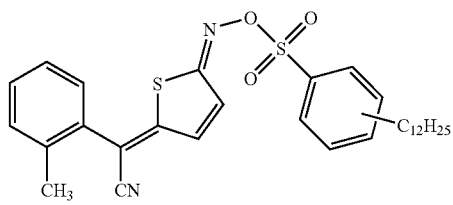
(z67)
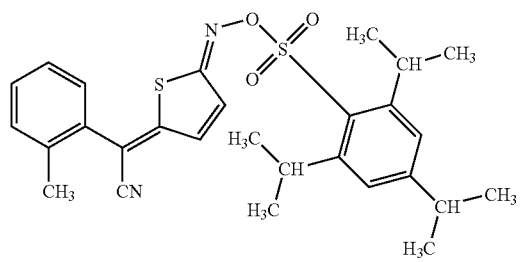
-continued
(z68)
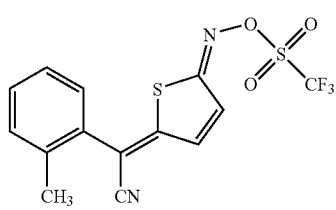
(z69)
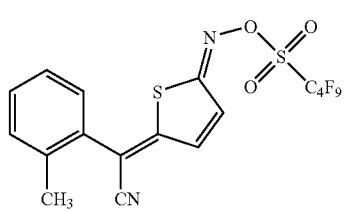
(z70)

An example of the formula of nitrobenzyl sulfonate preferable as the photo acid generator is a compound represented by Formula (TA-9).

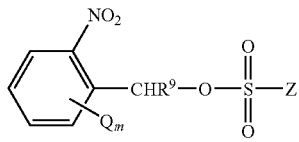

In the formula, Z is selected from an alkyl group having 1 to 30 carbon atoms, an aryl group, an alkylaryl group, a halogen-substituted alkyl group having 1 to 30 carbon atoms, a halogen-substituted aryl group, a halogen-substituted alkylaryl group, a nitro-substituted aryl group having 6 to 30 carbon atoms, a nitro-substituted alkylaryl group, an aryl group which has 6 to 30 carbon atoms and has a nitro substituent and a halogen substituent, an alkylaryl group having a nitro substituent and a halogen substituent, and a group having the formula $C_6H_4SO_3CHR'C_6H_{4-m}Q_m(NO)_2$ (R' represents a hydrogen atom, an alkyl group having 1 to 4 carbon atoms, or an acyl group having 1 to 4 carbon atoms); $R^9$ is selected from a hydrogen atom, a methyl group, and a nitro-substituted aryl group having 6 to 3 carbon atoms; each Q is independently selected from a hydrocarbon group having 1 to 30 carbon atoms, a hydrocarbonoxy group, $NO_2$, a halogen atom, and an organic silicon group; and m is 0, 1 or 2, provided that Q is not an acidic group. In addition, $R^9$ represents a hydrogen atom, an alkyl group having 1 to 4 carbon atoms, or an acyl group having 1 to 4 carbon atoms.

Examples of the compound represented by Formula (TA-9) include the following compounds.

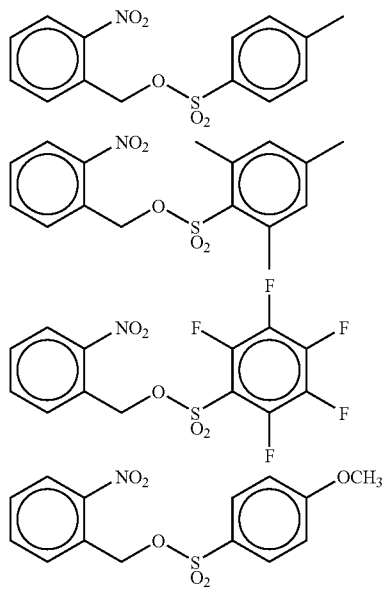

In the photosensitive resin composition according to an exemplary embodiment of the invention, the amount of the photo acid generator (B1) to be incorporated is preferably from 0.5 to 30 parts by mass, more preferably 2 to 20 parts by mass, with respect to 100 parts by mass (total amount) of (A) polymer compound.

The photo acid generator (B1) may be used alone, or two or more thereof may be used in combination.

(B2) Quinonediazide Photosensitizing Agent

An o-quinonediazide photosensitizing agent as the (B2) quinonediazide photosensitizing agent is obtained, for example, by condensation reaction of o-quinonediazidesulfonyl chlorides and a hydroxy compound or an amino compound in the presence of a hydrogen chloride-removing agent.

Examples of the o-quinonediazidesulfonyl chlorides include benzoquinone-1,2-diazido-4-sulfonyl chloride, naphthoquinone-1,2-diazido-5-sulfonyl chloride, and naphthoquinone-1,2-diazido-4-sulfonyl chloride. From a viewpoint of sensitivity, naphthoquinone-1,2-diazido-4-sulfonyl chloride is preferable.

Examples of the hydroxy compound include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, and tris(4-hydroxyphenyl)methane, tris(4-hydroxyphenyl)ethane.

Examples of the amino compound include p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

It is preferable that the o-quinonediazidesulfonyl chloride and the hydroxy compound and/or the amino compound are incorporated so that the total of the hydroxy group and the amino group becomes 0.5 to 1 equivalent with respect to 1 mole of o-quinonediazidesulfonyl chloride. The preferable ratio of the hydrogen chloride-removing agent and o-quinonediazidesulfonyl chloride (hydrogen chloride-removing agent/o-quinonediazidesulfonyl chloride) is in the range of from 1/1 to 1/0.9. A preferable reaction temperature is from 0 to 40° C., and a preferable reaction time is from 1 to 24 hours.

Examples of a reaction solvent to be used include a solvent such as dioxane, 1,3-dioxolane, acetone, methyl ethyl ketone, tetrahydrofuran, chloroform, N-methylpyrrolidone, or γ-butyrolactone. Examples of the hydrogen chloride-removing agent include sodium carbonate, sodium hydroxide, sodium hydrogen carbonate, potassium carbonate, potassium hydroxide, trimethylamine, triethylamine, pyridine, and 4-dimethylaminopyridine.

In the photosensitive resin composition according to an exemplary embodiment of the invention, the amount of the (B2) quinonediazide photosensitizing agent to be incorporated is preferably from 1 to 25 parts by mass, more preferably from 5 to 20 parts by mass, with respect to 100 parts by mass (total amount) of the (A) polymer compound, from the viewpoints of difference in dissolution rate between an exposed portion and an unexposed portion and the range of acceptable sensitivity.

Two or more kinds of (B2) quinonediazide photosensitizing agent may be used in combination. The (B1) photo acid generator and the (B2) quinonediazide photosensitizing agent may be used in combination.
Examples of the quinonediazide photosensitizing agent include compounds having the following structures.
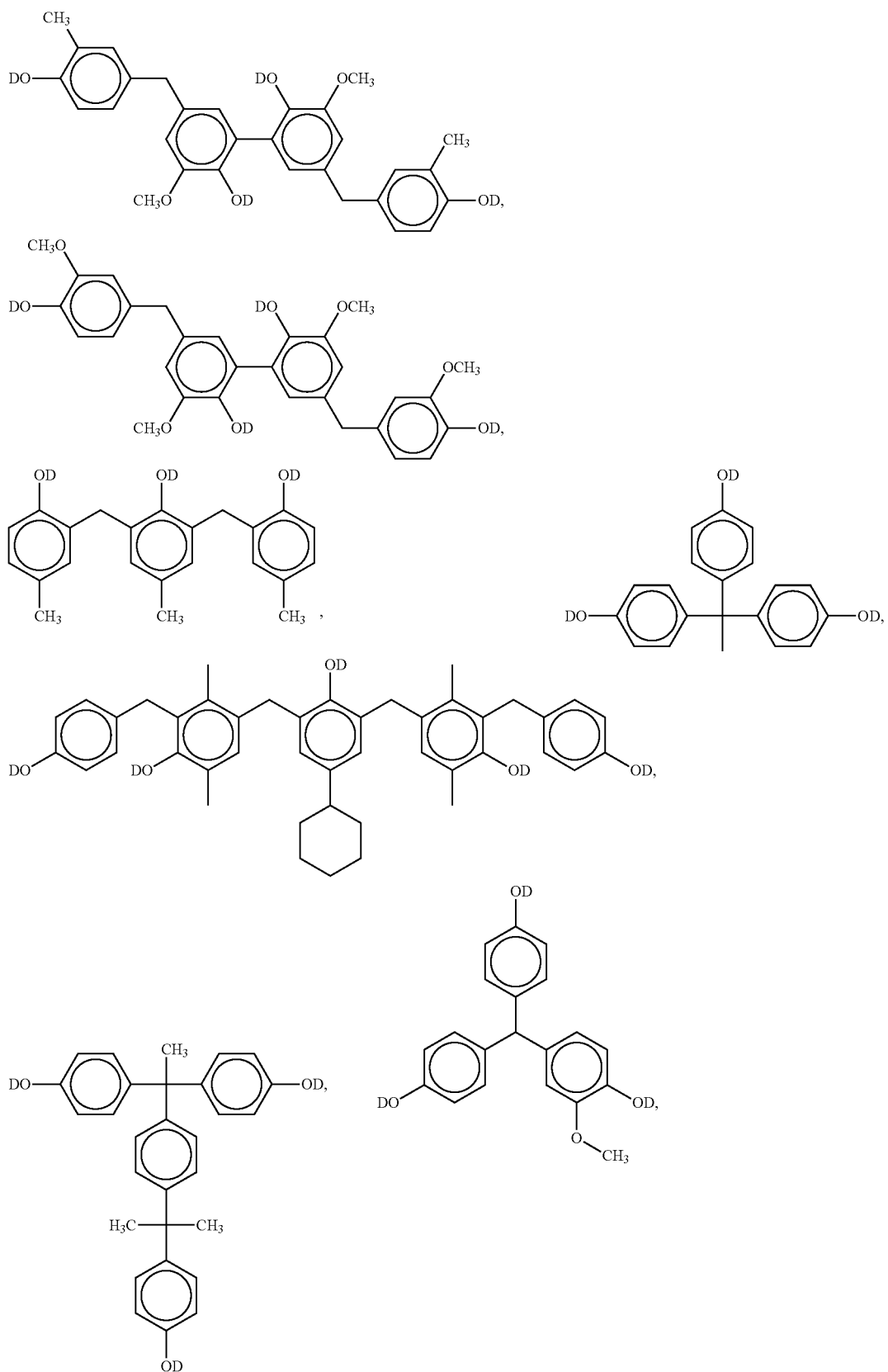

-continued
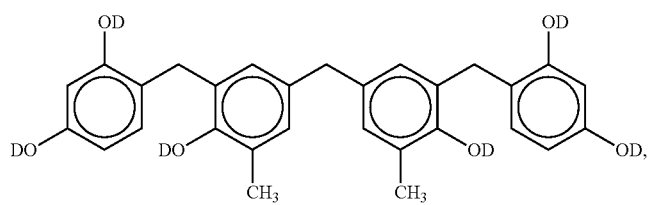
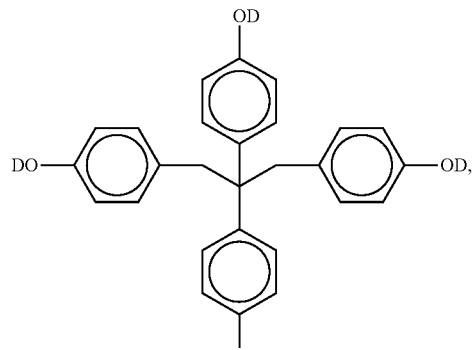
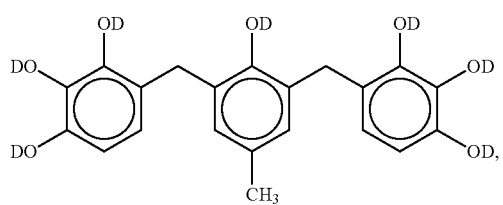
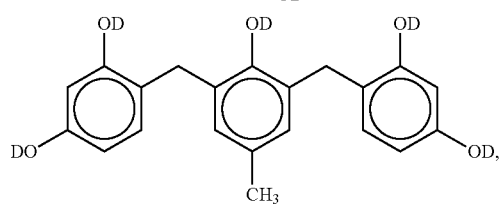
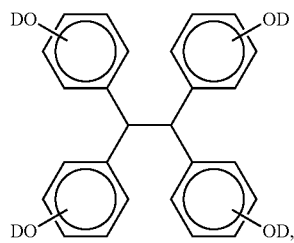
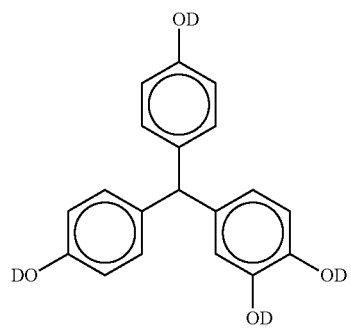
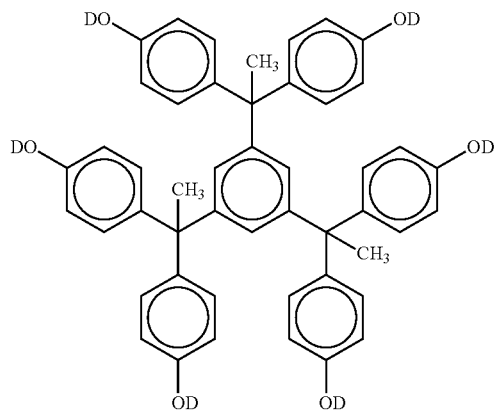
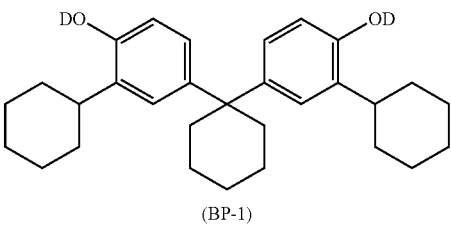
(BP-1)
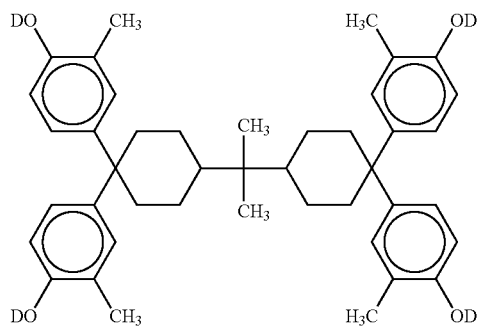
(BP-2)

In the formulae, Ds each independently represent H or any of the following groups.

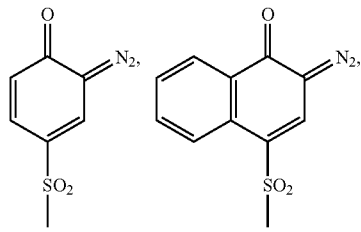

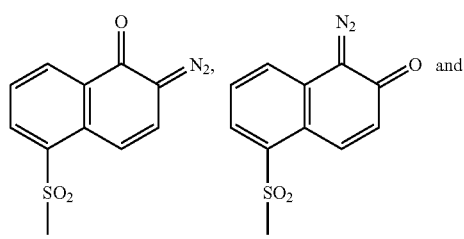

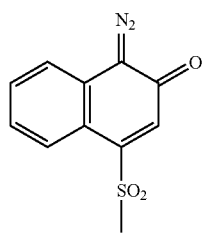

In each of the compounds, at least one D may be the quinonediazide group.

Sensitizer

In the photosensitive resin composition according to an exemplary embodiment of the invention, it is preferable that, in combination with the sulfonium salt, a sensitizer is added in order to promote degradation of the sulfonium salt. The sensitizer absorbs active light rays or radiation is thus changed to an electron excited state. The sensitizer in the electron excited state contacts the sulfonium, whereby an action such as electron transfer, energy transfer, or heat generation occurs. Accordingly, the polymerization initiator causes a chemical change and is degraded, generating a radical, an acid or a base.

Examples of a preferable sensitizer include compounds which belong to the following groups of compounds, and have an adsorption wavelength in the region of from 305 nm to 450 nm: polynuclear aromatic compounds (e.g., pyrene, perylene, triphenylene, anthracene), xanthenes (e.g., fluorescein, eosin, erythrosine, rhodamine B, rose bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., acridine orange, chloroflavin, acriflavin), anthraquinones (e.g., anthraquinone), squaryliums (e.g., squarylium) and coumarines (e.g., 7-diethylamino-4-methylcoumarine). Among these, as the sensitizer, an anthracene derivative is particularly preferable.

Preferable specific examples of the sensitizer include the following compounds (C-1) to (C-26), but not limited thereto.

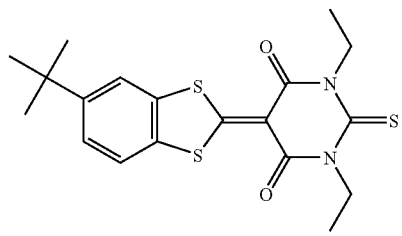 (C-1)

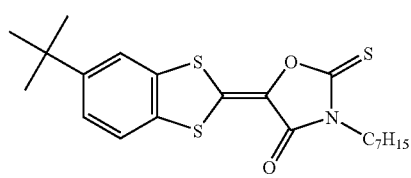 (C-2)

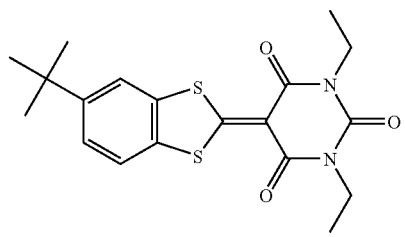 (C-3)

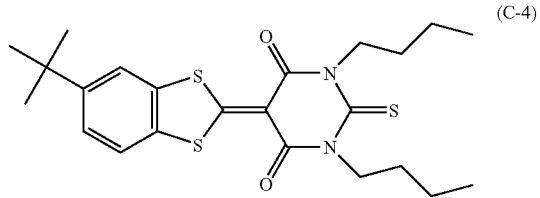 (C-4)

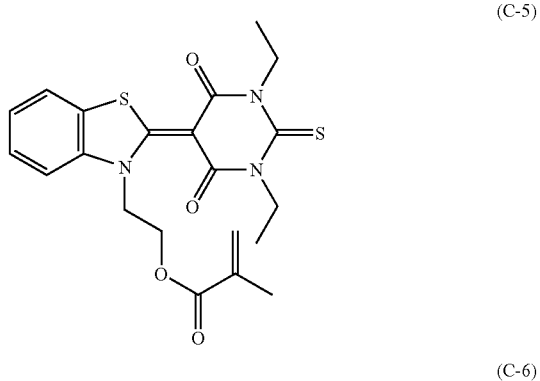 (C-5)

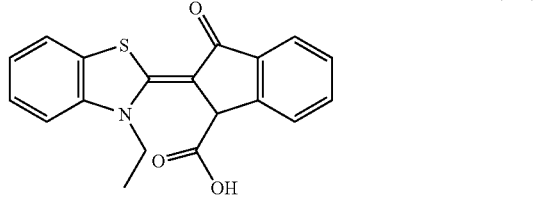 (C-6)

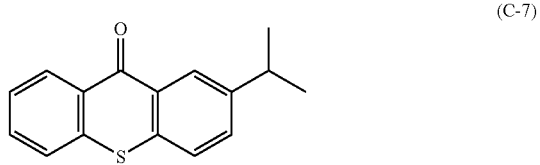 (C-7)

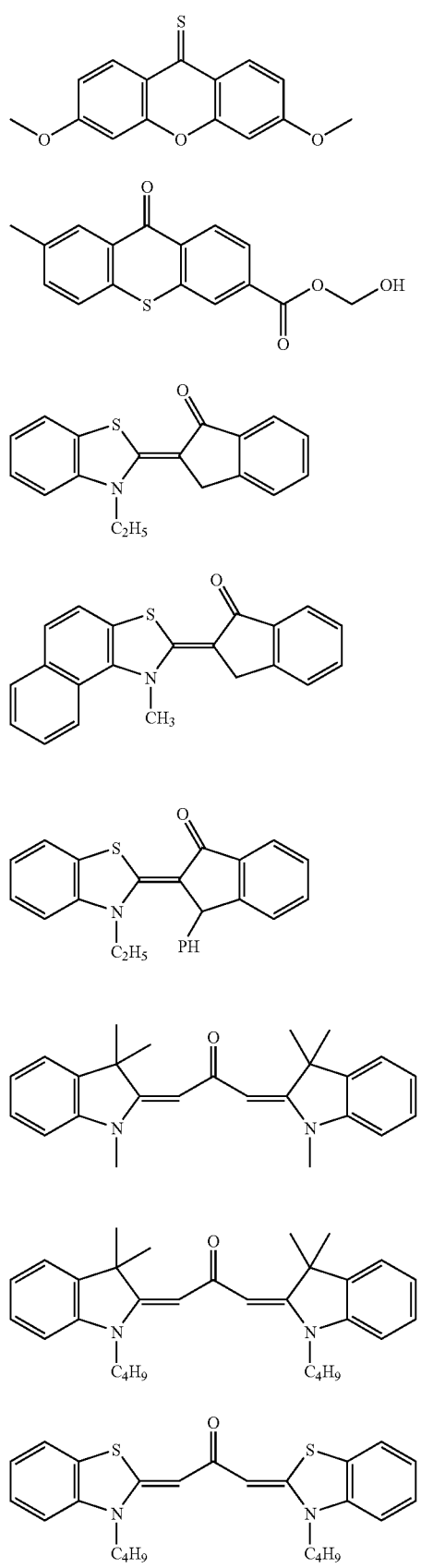
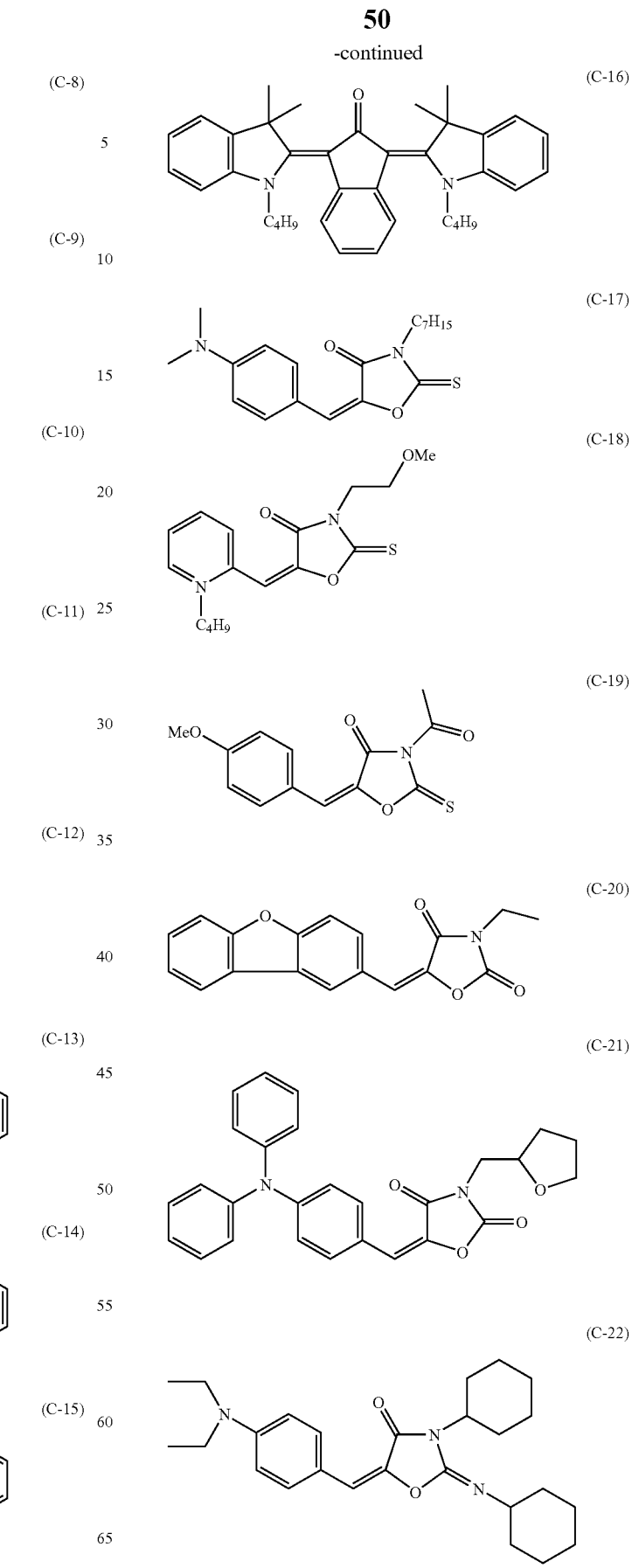

-continued

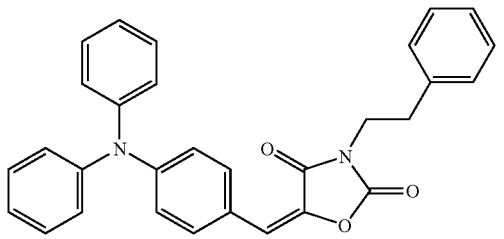
(C-23)

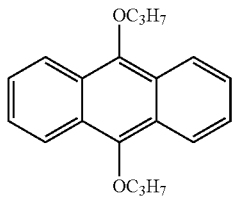
(C-24)

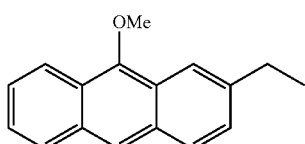
(C-25)

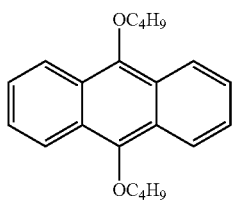
(C-26)

As the aforementioned sensitizer, a commercially available sensitizer may be used, or a sensitizer may be synthesized by a known synthesizing method.

The amount of the sensitizer to be added is preferably from 20 to 200 parts by mass, more preferably from 30 to 150 parts by mass, with respect to 100 parts by mass of the sensitizer.

(C) Crosslinking Agent

In the invention, it is preferable to use a (C) crosslinking agent as a modifier.

Herein, the (C) crosslinking agent is a material which crosslinks with a polymer by an acid, and examples thereof include a melamine compound substituted by at least one group selected from a methylol group, an alkoxymethyl group, and an acyloxymethyl group, a guanamine compound, a glycoluril compound, a urea compound, a phenol compound or an ether compound of phenol, an epoxy compound, an oxetane compound, a thioepoxy compound, an isocyanate compound, an azide compound, or a compound containing a double bond such as an alkenyl ether group. From the viewpoints of film physical property and heat resistance, a methylol crosslinking agent, a melamine cross linking agent, or a glycoluril crosslinking agent is preferably used.

In addition, (C1) a compound containing an alkoxymethyl group or an acyloxymethyl group, (C2) a compound containing a methacryloyl group or an acryloyl group, and (C3) an epoxy compound or an oxetane compound shown below are preferable.

(C1) Compound containing Alkoxymethyl Group or Acyloxymethyl Group

To a photosensitive resin composition according to an exemplary embodiment of the invention, a compound containing an alkoxymethyl group or an acyloxymethyl group may be added. It is known that this compound prevents melting or heat shrinkage of a pattern at curing without deteriorating lithography performance. In addition, it is known that when the compound is applied to a low temperature curing process, chemical resistance may be improved.

An alkoxymethyl group or an acyloxymethyl group possessed by the compound preferably has 2 to 5 carbon atoms, and more preferably 2 or 3 carbon atoms. An alkoxymethyl group having 2 carbon atoms is particularly preferable, and an acryloxymethyl group having 3 carbon atoms is particularly preferable.

The total number of the alkoxymethyl group and the acyloxymethyl group possessed by the compound is preferably from 1 to 10, more preferably from 2 to 8, and particularly preferably from 3 to 6.

The molecular weight of the compound is preferably 1500 or less, and more preferably from 180 to 1200.

Examples of the compound containing an alkoxymethyl group or an acyloxymethyl group include (CL-1) a compound in which an alkoxymethyl group or an acyloxymethyl group is directly bonded to a phenol derivative, (CL-2) a compound in which an alkoxymethyl group or an acyloxymethyl group is bonded to a nitrogen atom, and (CL-3) a compound in which an alkoxymethyl group or an acyloxymethyl group is bonded to an aromatic carbon atom of a triazine derivative (melamine compound).

Examples of the (CL-1) compound include a compound of the following formula.

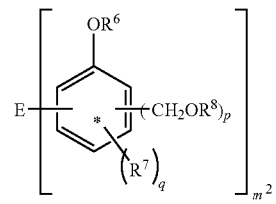

In the formula, $R^8$ represents an alkyl group having 1 to 4 carbon atoms or an acyl group having 1 to 4 carbon atoms; and $R^6$ represents a hydrogen atom, an alkyl group, an alkenyl group, an aryl group, an aralkyl group, or a group which is degraded by the action of an acid to produce an alkali-soluble group.

Each $R^7$ independently represents an alkyl group, a cycloalkyl group, or an alkenyl group, and E represents an $m^2$-valent linking group. Examples of the linking group include an alkylene group (e.g., methylene, ethylene, or propylene), a cycloalkylene group (e.g., cyclohexylene or cyclopentylene), an arylene group (e.g., 1,2-phenylene, 1,3-phenylene, 1,4-phenylene, or naphthylene), an ether group, a carbonyl group, an ester group, an amido group, and an $m^2$-valent group in which ($m^2-2$) given hydrogen atoms are removed from a divalent group obtained by combining these groups. When E is monovalent, examples thereof include a hydrogen atom and an alkyl group or an aryl group which are monovalent groups corresponding to the aforementioned divalent groups.

p is 1 or 2, q is an integer of 0 to 2, and $m^2$ is an integer of 1 to 8 and preferably an integer of 2 to 6.

The group as $R^6$ which is degraded by an acid to produce an alkali-soluble group is a group which is degraded by the action of an acid to produce an alkali-soluble group such as a hydroxyl group or a carboxyl group. Examples thereof include a group which is eliminated by the action of an acid and —C(R$^4$)$_2$—COOR$^5$ (in which R$^4$ represents a hydrogen atom or an alkyl group having 1 to 4 carbon atoms, and R$^5$ represents a group which is eliminated by the action of an acid).

When $R^6$, as the group which is degraded by the action of an acid to produce an alkali-soluble group, is a group which is eliminated by the action of an acid, $R^6$ itself is eliminated by the action of an acid, whereby —OH is generated. Meanwhile, when $R^6$ is —C(R$^4$)$_2$—COOR$^5$, R$^5$ is eliminated by the action of an acid, whereby —COOH is generated.

Examples of the group which is eliminated by the action of an acid include an acetal group and a tertiary ester group.

Specific examples of the acetal group include an alkoxyalkyl group such as a methoxymethyl group and an ethoxyethyl group, a tetrahydropyranyl group, a tetrahydrofuranyl group, an alkoxy-substituted tetrahydropyranyl group, and an alkoxy-substituted tetrahydrofuranyl group.

Specific examples of the ester group include a t-butyl group, a t-amyl group, a 1-methylcyclopentyl group, a 1-ethylcyclopentyl group, and a 1-ethylcyclohexyl group.

Specific examples of the compound having an alkoxymethyl group of (CL-1) include those having the following structures.

Examples of the compound having an acyloxymethyl group include compounds in which alkoxymethyl groups of the following compounds are each changed to an acyloxymethyl group.

The compound having an alkoxymethyl group or an acyloxymethyl group in a molecule is not limited to the following compounds.

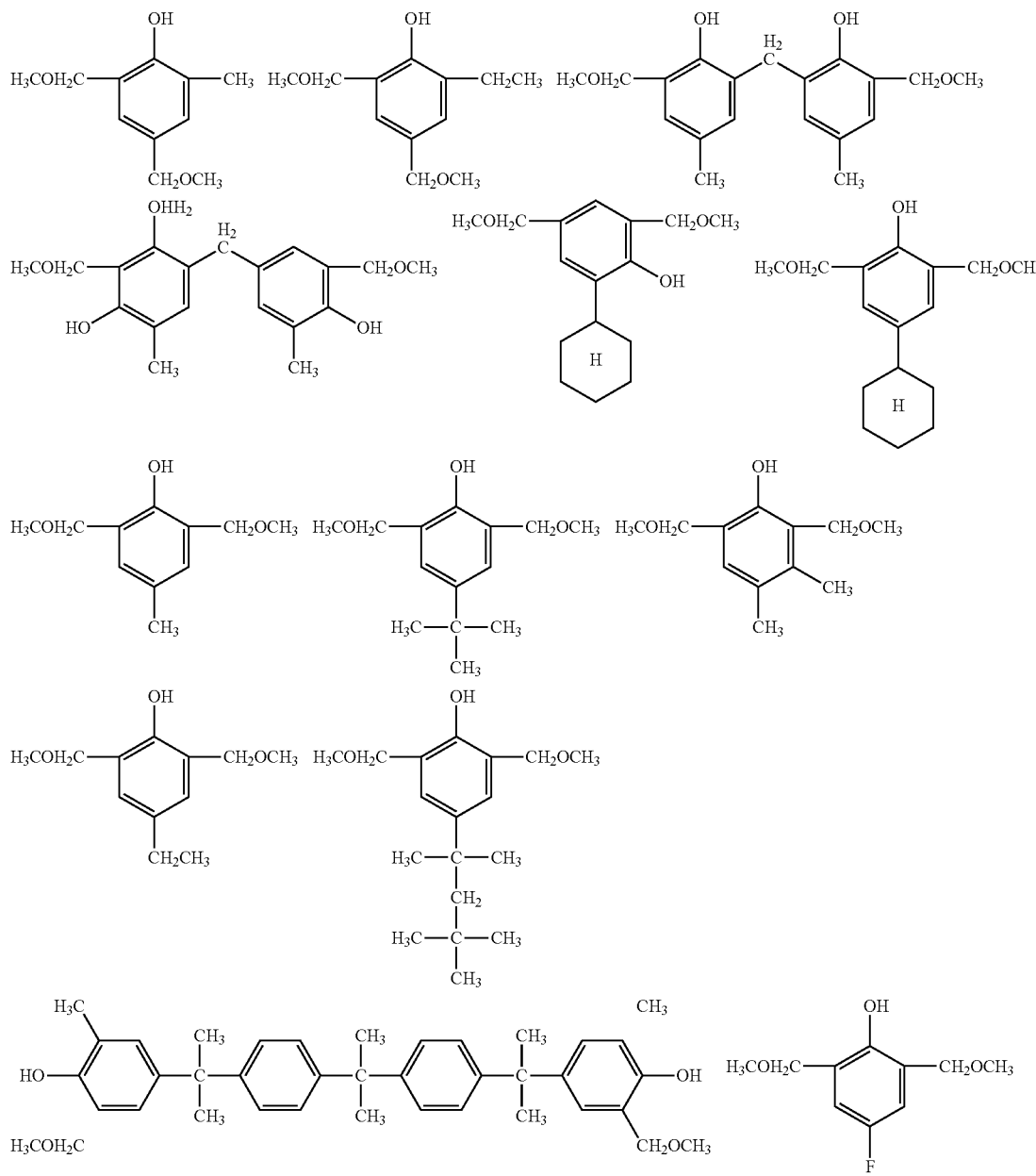

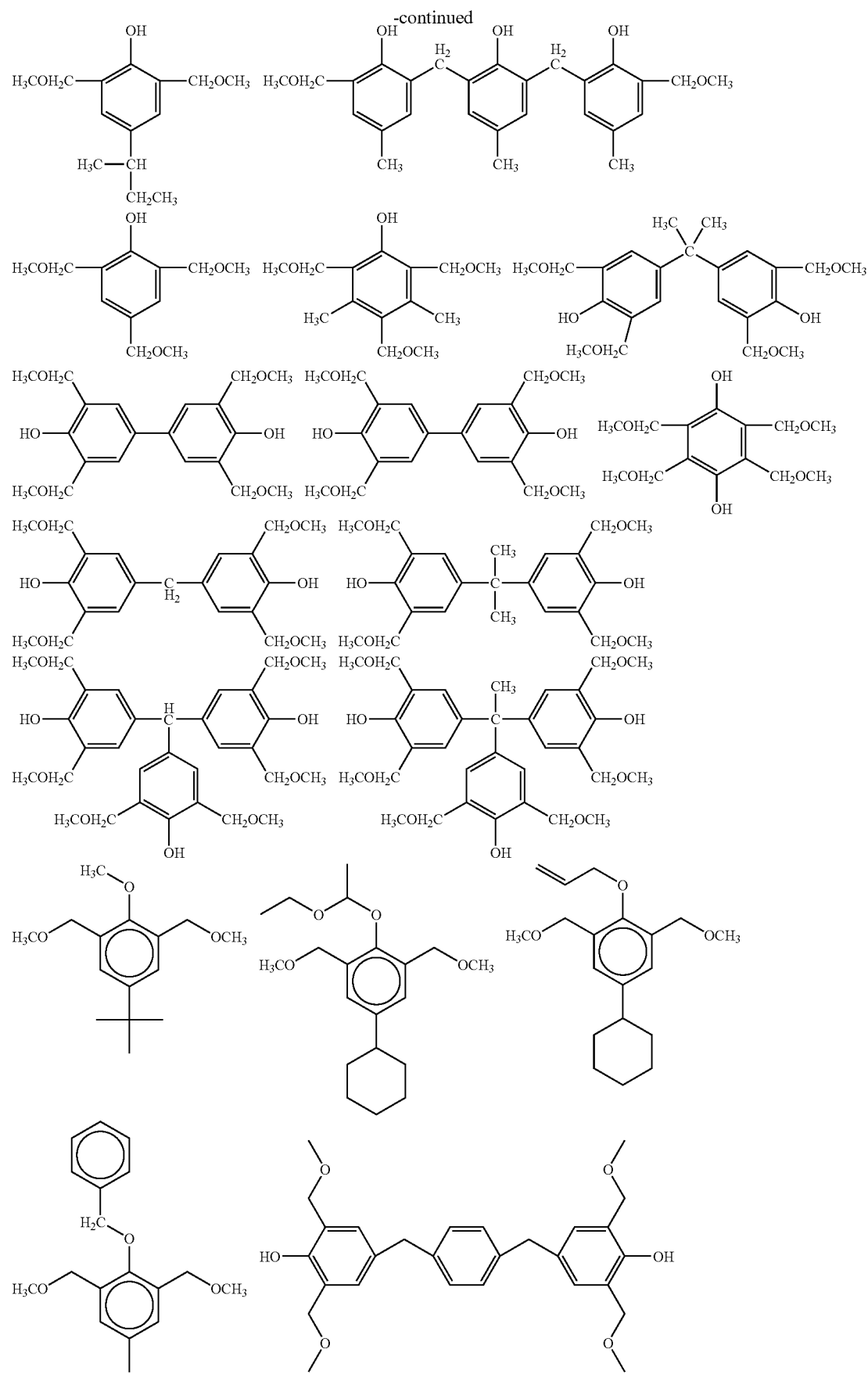

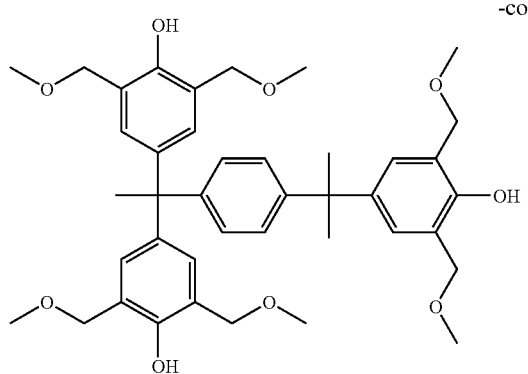
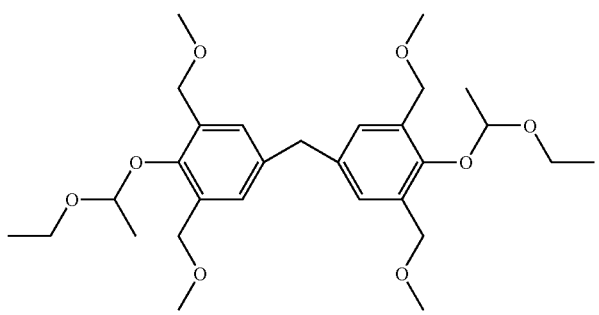
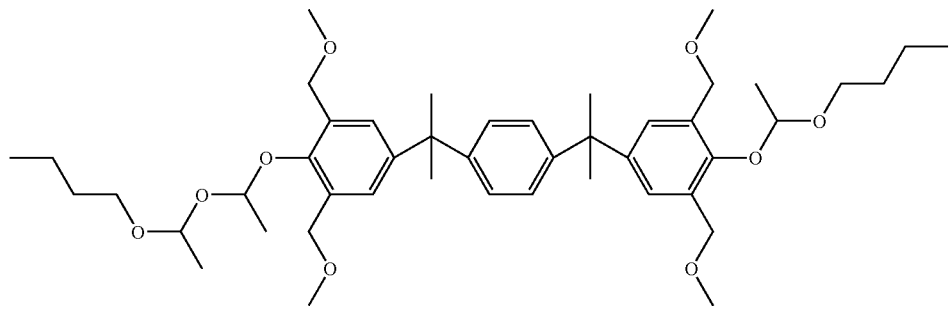
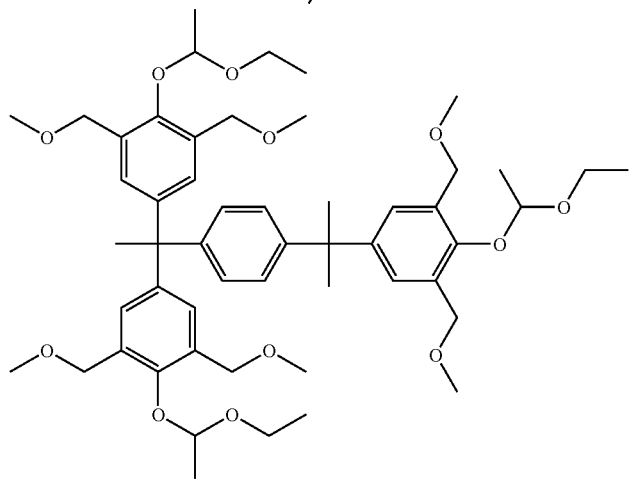

Examples of the (CL-2) compound include a compound represented by the following formula.

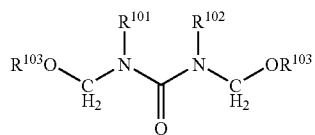

In the formula, $R^{103}$s each represent an alkyl group having 1 to 4 carbon atoms or an acyl group having 1 to 4 carbon atoms; and $R^{101}$ and $R^{102}$ each represent a monovalent organic group; and $R^{101}$ and $R^{102}$ may be bonded to each other to form a 5 to 8-membered ring.

Examples of the (CL-2) compound also include a glycoluril compound such as tetramethylolglycoluril, tetramethoxyglycoluril, tetramethoxymethylglycoluril, a compound in which 1 to 4 methylol groups of tetramethylolglycoluril are methoxymethylated, or a mixture thereof, and a compound in which 1 to 4 methylol groups of tetramethylolglycoluril is acyloxymethylated, or a mixture thereof. In addition, examples of the (CL-2) compound include a urea compound, and examples of the urea compound include tetramethylolurea, tetramethoxymethylurea, a compound in which 1 to 4 methylol groups of tetramethylolurea are methoxymethylated, or a mixture thereof, and tetramethoxyethylurea.

Specific examples of the (CL-2) compound which has an alkoxymethyl group include those having the following structures.

Examples of the (CL-2)compound which has an acyloxymethyl group include a compound in which alkoxymethyl groups of the following compounds are each changed to an acyloxymethyl group.

The compound having an alkoxymethyl group or an acyloxymethyl in a molecule is not limited to the following compounds.

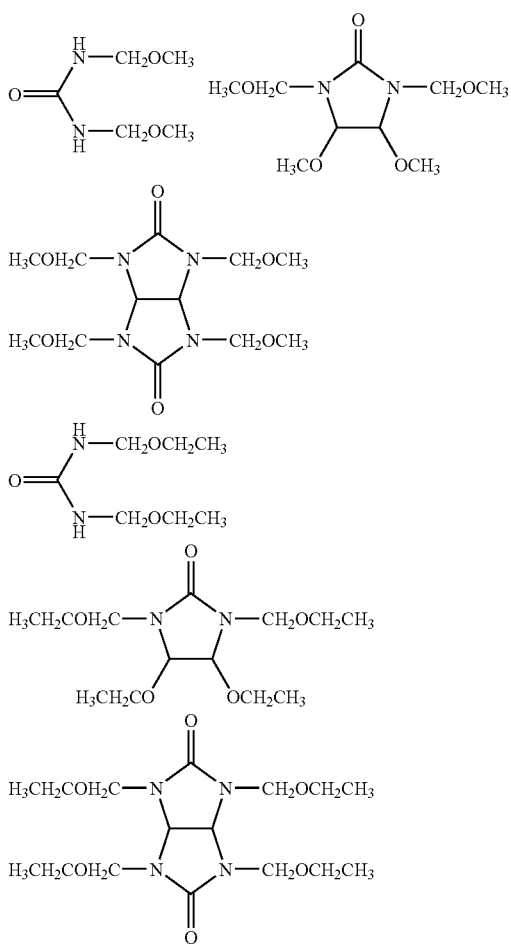

Examples of the (CL-3) compound include a melamine compound. Specific examples of the melamine compound include hexamethylolmelamine, hexamethoxymethylmelamine, a compound in which 1 to 6 methylol groups of hexamethylolmelamine are methoxymethylated, or a mixture thereof, hexamethoxyethylmelamine, hexaacyloxymethylmelamine, and a compound in which 1 to 6 methylol groups of hexamethylolmelamine are acyloxymethylated, or a mixture thereof.

As the compound containing at least one of an alkoxymethyl group and an acryloxymethyl group, a commercially available compound or a compound synthesized by a known method may be used.

(C2) Compound containing Methacryloyl Group or Acryloyl Group

The photosensitive resin composition according to an exemplary embodiment of the invention may include a compound containing a methacryloyl group or an acryloyl group for the purpose of improving film physical property.

The compound containing a methacryloyl group or an acryloyl group is a compound selected from the group consisting of acrylic acid ester and methacrylic acid ester. It is known that, by addition of this compound, film physical property is improved. For this reason, a compound containing 2 or more, more preferably 4 or more, of an acryloyl group or a methacryloyl group in one molecule is preferable.

Preferable examples thereof include monofunctional acrylate or monofunctional methacrylate such as polyethylene glycol mono(meth)acrylate, polypropylene glycol mono (meth)acrylate, and phenoxyethyl(meth)acrylate; polyethylene glycol di(meth)acrylate, polypropylene glycol di(meth) acrylate, trimethylolethane triacrylate, trimethylolpropane triacrylate, trimethylolpropane diacrylate, neopentyl glycol di(meth)acrylate, pentaerythritol tetra(meth)acrylate, pentaerythritol tri(meth)acrylate, dipentaerythritol hexa(meth) acrylate, dipentaerythritol penta(meth)acrylate, hexanediol di(meth)acrylate, trimethylolpropane tri(acryloyloxypropyl) ether, tri(acryloyloxyethyl)isocyanurate, tri(acryloyloxyethyl)cyanurate, glycerin tri(meth)acrylate; compounds obtained by addition reaction of ethylene oxide or propylene oxide with a polyfunctional alcohol such as trimethylolpropane, glycerin, or bisphenol, followed by (meth)acrylation; urethane acrylates disclosed in Japanese Patent Application Publication (JP-B) Nos. 48-41708 and 50-6034 and JP-A No. 51-37193; polyester acrylates disclosed in JP-A No. 48-64183 and JP-B Nos. 49-43191 and 52-30490; and polyfunctional acrylates and methacrylates such as an epoxy acrylate which is the reaction product of an epoxy resin and (meth)acrylic acid. Among them, trimethylolpropane tri (meth)acrylate, pentaerythritol tetra(meth)acrylate, dipentaerythritol hexa(meth)acrylate, and dipentaerythritol penta (meth)acrylate are preferable.

(C3) Compound containing Epoxy Group or Oxetanyl Group

The photosensitive resin composition according to an exemplary embodiment of the invention may include a compound containing an epoxy group or an oxetanyl group, for the purpose of improving film physical property.

The compound containing an epoxy group or an oxetanyl group is generally a compound called an epoxy resin or an oxetane resin.

Examples of the epoxy resin include a bisphenol A resin, a cresol novolak resin, a biphenyl resin, and an alicyclic epoxy compound.

Examples of the bisphenol A resin include EPOTOHTO YD-115, YD-118T, YD-127, YD-128, YD-134, YD-8125, YD-7011R, ZX-1059, YDF-8170, YDF-170 and the like (manufactured by Tohto Kasei Co., Ltd.), DENACOL EX-1101, EX-1102, EX-1103 and the like (manufactured by Nagase Chemtex Corporation), PLACCEL GL-61, GL-62, G101, and G102 (manufactured by Daicel Chemical Industries Ltd.), and bisphenol F resins and bisphenol S resins which are similar to them. In addition, epoxy acrylate such as EBECRYL 3700, 3701, and 600 (manufactured by DAICEL-CYTEC COMPANY Ltd.) may be used.

Examples of the cresol novolak resin include EPOTOHTO YDPN-638, YDPN-701, YDPN-702, YDPN-703, and YDPN-704 (manufactured by Tohto Kasei Co., Ltd.) and DENACOL EM-125 (manufactured by Nagase Chemtex Corporation).

Examples of the biphenyl resin include 3,5,3',5'-tetramethyl-4,4' diglycidylbiphenyl.

Examples of the alicyclic epoxy compound include CELLOXIDE 2021, 2081, 2083, and 2085, EPOLEAD GT-301, GT-302, GT-401, GT-403, and EHPE-3150 (all manufactured by Daicel Chemical Industries Ltd.), SUNTOHTO ST-3000, ST-4000, ST-5080, and ST-5100 (all manufactured by Tohto Kasei Co., Ltd.). Besides, EPOTOHTO YH-434 and YH-434L which are amine epoxy resins, a glycidyl ester in which a skeleton of a bisphenol A epoxy resin is modified with a dimer acid, and the like may also be used.

Among these epoxy resins, a novolak epoxy compound and an alicyclic epoxy compound are preferable, and those having an epoxy equivalent of 180 to 250 are particularly preferable. Examples of such a material include EPICLON N-660, N-670, N-680, N-690, and YDCN-704L (all manufactured by DIC), and EHPE3150 (manufactured by Daicel Chemical Industries Ltd.).

According to exemplary embodiments of the invention, two or more kinds of epoxy resins may be included in a photosensitive resin composition.

As the oxetane resin, ARON OXETANE OXT-101, OXT-121, OXT-211, OXT-221, OXT-212, OXT-610, OX-SQ, and PNOX (all manufactured by Toagosei Co., Ltd.) may be used.

The oxetane resin may be used alone, or may be used in combination with an epoxy resin. Particularly, it is preferable that the oxetane resin is used in combination with an epoxy resin, from a viewpoint of improvement in film physical property, because reactivity is high.

Two or more kinds of the crosslinking agents may be used in combination.

The amount of the (C) crosslinking agent to be added to the photosensitive resin composition is preferably from 1 to 20 parts by mass, more preferably from 3 to 15 parts by mass, with respect to 100 parts by mass (total amount) of the (A) polymer compound.

(D) Thermal Acid Generator

In an exemplary embodiment of the invention, a thermal acid generator may be used in order to improve film physical property at a low temperature curing.

The thermal acid generator to be used in the invention is a compound which generates an acid by heat, and is a compound having a heat degradation temperature of usually in the range of from 130° C. to 250° C., preferably from 150° C. to 220° C. An example thereof is a compound which generates a low nucleophilic acid such as sulfonic acid, carboxylic acid, or disulfonylimide by heating.

As the acid to be generated, a strong sulfonic acid is preferable which has a pKa of 2 or less, such as a sulfonic acid, an alkylcarboxylic or arylcarboxylic acid substituted by an electron withdrawing group, or a disulfonylimide similarly substituted by an electron withdrawing group. Examples of the electron withdrawing group include a halogen atom such as a fluorine (F) atom, a haloalkyl group such as a trifluoromethyl group, a nitro group, and a cyano group.

As the thermal acid generator, a photo acid generator that generates an acid by light exposure may be applied. Examples thereof include an onium salt such as a sulfonium salt or an iodonium salt, a N-hydroxyimidosulfonate compound, oxime sulfonate, and o-nitrobenzyl sulfonate. In particular, a N-hydroxyimidosulfonate compound, oxime sulfonate, and o-nitrobenzyl sulfonate are preferable.

Alternatively, it is also preferable to use a sulfonic acid ester that does not substantially generate an acid as a result of irradiation with exposure light, but generates an acid as a result of heat.

Absence of substantial generation of an acid as a result of irradiation with exposure light may be determined by ascertaining that there is no change in spectrum by measurement of an IR spectrum or a NMR spectrum before and after light exposure of the compound.

The molecular weight of a sulfonic acid ester is generally from 230 to 1000, and preferably from 230 to 800.

Examples of the sulfonic acid ester include a sulfonic acid ester represented by the following Formula (TA-10).

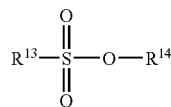

(TA-10)

In Formula (TA-10), $R^{13}$ and $R^{14}$ each independently represent a straight-chain, branched or cyclic alkyl group which has 1 to 10 carbon atoms and may have a substituent or an aryl group which has 6 to 20 carbon atoms and may have a substituent. Examples of the substituent include a hydroxy group, a halogen atom, a cyano group, a vinyl group, an acetylene group, and a straight-chain or cyclic alkyl group having 1 to 10 carbon atoms.

Preferable examples of the sulfonic acid ester represented by Formula (TA-10) include the following compounds.

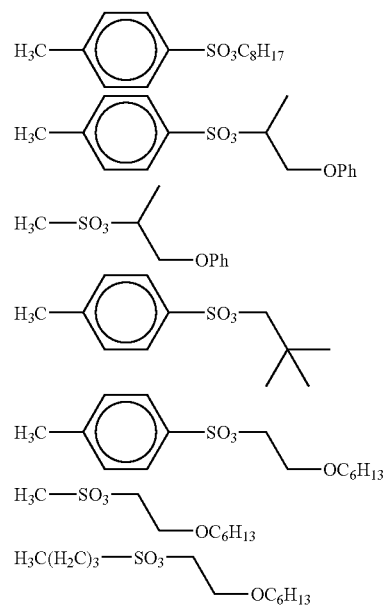

As sulfonic acid ester, a compound represented by the following Formula (TA-20) may be more preferably used from a viewpoint of heat resistance.

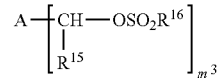

(TA-20)

In the formula, A represents a $m^3$-valent linking group.

$R^{16}$ represents an alkyl group, an aryl group, an aralkyl group, or a cyclic alkyl group.

$R^{15}$ represents a hydrogen atom, an alkyl group, or an aralkyl group.

$m^3$ represents an integer of 2 to 8.

Examples of the $m^3$-valent linking group as A include an alkylene group (e.g. methylene, ethylene, or propylene), a cycloalkylene group (e.g. cyclohexylene or cyclopentylene), an arylene group (e.g. 1,2-phenylene, 1,3-phenylene, 1,4-phenylene, or naphthylene), an ether group, a carbonyl group, an ester group, an amido group, and an $m^3$-valent group obtained by removing ($m^3$–2) given hydrogen atoms from a divalent group obtained by combining these groups. The linking group as A generally has 1 to 15 carbon atoms, preferably 1 to 10 carbon atoms, and more preferably 1 to 6 carbon atoms.

The alkyl group of $R^{15}$ or $R^{16}$ is generally an alkyl group having 1 to 20 carbon atoms, preferably an alkyl group having 1 to 15 carbon atoms, more preferably an alkyl group having 1 to 8 carbon atoms. Specific examples thereof include methyl, ethyl, propyl, butyl, hexyl, and octyl groups.

The aralkyl group of e or $R^{16}$ is generally an aralkyl group having 7 to 25 carbon atoms, preferably an aralkyl group having 7 to 20 carbon atoms, and more preferably an aralkyl group having 7 to 15 carbon atoms. Specific examples thereof include benzyl, toluoylmethyl, mesitylmethyl, and phenethyl groups.

The cyclic alkyl group of $R^{16}$ is generally a cyclic alkyl group having 3 to 20 carbon atoms, preferably a cyclic alkyl group having 4 to 20 carbon atoms, and more preferably a cyclic alkyl group having 5 to 15 carbon atoms. Specific examples thereof include cyclopentyl, cyclohexyl, norbornyl, and camphor groups.

The linking group as A may further have a substituent. Examples of the substituent include an alkyl group (an alkyl group having 1 to 10 carbon atoms, and specific examples thereof include methyl, ethyl, propyl, butyl, hexyl, and octyl groups), an aralkyl group (an aralkyl group having 7 to 15 carbon atoms, and specific examples thereof include benzyl, toluoylmethyl, mesitylmethyl, and phenethyl groups), an aryl group (an aryl group having 6 to 10 carbon atoms, and specific examples thereof include phenyl, toluoyl, xylyl, mesityl, and naphthyl groups), an alkoxy group (an alkoxy group which may be either of straight-chain, branched, or cyclic and which has 1 to 10 carbon atoms, and specific examples thereof include methoxy, ethoxy, straight-chain or branched propoxy, straight-chain or branched butoxy, straight-chain or branched pentoxy, cyclopentyloxy, and cyclohexyloxy groups), an aryloxy group (an aryloxy group having 6 to 10 carbon atoms, and specific examples thereof include phenoxy, toluoyloxy, and 1-naphthoxy groups), an alkylthio group (an alkylthio group which may be either of straight-chain, branched or cyclic, and which has 1 to 10 carbon atoms, and specific examples thereof include methylthio, ethylthio, straight-chain or branched propylthio, cyclopentylthio, and cyclohexylthio groups), an arylthio group (an arylthio group having 6 to 10 carbon atoms, and specific examples thereof include phenylthio, toluoylthio, and 1-naphtylthio groups), an acyloxy group (an acyloxy group having 2 to 10 carbon atoms, and specific examples thereof include acetoxy, propanoyloxy, and benzoyloxy groups), and an alkoxycarbonyl group (an alkoxycarbonyl group having 1 to 10 carbon atoms, and specific examples thereof include methoxycarbonyl, ethoxycarbonyl, straight-chain or branched propoxycarbonyl, cyclopentyloxycarbonyl, and cyclohexyloxycarbonyl groups).

In Formula (TA-20), $R^{16}$ is preferably an alkyl group and an aryl group. $R^{15}$ is preferably a hydrogen atom and an alkyl group having 1 to 6 carbon atoms, more preferably a hydrogen atom, a methyl group or an ethyl group, and most preferably a hydrogen atom.

Examples of the sulfonic acid ester which may be used in the invention include the following specific compounds, but are not limited thereto.

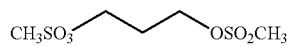
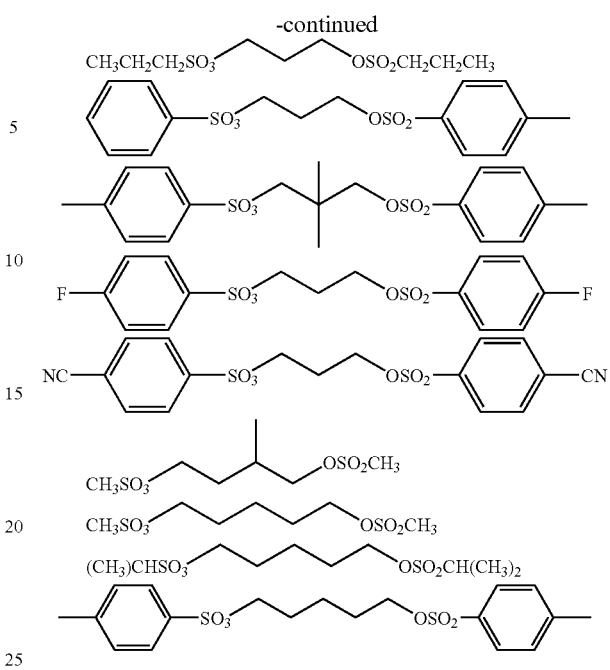

As the sulfonic acid ester which may be used in the invention, a commercially available sulfonic acid ester may be used, or a sulfonic acid ester synthesized by a known method may be used. The sulfonic acid ester may be synthesized, for example, by reacting sulfonyl chloride or sulfonic anhydride with a corresponding polyhydric alcohol under a basic condition.

The amount of the (D) thermal acid generator to be added to the photosensitive resin composition is preferably from 1 to 20 parts by mass, particularly preferably from 2 to 15 parts by mass, with respect to 100 parts by mass of the (A) polymer compound obtained by reacting a monomer represented by Formula (1) and a monomer represented by Formula (2).

(E) Adhesion Promoting Agent

To the photosensitive resin composition according to an exemplary embodiment of the invention, an adhesion promoting agent such as an organic silicon compound, a silane coupling agent, or a leveling agent, for imparting adhesiveness to the photosensitive resin composition may be added, if necessary.

Examples of the adhesion promoting agent include γ-aminopropyltrimethoxysilane, γ-aminopropyltriethoxysilane, vinyltriethoxysilane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, γ-glycidoxypropyltriethoxysilane, γ-methacryloxypropyltrimethoxysilane, ureapropyltriethoxysilane, tris(acetylacetonate) aluminum, and acetylacetate aluminum diisopropylate. When the adhesion promoting agent is used in the photosensitive resin composition, the amount of the adhesion promoting agent is preferably from 0.1 to 20 parts by mass, more preferably from 0.5 to 10 parts by mass, with respect to 100 parts by mass of the (A) polymer compound.

(F) Solvent

A solvent is not particularly limited as far as it can dissolve the photosensitive resin composition according to an exemplary embodiment of the invention. In order to prevent the solvent from excessively evaporating upon coating so that solid components of the photosensitive resin composition do not separate out upon coating, a solvent having a boiling point of 100° C. or higher is preferable.

Examples of a preferable solvent include propylene glycol monomethyl ether, propylene glycol monomethyl ether acetate, ethyl 3-ethoxypropionate, methyl 3-methoxypropionate, ethyl lactate, 3-methoxybutanol, and cyclohexanone.

In addition, a solvent having a high boiling point such as N-methylpyrrolidone (NMP), γ-butyrolactone (GBL), or propylene carbonate may be used supplementarily.

However, since sufficient film physical property is not obtained when the solvent remains in a film after curing, it is not preferable that the proportion of a solvent having a boiling point of higher than a curing temperature (i.e. high-boiling-point solvent) is 30% by mass or more in the solvent. The amount of the high-boiling-point solvent is 30% by mass or less, preferably 20% by mass or less, and more preferably 10% by mass or less, with respect to the total amount of solvents.

Pattern Forming Method

A method of forming a relief pattern using the photosensitive resin composition according to an exemplary embodiment of the invention includes: (1) applying the photosensitive resin composition according to an exemplary embodiment of the invention onto an appropriate substrate, (2) baking the coated substrate (pre-baking), (3) exposing the substrate to active light ray or radiation, (4) heating, if necessary, (5) developing with an aqueous developer, (6) exposing an entire surface of the substrate to light, if necessary, and (7) thermally curing the composition (post-baking), whereby a cured relief pattern is formed.

The coated and exposed substrate may be baked at a high temperature prior to development, if necessary. Alternatively, the developed substrate may be rinsed before curing. After development, prior to thermal curing (post-baking), light exposure may be performed, if necessary.

Thus, the photosensitive resin composition according to an exemplary embodiment of the invention is applied onto a semiconductor element or a glass substrate so that the thickness after thermal curing becomes a certain thickness (e.g. from 0.1 to 30 μm), pre-baked, exposed to light, developed, and thermally cured, whereby a relief pattern for a semiconductor device or a display device may be formed.

The method of forming a relief pattern will be described in more detail below.

The photosensitive resin composition according to an exemplary embodiment of the invention is applied onto an appropriate substrate. The substrate is, for example, a semiconductor substrate such as a silicon wafer, a ceramic substrate, a glass substrate, a metal substrate or a plastic substrate. Generally, a silicon wafer is used for a semiconductor device, and a glass substrate is used for a display device. Examples of the coating method include, but not limited to, spray coating, spin coating, slit coating, offset printing, roller coating, screen printing, extrusion coating, meniscus coating, curtain coating, and dip coating.

After the coating, in order to evaporate the remaining solvent, the substrate is baked at an elevated temperature of about 70° C. to 130° C. for a few minutes to a half hour, depending on a method to be used. Then, the resultant dried photosensitive resin composition layer is exposed to active light ray or radiation in a preferable pattern through a mask. As the active light ray or radiation, X-ray, electron beam, ultraviolet ray, visible light ray or the like may be used. The most preferable radiation has a wavelength of 436 nm (g-line), 405 nm (h-line) or 365 nm (i-line).

It is advantageous to heat the substrate which has been exposed to active light ray or radiation to a temperature of about 70° C. to about 130° C. The exposed substrate is heated at a temperature within this temperature range for a short time, generally a few seconds to a few minutes. This stage of the present method is usually called post exposure baking, from a viewpoint of technique.

Then, the coated film is developed using an aqueous developer, whereby a relief patter is formed. The aqueous developer includes an alkali solution of, for example, an inorganic alkali (e.g. potassium hydroxide, sodium hydroxide or aqueous ammonia), a primary amine (e.g. ethylamine or n-propylamine), a secondary amine (e.g. diethylamine or di-n-propylamine), a tertiary amine (e.g. triethylamine), an alcoholamine (e.g. triethanolamine), a quaternary ammonium salt (e.g. tetramethylammonium hydroxide or tetraethylammonium hydroxide), or a mixture thereof. The most preferable developer includes tetramethylammonium hydroxide. In addition, a suitable amount of a surfactant may be added to the developer. Development may be performed by dipping, spraying, paddling, or another similar developing method.

Depending on the case, the relief pattern may then be rinsed using deionized water.

The relief pattern is subjected to entire surface exposure after development, if necessary. It is preferable that an exposure energy of the entire surface exposure is preferably of from 100 to 1,000 mJ/cm$^2$. The entire surface exposure is preferable from a viewpoint of improvement in transparency, when the photosensitive resin composition is used for a display device.

Then, the relief pattern is thermally cured to obtain a final pattern. The thermal curing is performed to form a film having a high heat resistance, a high chemical resistance and a high film strength. In general, a photosensitive polyimide precursor composition is thermally cured at a temperature of about 300 to 400° C. On the other hand, a film having film physical properties which are equivalent to or superior to those of the film formed by the conventional photosensitive polyimide precursor composition may be obtained even at a temperature lower than 300° C., more specifically a temperature from 200° C. to 250° C.

Electronic Device

The photosensitive resin composition according to an exemplary embodiment of the invention may be used for forming, for example, a surface protecting film and/or an interlayer insulating film of an electronic device for a semiconductor device, or a planarization film and/or an interlayer insulating film of an electronic device for a display device. Examples of a method of forming a film include the aforementioned pattern forming method.

The semiconductor device and the display device as well as the electronic device thereof are not particularly limited except that they have a surface protecting film, an interlayer insulating film, and/or a planarization film, which are formed using the photosensitive resin composition of the invention. The semiconductor device and the display device as well as the electronic device thereof may be produced by any of various methods, and may have any of various configurations.

All references, patent applications, and technical specifications described in the present specification are incorporated herein by reference to the same extent that incorporation of individual references, patent applications, and technical specifications by reference is specifically and individually described.

EXAMPLES

Hereinafter, the invention will be described in more detail by way of Examples, but the invention is not limited to the following Examples as far as the gist thereof is not departed. Unless otherwise is indicated, "part" is based on mass standard.

A group of the compounds used in Examples and Comparative Examples will be shown below.

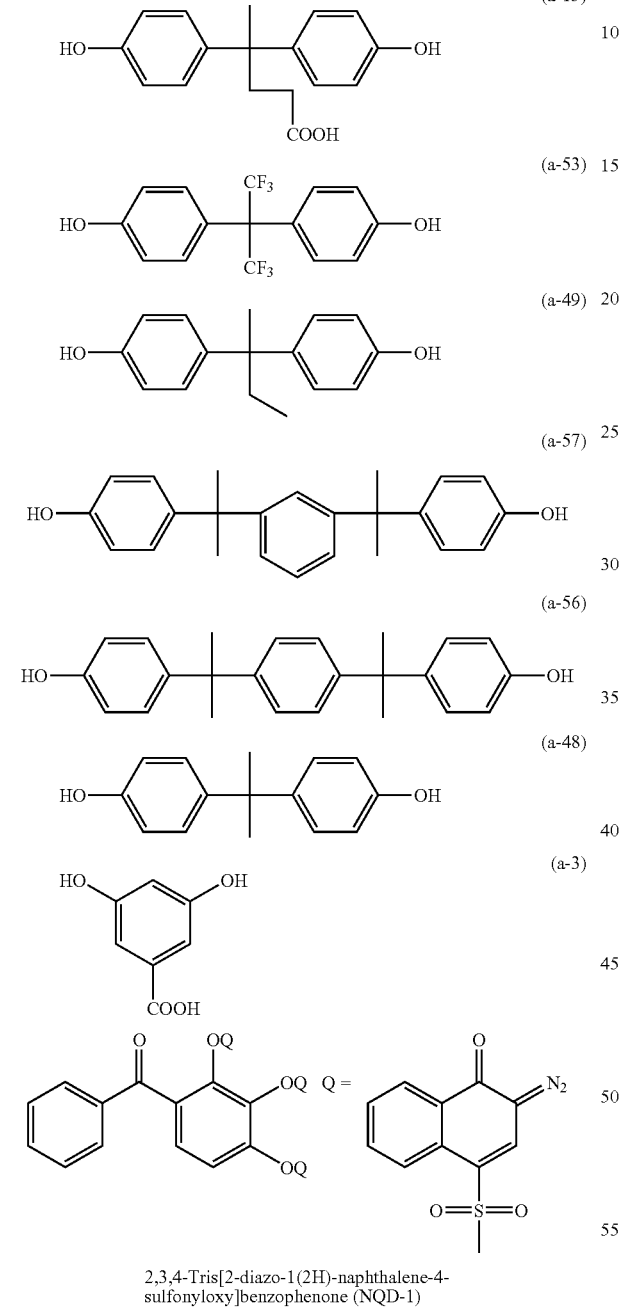

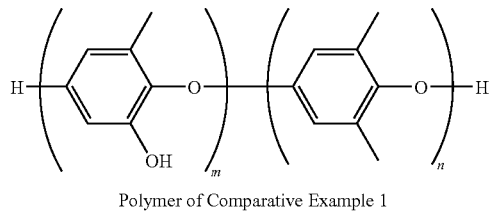

Polymer of Comparative Example 1

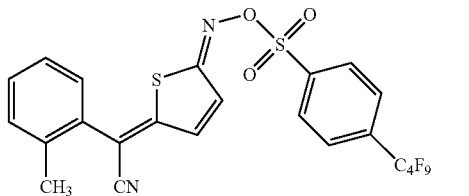

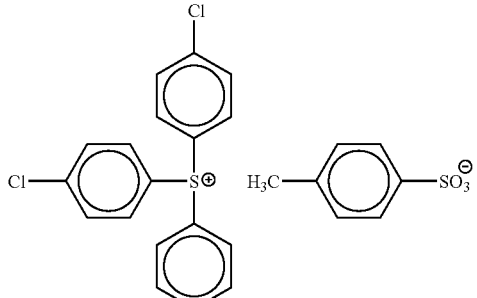

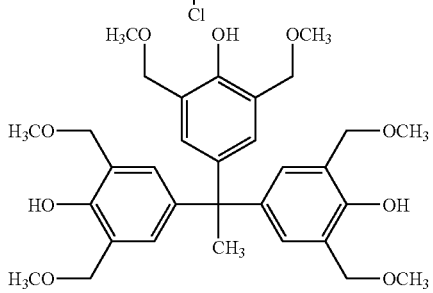

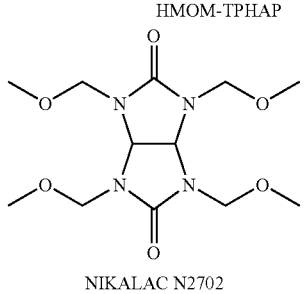

NIKALAC N2702

Synthesis Example 1

Synthesis of Polyether Sulfone having Alkali-Soluble Group

To 195 ml of N-methyl-2-pyrrolidinone and 97 ml of toluene, 25.0 g (87.3 mmol) of diphenolic acid (a-15; manufactured by Tokyo Chemical Industry Co., Ltd.), 25.1 g (87.3 mmol) of dichlorodiphenylsulfone (manufactured by Tokyo Chemical Industry Co., Ltd.), and 36.2 g (261.9 mmol) of potassium carbonate were added. The mixture was stirred at 150° C. for 4 hours, and then toluene was distilled off. Further, a reaction was performed at 180° C. for 16 hours to obtain a polymerization solution. After completion of the reaction, an inorganic salt was separated by filtration from the polymerization solution, and poured into hydrochloric acid aqueous solution to precipitate a polymer. The precipitate solid was washed with water, and dried at 50° C. under reduced pressure to obtain 40 g of resin (A-1). The number average molecular weight of resin (A-1) was calculated using $^1$H NMR spectrum (manufactured by BRUKER), and was found to be 7,000.

20.0 g (40.0 mmol) of the resultant resin (A-1) was placed in a 0.2-liter flask, and dissolved by adding 80 g of THF, and the flask was cooled to 0° C. After dropwise addition of 4.50 g (55.9 mmol) of chloromethyl methyl ether (manufactured by Tokyo Chemical Industry Co., Ltd.), 5.66 g (55.9 mmol) of triethylamine was added dropwise, and the mixture was stirred for 1 hour. This reaction solution was poured into 1 liter of distilled water, and the resultant precipitate was recovered, washed, and dried under reduced pressure to obtain resin (A-2). The proportion of a protected acidic group in resin (A-2) was 60%.

Example 1

Preparation of Photosensitive Resin Composition 85 parts by mass of the thus-synthesized resin (A-2), and 5 parts by mass of a photo acid generator, i.e. 2,3,4-tris[2-diazo-1(2H)-naphthalenone-4-sulfonyloxy]benzophenone (NQD-1) (manufactured by Toyo Gosei Co., LTd.), were dissolved in 200 parts by mass of propylene glycol monomethyl ether acetate (PGMEA). The solution was subjected to filtration using a 0.2-μm polytetrafluoroethylene filter to obtain a photosensitive resin composition.

Evaluation of Physical Properties
Pattern Forming Property
The photosensitive resin composition of the invention was applied onto a silicon wafer using a spin coater, and dried in an oven at 125° C. for 3 minutes, to thereby obtain a coated film having a film thickness of 7 μm. This coated film was irradiated with i-rays (365 nm) at 100 mJ/cm$^2$ (illuminance: 20 mW/cm$^2$) using a high pressure mercury lamp through a glass mask, subjected to paddle development using a 2.38% tetramethylammonium hydroxide aqueous solution at 25° C. for 60 seconds to dissolve and remove exposed portions of the film, and rinsed with pure water for 20 seconds. Then, by measuring the thickness of the film at this time, the extent of reduction in film thickness in unexposed portions by development was evaluated as the ratio of remaining film (remaining film ratio). When the remaining film ratio is 90% or more, pattern forming property is good. The film thickness in this evaluation was measured using an F20 manufactured by FIL-METRICS.
A: Remaining film ratio was 95% or more.
B: Remaining film ratio was 90% or more to less than 95%.
C: Remaining film ratio was 80% or more to less than 90%.
D: Remaining film ratio was less than 80%.
Resolution
The photosensitive resin composition of the invention was applied onto a silicon wafer using a spin coater, and dried in an oven at 125° C. for 3 minutes, to thereby obtain a coated film having a film thickness of 7 μm. This coated film was irradiated with i-ray (365 nm) at 100 mJ/cm$^2$ (illuminance: 20 mW/cm$^2$) using a high pressure mercury lamp through a glass mask, subjected to paddle development in a 2.38% tetramethylammonium hydroxide aqueous solution at 25° C. for 60 seconds to dissolve and remove exposed portions of the film, and rinsed with pure water for 20 seconds. As the result, it was confirmed that a 5 μm solid-white pattern was resolved on the silicon wafer.
Resolution was evaluated by observing the resultant pattern using a SEM.

Heat Resistance
The photosensitive resin composition of the invention was applied onto a silicon wafer, and heated in an oven at 200° C. for 30 minutes, at 250° C. for 30 minutes and at 300° C. for 30 minutes in this order to cure the resin. The resultant coated film was peeled off, and the heat resistance ("5% mass decrease temperature": the temperature at which the mass of the coated film decreases by 5% mass) was investigated using an SDTQ600 (manufactured by TA Instruments).
As the 5% mass decrease temperature, the mass of a film was measured up to 500° C. at a temperature raising rate of 10° C./min under a nitrogen stream, and the temperature at which the mass becomes 95 when the mass at room temperature (23° C.) is taken to be 100 was adopted as the "5% mass decrease temperature".
Insulating Property
The photosensitive resin composition of the invention was applied onto a bare wafer (N-type, having a low resistance) (manufactured by SUMCO), and dried in an oven at 125° C. for 3 minutes, to thereby obtain a coated film having a film thickness of 7 μm. The resultant coated film was irradiated with i-ray (365 nm) at 100 mJ/cm$^2$ (illuminance: 20 mW/cm$^2$) using a high pressure mercury lamp, and this substrate was burned in a clean oven at 220° C. for 30 minutes, to thereby obtain a cured film.
The relative dielectric constant of this cured film was measured at a measurement frequency of 1 MHz using CVmap92A (manufactured by Four Dimensions Inc.). A relative dielectric constant of less than 2.9 indicates a good insulating property.
The relative dielectric constant was measured only by performing a coated film forming process, a pre-baking process, an entire surface exposure process (100 mJ/cm$^2$ (illuminance: 20 mV/cm$^2$)), and a post-baking process (220° C./30 min), and evaluated.
A: Relative dielectric constant was less than 2.6.
B: Relative dielectric constant was 2.6 or more to less than 2.9.
C: Relative dielectric constant was 2.9 or more to less than 3.2.
D: Relative dielectric constant was 3.2 or more.
Results are shown in Table 1.

Synthesis Example 2

Resin (B-1) was synthesized according to the same manner as in Synthesis Example 1 except that 87.3 mmol of diphenol monomer (a-15) in Synthesis Example 1 was changed to 12.5 g (43.7 mmol) of (a-15) and 14.68 g (43.7 mmol) of (a-53) (manufactured by Tokyo Chemical Industry Co., Ltd.). The number average molecular weight of resin (B-1) was measured by GPC (apparatus: HLC-8220 manufactured by Tosoh Corporation, column temperature: 40° C., flow rate: 0.3 ml/min, column: TSK-GEL; SUPER-AW series, solvent: NMP solution having LiBr concentration of 10 mmol/L; the number average molecular weight is in terms of standard polystyrene), and was found to be 7,000. Resin (B-2) was obtained in the same manner as in Synthesis Example 1 except that a reaction of introducing a protecting group into (B-1) was performed using 28.0 mmol of chloromethyl methyl ether (manufactured by Tokyo Chemical Industry Co., Ltd.). The proportion of a protected acidic group in resin (B-2) was 55%.

Example 2

A photosensitive resin composition was prepared in the same manner as in Example 1 except that resin (A-2) in the photosensitive resin composition of Example 1 was changed to resin (B-2), and the composition was evaluated in the same manner as in Example 1.

Synthesis Example 3

Resin (C-1) was synthesized in the same manner as in Synthesis Example 1 except that 87.3 mmol of diphenol monomer (a-15) in Synthesis Example 1 was changed to 12.5 g (43.7 mmol) of (a-15) and 10.58 g (43.7 mmol) of (a-49) (manufactured by Tokyo Chemical Industry Co., Ltd.). Resin (C-2) was obtained in the same manner as in Synthesis Example 1 except that a reaction of introducing a protecting group into (C-1) was performed using 28.0 mmol of chloromethyl methyl ether (manufactured by Tokyo Chemical Industry Co., Ltd.). The proportion of a protected acidic resin in resin (C-2) was 58%.

Example 3

A photosensitive resin composition was prepared in the same manner as in Example 1 except that resin (A-2) in the photosensitive resin composition in Example 1 was changed to resin (C-2), and the composition was evaluated in the same manner as in Example 1.

Synthesis Example 4

Resin (D-1) was synthesized in the same manner as in Synthesis Example 1 except that 87.3 mmol of diphenol monomer (a-15) in Synthesis Example 1 was changed to 12.5 g (43.7 mmol) of (a-15) and 15.13 g (43.7 mmol) of (a-57) (manufactured by Tokyo Chemical Industry Co., Ltd.). Resin (D-2) was obtained in the same manner as in Synthesis Example 1 except that a reaction of introducing a protecting group into (D-1) was performed using 28.0 mmol of chloromethyl methyl ether (manufactured by Tokyo Chemical Industry Co., Ltd.). The proportion of a protected acidic group in resin (D-2) was 60%.

Example 4

A photosensitive resin composition was prepared in the same manner as in Example 1 except that resin (A-2) in the photosensitive resin composition of Example 1 was changed to resin (D-2), and the composition was evaluated in the same manner as in Example 1.

Synthesis Example 5

Resin (E-1) was synthesized in the same manner as in Synthesis Example 1 except that 87.3 mmol of diphenol monomer (a-15) in Synthesis Example 1 was changed to 12.5 g (43.7 mmol) of (a-15) and 15.13 g (43.7 mmol) of (a-56) (manufactured by Tokyo Chemical Industry Co., Ltd.). Resin (E-2) was obtained in the same manner as in Synthesis Example 1 except that a reaction of introducing a protecting group into (E-1) was performed using 28.0 mmol of chloromethyl methyl ether (manufactured by Tokyo Chemical Industry Co., Ltd.). The proportion of a protected acidic group in resin (E-2) was 55%.

Example 5

A photosensitive resin composition was prepared in the same manner as in Example 1 except that resin (A-2) in the photosensitive resin composition of Example 1 was changed to resin (E-2), and the composition was evaluated in the same manner as in Example 1.

Synthesis Example 6

Resin (F-1) was synthesized in the same manner as in Synthesis Example 1 except that 87.3 mmol of diphenol monomer (a-15) in Synthesis Example 1 was changed to 12.5 g (43.7 mmol) of (a-15) and 9.97 g (43.7 mmol) of (a-48) (manufactured by Tokyo Chemical Industry Co., Ltd.). Resin (F-2) was obtained in the same manner as in Synthesis Example 1 except that a reaction of introducing a protecting group into (F-1) was performed using 28.0 mmol of chloromethyl methyl ether (manufactured by Tokyo Chemical Industry Co., Ltd.). The proportion of a protected acidic group in resin (F-2) was 56%.

Example 6

A photosensitive resin composition was prepared in the same manner as in Example 1 except that resin (A-2) in the photosensitive resin composition of Example 1 was changed to resin (F-2), and the composition was evaluated in the same manner as in Example 1.

Synthesis Example 7

Resin (G-1) was synthesized in the same manner as in Synthesis Example 1 except that 87.3 mmol of diphenol monomer (a-15) in Synthesis Example 1 was changed to 13.46 g (87.3 mmol) of (a-3) (manufactured by Tokyo Chemical Industry Co., Ltd.). The number average molecular weight of resin (G-1) was measured by GPC (apparatus: HLC-8220 manufactured by Tosoh Corporation, column temperature: 40° C., flow rate: 0.3 ml/min, column: TSK-GEL; SUPER-AW series, solvent: NMP solution having LiBr concentration of 10 mmol/L; the number average molecular weight is in terms of standard polystyrene), and was found to be 9,000. Resin (G-2) was obtained except that a reaction of introducing a protecting group into (G-1) was performed using 55.9 mmol of chloromethyl methyl ether. The proportion of a protected acidic group in resin (G-2) was 58%.

An NMR spectrum of the resultant polymer is shown in FIG. 1.

Example 7

A photosensitive resin composition was prepared in the same manner as in Example 1 except that resin (A-2) in the photosensitive resin composition of Example 1 was changed to resin (G-2), and the composition was evaluated in the same manner as in Example 1.

Example 8

85 parts by mass of the resin (B-2), 5 parts by mass of 2,3,4-tris[2-diazo-1(2H)-naphthalenone-4-sulfonyloxy]benzophenone (NQD-1), and 10 parts by mass of a crosslinking agent HMOM-TPHAP (manufactured by Honshu Chemical Industry Co., Ltd.) were dissolved in 200 parts by mass of PGMEA, and the solution was subjected to filtration using a PTFE filter having a pore diameter of 0.2 μm, to thereby obtain a photosensitive resin composition. The composition was subjected to evaluation in the same manner as in Example 1.

Example 9

A photosensitive resin composition was prepared in the same manner as in Example 8 except that the crosslinking agent HMOM-TPHAP (manufactured by Honshu Chemical Industry Co., Ltd.) in the photosensitive resin composition of Example 8 was changed to NIKALAC N2702 (manufactured by Sanwa Chemical Co., Ltd.), and the composition was evaluated in the same manner as in Example 1.

Example 10

A photosensitive resin composition was prepared in the same manner as in Example 8 except that the crosslinking agent HMOM-TPHAP (manufactured by Honshu Chemical Industry Co., Ltd.) in the photosensitive resin composition of Example 8 was changed to KAYARAD DPHA (manufactured by Nippon Kayaku Co., Ltd.), and the composition was evaluated in the same manner as in Example 1.

Example 11

A photosensitive resin composition was prepared in the same manner as in Example 8 except that the crosslinking agent HMOM-TPHAP (manufactured by Honshu Chemical Industry Co., Ltd.) in the photosensitive resin composition of Example 8 was changed to EHPE-3150 (manufactured by Daicel Chemical Industries Ltd.), and the composition was evaluated in the same manner as in Example 1.

Example 12

A photosensitive resin composition was prepared in the same manner as in Example 8 except that the photo acid generator 2,3,4-tris[2-diazo-1(2H)-naphthalenone-4-sulfonyloxy]benzophenone (NQD-1) in the photosensitive resin composition of Example 8 was changed to an equivalent part by mass of a triarylsulfonium salt (PAG-1), and the composition was evaluated in the same manner as in Example 1.

Example 13

A photosensitive resin composition was prepared in the same manner as in Example 12 except that the crosslinking agent HMOM-TPHAP (manufactured by Honshu Chemical Industry Co., Ltd.) in the photosensitive resin composition of Example 12 was changed to NIKALAC N2702 (manufactured by Sanwa Chemical Co., Ltd.), and the composition was evaluated in the same manner as in Example 1.

Example 14

A photosensitive resin composition was prepared in the same manner as in Example 8 except that the photo acid generator 2,3,4-tris[2-diazo-1(2H)-naphthalenone-4-sulfonyloxy]benzophenone (NQD-1) in the photosensitive resin composition of Example 8 was changed to an oxime sulfonate photo acid generator (z70), and the composition was evaluated in the same manner as in Example 1.

Example 15

A photosensitive resin composition was prepared in the same manner as in Example 14 except that the crosslinking agent HMOM-TPHAP (manufactured by Honshu Chemical Industry Co., Ltd.) in the photosensitive resin composition of Example 14 was changed to NIKALAC N2702 (manufactured by Sanwa Chemical Co., Ltd.), and the composition was evaluated in the same manner as in Example 1.

Example 16

85 parts by mass of resin (B-1) synthesized in Synthesis Example 2, 15 parts by mass of a photo acid generator 2,3,4-tris[-2-diazo-1(2H)-naphthalenone-4-sulfonyloxy]benzophenone (NQD-1), and 10 parts by mass of a crosslinking agent HMOM-TPHAP (manufactured by Honshu Chemical Industry Co., Ltd.) were dissolved in 200 parts by mass of PGMEA, and the solution was subjected to filtration using a PTFE filter having a pore diameter 0.2 µm, to thereby obtain a photosensitive resin composition. The composition was subjected to evaluation in the same manner as in Example 1.

Example 17

A photosensitive resin composition was prepared in the same manner as in Example 16 except that the crosslinking agent HMOM-TPHAP (manufactured by Honshu Chemical Industry Co., Ltd.) in the photosensitive resin composition of Example 16 was changed to NIKALAC N2702 (manufactured by Sanwa Chemical Co., Ltd.), and the composition was evaluated in the same manner as in Example 1.

Example 18

A photosensitive resin composition was prepared in the same manner as in Example 16 except that the crosslinking agent HMOM-TPHAP (manufactured by Honshu Chemical Industry Co., Ltd.) in the photosensitive resin composition of Example 16 was changed to KAYARAD DPHA (manufactured by Nippon Kayaku Co., Ltd.), and the composition was evaluated in the same manner as in Example 1.

Example 19

A photosensitive resin composition was prepared in the same manner as in Example 16 except that the crosslinking agent HMOM-TPHAP (manufactured by Honshu Chemical Industry Co., Ltd.) in the photosensitive resin composition of Example 16 was changed to EHPE-3150 (manufactured by Daicel Chemical Industries Ltd.), and the composition was evaluated in the same manner as in Example 1.

Example 20

A photosensitive resin composition was prepared in the same manner as in Example 16 except that the photo acid generator 2,3,4-tris[2-diazo-1(2H)-naphthalenone-4-sulfonyloxy]benzophenone (NQD-1) in the photosensitive resin composition of Example 16 was changed to an equivalent part by mass of a triarylsulfonium salt (PAG-1), and the composition was evaluated in the same manner as in Example 1.

Example 21

A photosensitive resin composition was prepared in the same manner as in Example 20 except that the crosslinking agent HMOM-TPHAP (manufactured by Honshu Chemical Industry Co., Ltd.) in the photosensitive resin composition of Example 20 was changed to NIKALAC N2702 (manufactured by Sanwa Chemical Co., Ltd.), and the composition was evaluated in the same manner as in Example 1.

Example 22

A photosensitive resin composition was prepared in the same manner as in Example 16 except that the photo acid generator 2,3,4-tris[2-diazo-1(2H)-naphthalenone-4-sulfonyloxy]benzophenone (NQD-1) in the photosensitive resin composition of Example 16 was changed to an oxime sulfonate photo acid generator (z70), and the composition was evaluated in the same manner as in Example 1.

Example 23

A photosensitive resin composition was prepared in the same manner as in Example 22 except that the crosslinking agent HMOM-TPHAP (manufactured by Honshu Chemical Industry Co., Ltd.) in the photosensitive resin composition of Example 22 was changed to NIKALAC N2702 (manufactured by Sanwa Chemical Co., Ltd.), and the composition was evaluated in the same manner as in Example 1.

Examples 24 to 31

Photosensitive resin compositions were prepared in the same manner as in Examples 8 to 15, respectively, except that resin (B-2) used in Examples 8 to 15 was changed to resin (G-2), and the compositions were each evaluated in the same manner as in Example 1.

Examples 32 to 39

Photosensitive resin compositions were prepared in the same manner as in Examples 16 to 23, respectively, except that resin (B-1) used in Examples 16 to 23 was changed to resin (G-1), and the compositions were each evaluated in the same manner as in Example 1.

Comparative Example 1

A polymer of Comparative Example 1 was synthesized according to the method described in JP-A No. 2000-275842 (the disclosure of which is incorporated herein by reference in its entirety). A photosensitive resin composition was prepared in the same manner as in Example 1 except that resin (A-2) synthesized in Synthesis Example 1 was changed to Comparative Polymer 1 that is obtained by oxidative coupling polymerization of 2-(tetrahydropyran-2-yl)oxy-6-methylphenol and 2,6-dimethylphenol and subsequent deprotection with hydrochloric acid, and the composition was evaluated in the same manner as in Example 1.

Comparative Example 2

A photosensitive resin composition was prepared in the same manner as in Example 8 except that resin (B-2) in Example 8 was changed to Comparative Polymer 1, and the composition was evaluated in the same manner as in Example 1.

Comparative Example 3

A photosensitive resin composition was prepared in the same manner as in Example 8 except that resin (B-2) in Example 11 was changed to Comparative Polymer 1, and the composition was evaluated in the same manner as in Example 1.

Comparative Example 4

Comparative Polymer 2 was synthesized according to the method described in Example 5 of JP-A No. 2004-133088. In a dry air stream, 2000 ml of γ-butyrolactone and 79 g of pyridine (manufactured by Tokyo Chemical Industry Co., Ltd., 1.0 mole) were added to 155 g of 3,3',4,4'-diphenyl ether tetracarboxylic dianhydride (manufactured by Manac Incorporated, 0.5 mole) and 138 g of 3-hydroxyphenylethanol (manufactured by Tokyo Chemical Industry Co., Ltd., 1.0 mole), and the mixture was stirred at 50° C. for 6 hours. Thereafter, the solution was cooled to −10° C., and a solution obtained by dissolving 206 g of dicyclohexylcarbodiimide (manufactured by Tokyo Chemical Industry Co., Ltd., 1.0 mole) in 2000 ml of γ-butyrolactone was added dropwise in such a manner that the internal temperature did not exceed 0° C. After completion of the addition, stirring was continued at −10° C. for 30 minutes, and then the temperature was gradually raised to 20° C. When the solution became 20° C., 51 g of 4,4'-diaminodiphenyl ether (manufactured by Wakayama Seika Corporation, 0.4 mole) and 3,5-diaminobenzoic acid (manufactured by Tokyo Chemical Industry Co., Ltd., 0.1 mole) were added. Thereafter, stirring was continued at 20° C. for 2 hours, and subsequently, at 40° C. for 2 hour. After completion of the stirring, byproducts generated in the reaction were removed by filtration, and the resultant solution was poured into 50 L of water, to thereby obtain a white precipitate. The precipitate was collected by filtration, and further washed with 5 L of water. The white precipitate was dried in a vacuum drier at 50° C. for 48 hours, to thereby obtain a powder of polyamic acid ester (Comparative Polymer 2) which is a polyimide precursor. A photosensitive resin composition was prepared in the same manner as in Example 1 except that resin (A-2) in Example 1 was changed to Comparative Polymer 2, and the composition was evaluated in the same manner as in Example 1.

Comparative Example 5

A photosensitive resin composition was prepared in the same manner as in Example 8 except that resin (B-2) in Example 8 was changed to Comparative Polymer 2, and the composition was evaluated in the same manner as in Example 1.

Comparative Example 6

A photosensitive resin composition was prepared in the same manner as in Example 8 except that resin (B-2) in Example 11 was changed to Comparative Polymer 2, and the composition was evaluated in the same manner as in Example 1.

The evaluation results of Examples 1 to 39 and Comparative Examples 1 to 6 are shown in Table 1 to Table 3-2.

In Tables 3-1 and 3-2, "Comparative 1" of the polymer compound indicates "Comparative Polymer 1", and "Comparative 2" of the polymer compound indicates "Comparative Polymer 2".

TABLE 1

| | Polymer compound | | Photo acid generator | | Crosslinking agent | | Pattern forming property | Resolution (µm) | 5% Mass decrease temperature (° C.) | Relative dielectric constant |
|---|---|---|---|---|---|---|---|---|---|---|
| | Kind | Amount | Kind | Amount | Kind | Amount | | | | |
| Example 1 | A-2 | 85 | NQD-1 | 5 | — | — | B | 5 | 420 | A |
| Example 2 | B-2 | 85 | NQD-1 | 5 | — | — | B | 6 | 412 | A |
| Example 3 | C-2 | 85 | NQD-1 | 5 | — | — | B | 6 | 411 | B |
| Example 4 | D-2 | 85 | NQD-1 | 5 | — | — | B | 6 | 414 | B |
| Example 5 | E-2 | 85 | NQD-1 | 5 | — | — | B | 6 | 410 | B |
| Example 6 | F-2 | 85 | NQD-1 | 5 | — | — | B | 6 | 413 | B |
| Example 7 | G-2 | 85 | NQD-1 | 5 | — | — | B | 5 | 418 | A |
| Example 8 | B-2 | 85 | NQD-1 | 5 | HMOM-TPHAP | 10 | A | 5 | 417 | A |
| Example 9 | B-2 | 85 | NQD-1 | 5 | N-2702 | 10 | A | 5 | 410 | A |
| Example 10 | B-2 | 85 | NQD-1 | 5 | KAYARAD DPHA | 10 | A | 5 | 418 | A |
| Example 11 | B-2 | 85 | NQD-1 | 5 | EHPE-3150 | 10 | A | 5 | 420 | A |
| Example 12 | B-2 | 85 | PAG-1 | 5 | HMOM-TPHAP | 10 | A | 6 | 411 | A |
| Example 13 | B-2 | 85 | PAG-1 | 5 | N-2702 | 10 | A | 6 | 403 | A |
| Example 14 | B-2 | 85 | z70 | 5 | HMOM-TPHAP | 10 | A | 5 | 415 | A |
| Example 15 | B-2 | 85 | z70 | 5 | N-2702 | 10 | A | 5 | 406 | A |

TABLE 2

| | Polymer compound | | Photo acid generator | | Crosslinking agent | | Pattern forming property | Resolution (µm) | 5% Mass decrease temperature (° C.) | Relative dielectric constant |
|---|---|---|---|---|---|---|---|---|---|---|
| | Kind | Amount | Kind | Amount | Kind | Amount | | | | |
| Example 16 | B-1 | 85 | NQD-1 | 15 | HMOM-TPHAP | 10 | A | 6 | 396 | A |
| Example 17 | B-1 | 85 | NQD-1 | 15 | N-2702 | 10 | A | 5 | 410 | A |
| Example 18 | B-1 | 85 | NQD-1 | 15 | KAYARAD DPHA | 10 | A | 5 | 405 | A |
| Example 19 | B-1 | 85 | NQD-1 | 15 | EHPE-3150 | 10 | A | 5 | 408 | A |
| Example 20 | B-1 | 85 | PAG-1 | 15 | HMOM-TPHAP | 10 | A | 6 | 398 | A |
| Example 21 | B-1 | 85 | PAG-1 | 15 | N-2702 | 10 | A | 6 | 409 | A |
| Example 22 | B-1 | 85 | z70 | 15 | HMOM-TPHAP | 10 | A | 5 | 397 | A |
| Example 23 | B-1 | 85 | z70 | 15 | N-2702 | 10 | A | 6 | 412 | A |
| Example 24 | G-2 | 85 | NQD-1 | 5 | HMOM-TPHAP | 10 | A | 5 | 408 | A |
| Example 25 | G-2 | 85 | NQD-1 | 5 | N-2702 | 10 | A | 5 | 399 | A |
| Example 26 | G-2 | 85 | NQD-1 | 5 | KAYARAD DPHA | 10 | A | 5 | 405 | A |
| Example 27 | G-2 | 85 | NQD-1 | 5 | EHPE-3150 | 10 | A | 6 | 406 | A |
| Example 28 | G-2 | 85 | PAG-1 | 5 | HMOM-TPHAP | 10 | A | 5 | 404 | A |
| Example 29 | G-2 | 85 | PAG-1 | 5 | N-2702 | 10 | A | 6 | 406 | A |
| Example 30 | G-2 | 85 | z70 | 5 | HMOM-TPHAP | 10 | A | 5 | 407 | A |

TABLE 3-1

| | Polymer compound | | Photo acid generator | | Crosslinking agent | | Pattern forming property | Resolution (µm) | 5% Mass decrease temperature (° C.) | Relative dielectric constant |
|---|---|---|---|---|---|---|---|---|---|---|
| | Kind | Amount | Kind | Amount | Kind | Amount | | | | |
| Example 31 | G-2 | 85 | z70 | 5 | N-2702 | 10 | A | 6 | 402 | A |
| Example 32 | G-1 | 85 | NQD-1 | 15 | HMOM-TPHAP | 10 | A | 5 | 401 | A |
| Example 33 | G-1 | 85 | NQD-1 | 15 | N-2702 | 10 | A | 5 | 407 | A |
| Example 34 | G-1 | 85 | NQD-1 | 15 | KAYARAD DPHA | 10 | A | 5 | 405 | A |
| Example 35 | G-1 | 85 | NQD-1 | 15 | EHPE-3150 | 10 | A | 5 | 403 | A |
| Example 36 | G-1 | 85 | PAG-1 | 15 | HMOM-TPHAP | 10 | A | 6 | 403 | A |
| Example 37 | G-1 | 85 | PAG-1 | 15 | N-2702 | 10 | A | 5 | 402 | A |
| Example 38 | G-1 | 85 | z70 | 15 | HMOM-TPHAP | 10 | A | 5 | 410 | A |
| Example 39 | G-1 | 85 | z70 | 5 | N-2702 | 10 | A | 5 | 411 | A |

TABLE 3-2

| | Polymer compound | | Photo acid generator | | Crosslinking agent | | Pattern forming property | Resolution (μm) | 5% Mass decrease temperature (°C.) | Relative dielectric constant |
|---|---|---|---|---|---|---|---|---|---|---|
| | Kind | Amount | Kind | Amount | Kind | Amount | | | | |
| Comparative Example 1 | Comparative 1 | 85 | NQD-1 | 5 | — | — | C | 12 | 370 | D |
| Comparative Example 2 | Comparative 1 | 85 | NQD-1 | 5 | HMOM-TPHAP | 10 | B | 11 | 375 | C |
| Comparative Example 3 | Comparative 1 | 85 | NQD-1 | 5 | EHPE-3150 | 10 | B | 12 | 373 | C |
| Comparative Example 4 | Comparative 2 | 85 | NQD-1 | 5 | — | — | D | 14 | 305 | D |
| Comparative Example 5 | Comparative 2 | 85 | NQD-1 | 5 | HMOM-TPHAP | 10 | C | 13 | 320 | D |
| Comparative Example 6 | Comparative 2 | 85 | NQD-1 | 5 | EHPE-3150 | 10 | C | 13 | 325 | D |

Table 1 to Table 3-2 show the following. In Examples 1 to 39, in which the photosensitive resin compositions prepared using the polymer compounds of the invention are used, pattern forming properties are excellent, resolution is good since small patterns can be formed, the 5% mass decrease temperature is high, heat resistance is excellent, the relative dielectric constant is small, and insulating property is excellent. In contrast, in Comparative Examples 1 to 6 in which photosensitive resin compositions not including the polymer compounds of the invention are used, pattern forming property is poor, resolution is poor, the 5% mass decrease temperature is low, heat resistance is poor, the relative dielectric constant is large, and insulating property is poor.

Next, a process for manufacturing the semiconductor device of the invention will be described below. However, the invention is not particularly limited except that the semiconductor device has a surface protecting film and/or an interlayer insulating film formed using the photosensitive resin composition, and may employ any of various configurations.

Example 40

A semiconductor device having a multi-layered wiring structure was manufactured by the following method (see FIGS. 2A to 2E).

Figure 2A:
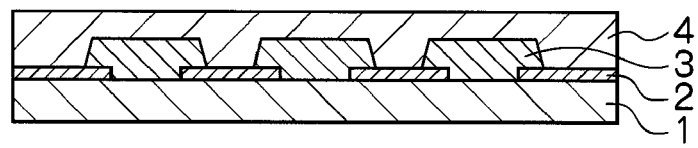
FIG. 2A to FIG. 2E show a flow of processes of manufacturing a semiconductor device having a multilayered wiring structure.

Semiconductor substrate 1 such as a Si substrate having a circuit element was covered with protecting film 2 such as a silicon oxide film except for a predetermined portion of the circuit element, and first conductive layer 3 was formed on an exposed circuit element. Interlayer insulating film 4 was formed on semiconductor substrate 1 by a spin coating method (FIG. 2A).

Figure 2B:
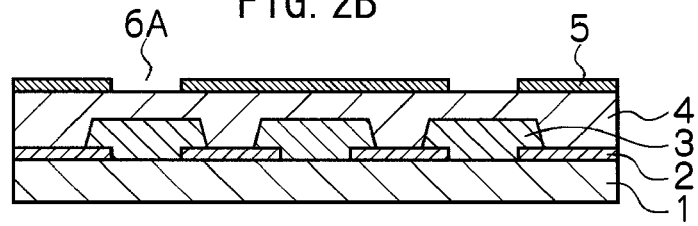
Figure 2C:
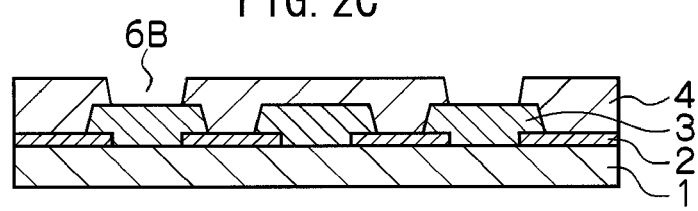

Then, photosensitive resin layer 5 containing chlorinated rubber or phenol novolak was formed on interlayer insulating film 4 by a spin coating method, and window 6A was provided by a known photographic etching technique so that interlayer insulating film 4 at a predetermined portion was exposed (FIG. 2B). Interlayer insulating film 4 at window 6A was selectively etched by dry etching using a gas such as oxygen or carbon tetrafluoride to provide window 6B. Then, photosensitive resin layer 5 was completely removed using an etching solution that corrodes only photosensitive resin layer 5, without corroding first conductive layer 3 exposed through window 6B (FIG. 2C).

Figure 2D:
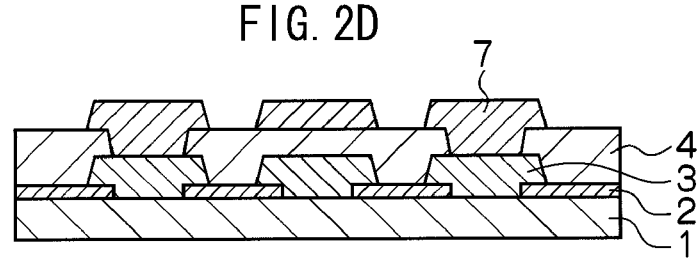

Further, second conductive layer 7 was formed by a known photographic etching technique, and electrically connected to first conductive layer 3 (FIG. 2D).

Figure 2E:
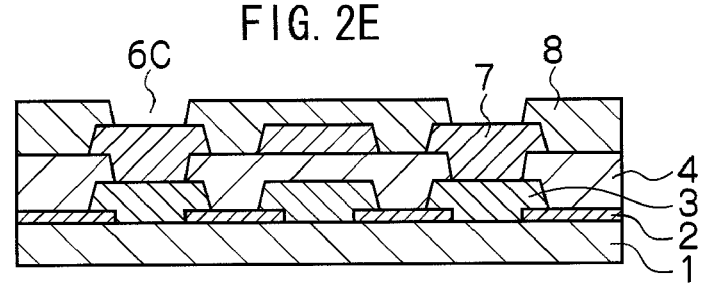

Then, surface protecting film 8 was formed. Specifically, the photosensitive resin composition made in Example 8 was applied by a spin coating method, pre-baked (120° C.×2 min), irradiated with i-ray (365 nm) at 100 mJ/cm$^2$ (illuminance: 20 mW/cm$^2$) using a high pressure mercury lamp through a mask having a pattern that forms window 6C at a predetermined portion thereof, developed with an alkali aqueous solution to form a pattern, and heat-treated at 220° C. for 30 minutes, to thereby obtain a resin film (FIG. 2E). The resin film protects a conductive layer from a stress, a ray and the like from the outside, and the resultant semiconductor device was excellent in reliance. Similarly as the above example, when an interlayer insulating film was formed using the photosensitive resin composition of the invention, a semiconductor device excellent in reliance was also manufactured.

A method for manufacturing a display device of the invention will be described below by exemplifying a method for manufacturing an organic EL display device. However, the invention is not particularly limited except that the display device has a planarization film or an interlayer insulating film formed using the photosensitive resin composition, and may employ any of various configurations.

Example 41

Figure 3:
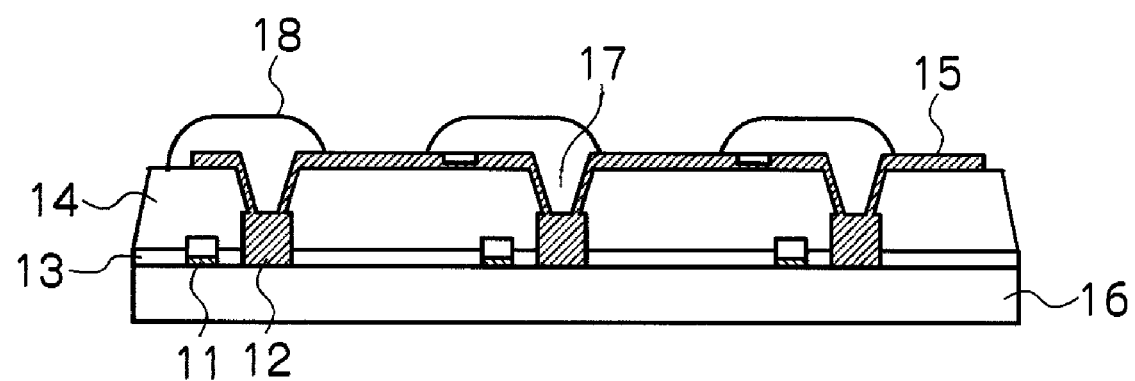
FIG. 3 shows an organic EL display device using a TFT.

An organic EL display device including TFT was manufactured by the following method (see FIG. 3).

Bottom gate TFT 11 was formed on glass substrate 16, and insulating film 13 containing Si$_3$N$_4$ was formed so as to cover TFT 11. Then, a contact hole (not shown) was formed on insulating film 13, and wiring 12 (height: 1.0 μm) being connected to TFT 11 via the contact hole was formed on insulating film 13. Wiring 12 connects plural TFT 11's, or connects an organic EL element formed in a later process and TFT 11.

In order to planarize irregularities due to formation of wiring 12, planarization layer 14 was formed on insulating film 13 in such a manner that irregularities due to wiring 12 were embedded therein. Formation of planarization film 14 on insulating film 13 was performed as follow: the photosensitive resin composition made in Example 24 was applied by spin-coating on a substrate, pre-baked (120° C.×2 min) using a hot plate, irradiated with i-ray (365 nm) at 100 mJ/cm$^2$ (illuminance: 20 mW/cm$^2$) using a high pressure mercury lamp through a mask, developed with an alkali aqueous solution to form a pattern, and heat-treated at 220° C. for 30 minutes. Coating property of the photosensitive resin composition upon coating was good, and occurrence of a crease or a crack was not recognized in a cured film obtained by light exposure, development and baking. An average difference in level (height) of wiring 12 was 500 nm, and the film thickness of the planarization film was 2,000 nm.

Then, a bottom emission organic EL element was formed on the resultant planarization film 14. First, first electrode 15 consisting of ITO was formed on planarization film 14 so that first electrode 15 is connected to wiring 12 via contact hole 17. Thereafter, a resist was applied thereon, pre-baked, exposed to light through a mask having a desired pattern, and developed. Patterning processing was performed by wet etching using an ITO etchant and using the resist pattern as a mask. Thereafter, the resist pattern was removed using a resist removing solution (mixture of monoethanolamine and DMSO). The thus-obtained first electrode 15 serves an anode of an organic EL element.

Then, insulating layer 18 having a shape covering a periphery of the first electrode was formed. For the insulating layer, the photosensitive resin composition made in Example 24 was used, and insulating film 18 was formed by the aforementioned method. By providing this insulating layer, short between the first electrode and a second electrode formed in a later process may be prevented.

Further, a hole transport layer, an organic light emitting layer, and an electron transport layer were sequentially provided by deposition through desired pattern masks in a vacuum deposition device. Then, a second electrode consisting of Al was formed on the entire surface above a substrate. The resultant substrate was taken out from the deposition machine, and was attached to a sealing glass plate using an ultraviolet curing epoxy resin.

As described above, an active matrix organic EL display device in which TFT 11 for driving each organic EL element is connected to each organic EL element was obtained. When the voltage was applied via a driving circuit, good display property was exhibited, and an organic EL display device having high reliance was made.

What is claimed is:

1. A photosensitive resin composition, comprising:
a polymer compound obtained by reacting a monomer represented by the following Formula (1) and a monomer represented by the following Formula (2); and
a photosensitizing agent:

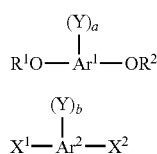

wherein, in Formulae (1) and (2), $Ar^1$ and $Ar^2$ each independently represent a divalent to hexavalent organic group having 6 to 30 carbon atoms, and the organic group may have a substituent; $R^1$ and $R^2$ each independently represent a hydrogen atom or a silyl group; $X^1$ and $X^2$ each independently represent a leaving group; each Y independently represents an acidic group or a group comprising an acidic group protected with an acid degradable group; each Y included in the polymer compound may be the same as or different from another Y included in the polymer compound; a and b each represent an integer of 0 to 4, and a and b do not both represent 0, and wherein the acidic group represented by Y in Formula (1) or (2) is one selected from a phenolic OH group, —COOH group, —SO$_3$H group, —SO$_2$NH$_2$ group, and —C(CF$_3$)$_2$OH group.

2. The photosensitive resin composition according to claim 1, wherein the organic group represented by $Ar^1$ in Formula (1) is represented by the following Formula (1a) or Formula (1b), provided that since (Y)a is also shown in Formula (1), (Y)a in Formula (1a) or Formula (1b) is not included in $Ar^1$:

wherein, in Formulae (1a) and (1b), $L^1$, $L^2$ and $L^3$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

3. The photosensitive resin composition according to claim 1, wherein the leaving group represented by $X^1$ or $X^2$ in Formula (2) is a halogen atom, a group containing a nitrogen atom, a mesyl group, or a tosyl group.

4. The photosensitive resin composition according to claim 1, wherein the organic group represented by $Ar^2$ in Formula (2) is represented by the following Formula (2a) or Formula (2b), provided that since (Y)$_b$ is also shown in Formula (2), (Y)$_b$ in Formula (2a) and Formula (2b) is not included in $Ar^2$:

wherein, in Formulae (2a) and (2b), $L^4$, $L^5$ and $L^6$ each independently represent a heterocycle having 5 to 30 carbon atoms, an aromatic carbocycle having 6 to 30 carbon atoms, or an aliphatic carbocycle having 3 to 30 carbon atoms, and M represents a divalent linking group.

5. The photosensitive resin composition according to claim 1, wherein Y in Formula (1) or (2) is represented by the following Formula (y1):

wherein, in Formula (y1), A represents a single bond or an (n+1)-valent linking group; PG represents a hydrogen atom or an acid degradable group; B represents a partial structure of an acidic group in which a moiety exhibiting acidity is protected with an acid degradable group PG; and n represents an integer of from 1 to 5.

6. The photosensitive resin composition according to claim 1, wherein the photosensitizing agent is a compound which generates an acid in response to light.

7. The photosensitive resin composition according to claim 6, wherein the compound which generates an acid in response to light is a diazonium salt, a phosphonium salt, a sulfonium salt, an iodonium salt, an imidosulfonate, an oximesulfonate, a diazodisulfone, a disulfone, or an o-nitrobenzyl sulfonate.

8. The photosensitive resin composition of claim 6, wherein the compound which generates an acid in response to light is a compound represented by the following Formula (ZI), (ZII) or (ZIII):

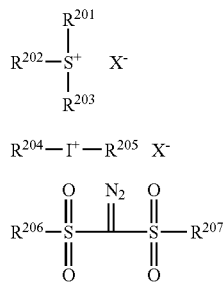

(ZI)

(ZII)

(ZIII)

wherein, in Formulae (ZI) to (ZIII), $R^{201}$ to $R^{207}$ each independently represent an organic group having 1 to 30 carbon atoms; two of $R^{201}$ to $R^{203}$ may be bonded to form a ring structure; $R^{204}$ and $R^{205}$ may be bonded to form a ring structure; $R^{206}$ and $R^{207}$ may be bonded to form a ring structure; and $X^-$ represents a non-nucleophilic anion.

9. The photosensitive resin composition according to claim 1, further comprising a crosslinking agent.

10. A method for forming a pattern, comprising:
applying the photosensitive resin composition according to claim 1 onto a substrate;
drying the photosensitive resin composition;
exposing the photosensitive resin composition to light; and
developing the photosensitive resin composition using an alkali aqueous solution and/or an organic solvent.

11. An electronic device, comprising a pattern obtained by the method according to claim 5.

12. The photosensitive resin composition of claim 5, wherein PG in Formula (y1) represents an acid degradable group having a tertiary alkyl group having 4 to 15 carbon atoms or any one of the following Formulae (y2), (y3), and (y4):

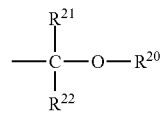

(y2)

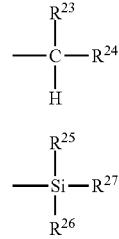

(y3)

(y4)

wherein, in Formula (y2), $R^{20}$ represents an alkyl group having 1 to 10 carbon atoms, and $R^{21}$ and $R^{22}$ each independently represent a hydrogen atom or an alkyl group having 1 to 10 carbon atoms; and when $R^{20}$ and $R^{21}$ both represent alkyl groups, they may be bonded to each other to form a carbocycle;

in Formula (y3), $R^{23}$ represents an aryl group having 6 to 20 carbon atoms, and $R^{24}$ represents an alkyl group having 1 to 10 carbon atoms; and in Formula (y4), $R^{25}$ to $R^{27}$ each independently represent an alkyl group having 1 to 10 carbon atoms or an aryl group having 6 to 20 carbon atoms.

13. The photosensitive resin composition of claim 5, wherein the acidic group produced by degradation of PG is selected from the group consisting of a phenolic OH group, —COOH group, —SO$_3$H group, —SO$_2$NH$_2$ group, and —C(CF$_3$)$_2$OH group.

14. The photosensitive resin composition of claim 1, wherein the acidic group represented by Y in Formula (1) or (2) comprises a —COOH group.

* * * * *